(12) United States Patent
Ren et al.

(10) Patent No.: US 9,048,004 B2
(45) Date of Patent: Jun. 2, 2015

(54) HALF-HEUSLER ALLOYS WITH ENHANCED FIGURE OF MERIT AND METHODS OF MAKING

(71) Applicants: GMZ Energy, Inc., Waltham, MA (US); Trustees of Boston College, Chestnut Hill, MA (US)

(72) Inventors: Zhifeng Ren, Newton, MA (US); Xiao Yan, Chestnut Hill, MA (US); Giri Joshi, Brighton, MA (US); Shuo Chen, Newton, MA (US); Gang Chen, Carlisle, MA (US); Bed Poudel, Brighton, MA (US); James Christopher Caylor, Melrose, MA (US)

(*) Notice: Subject to any disclaimer, the term of this patent is extended or adjusted under 35 U.S.C. 154(b) by 0 days.

(21) Appl. No.: 13/719,966

(22) Filed: Dec. 19, 2012

(65) Prior Publication Data

US 2013/0175484 A1 Jul. 11, 2013

Related U.S. Application Data

(63) Continuation-in-part of application No. 13/330,216, filed on Dec. 19, 2011.

(60) Provisional application No. 61/424,878, filed on Dec. 20, 2010.

(51) Int. Cl.
*H01B 1/02* (2006.01)
*H01L 35/20* (2006.01)

(52) U.S. Cl.
CPC . *H01B 1/02* (2013.01); *H01L 35/20* (2013.01)

(58) Field of Classification Search
USPC .......................................................... 148/442
See application file for complete search history.

(56) References Cited

U.S. PATENT DOCUMENTS

| | | | |
|---|---|---|---|
| 5,069,868 | A | 12/1991 | Tokiai et al. |
| 5,246,504 | A | 9/1993 | Ohta et al. |
| 5,989,487 | A | 11/1999 | Yoo et al. |
| 6,440,768 | B1 | 8/2002 | Konishi et al. |
| 6,696,635 | B2 | 2/2004 | Prasher |
| 7,310,207 | B2 | 12/2007 | Hasegawa et al. |

(Continued)

FOREIGN PATENT DOCUMENTS

| | | |
|---|---|---|
| CN | 1375450 | 10/2002 |
| JP | 2005-019713 A | 1/2005 |

OTHER PUBLICATIONS

Yu et al. "Reduced Grain Size and Improved Thermoelectric Properties of Melt Spun (Hf,Zr)NiSn Half-Heusler Alloys", Journal of Electronic Materials, 93 (9), 2010, p. 2008-2012.*

(Continued)

*Primary Examiner* — Rebecca Lee
(74) *Attorney, Agent, or Firm* — The Marbury Law Group PLLC

(57) ABSTRACT

Thermoelectric materials and methods of making thermoelectric materials having a nanometer mean grain size less than 1 micron. The method includes combining and arc melting constituent elements of the thermoelectric material to form a liquid alloy of the thermoelectric material and casting the liquid alloy of the thermoelectric material to form a solid casting of the thermoelectric material. The method also includes ball milling the solid casting of the thermoelectric material into nanometer mean size particles and sintering the nanometer size particles to form the thermoelectric material having nanometer scale mean grain size.

28 Claims, 36 Drawing Sheets

(56) References Cited

U.S. PATENT DOCUMENTS

| | | | |
|---|---|---|---|
| 7,336,453 B2 | 2/2008 | Hasegawa et al. |
| 7,465,871 B2 | 12/2008 | Chen et al. |
| 7,663,054 B2 | 2/2010 | Shutoh et al. |
| 7,745,720 B2 | 6/2010 | Sakurada et al. |
| 7,849,909 B2 | 12/2010 | Nakajima |
| 7,851,692 B2 | 12/2010 | Sakurada et al. |
| 8,067,686 B2 | 11/2011 | Kondo et al. |
| 2003/0084935 A1 | 5/2003 | Bell |
| 2003/0089391 A1 | 5/2003 | Fukudome et al. |
| 2003/0154725 A1 | 8/2003 | McGrew |
| 2004/0112418 A1 | 6/2004 | Yang et al. |
| 2005/0172994 A1 | 8/2005 | Shutoh et al. |
| 2006/0053969 A1 | 3/2006 | Harada et al. |
| 2006/0157102 A1 | 7/2006 | Nakajima et al. |
| 2008/0135082 A1 | 6/2008 | Hirono et al. |
| 2008/0202575 A1 | 8/2008 | Ren et al. |
| 2009/0068465 A1 | 3/2009 | Chen et al. |
| 2010/0147352 A1 | 6/2010 | Matsubara et al. |
| 2010/0163091 A1 | 7/2010 | Liu et al. |

OTHER PUBLICATIONS

Xie et al. "Synthesis and thermoelectric properties of (Ti, Zr, Hf) (Co, Pd) Sb half-Heusler compounds", J. Phys. D: Appl. Phys. 42 (2009), 235407.*

Joshi et al., "Enhancement in Thermoelectric Figure-of-Merit of an N-Type Half-Heusler Compound by the Nanocomposite Approach," Advanced Energy Materials, vol. 1, 2011, pp. 643-647.

Yan et al., "Enhanced Thermoelectric Figure of Merit of p-Type Half-Heuslers," American Chemical Society, Nano Lett., 2011, pp. 556-560.

Culp et al., "Effect of Substitutions on the Thermoelectric Figure of Merit of Half-Heusler Phases at 800° C.," Applied Physics Letters, vol. 88, Apr. 2006.

Culp et al., "(Zr,Hf)Co(Sb,Sn) Half-Heusler Phases as High-Temperature (>700° C.) p-type Thermoelectric Materials," Applied Physics Letters, vol. 93, Feb. 2008.

"Thermoelectric Materials of the Future," Marlow Industries, http://www.marlow.com/resources/future-concepts/materials.html, Dec. 2010, 1pg.

Uher et al., "Transport Properties of Pure and Doped MNiSn(M=Zr,Hf)," Physical Review B, vol. 59, No. 13, Apr. 1999.

International Search Report & Written Opinion issued in PCT Application No. PCT/US11/65841, mailed on Sep. 27, 2012.

G. Joshi et al., "Enhancement of Thermoelectric Figure-of-Merit at Low Temperatures by Titanium Substituion for Hafnium in n-type half-Heuslers," Nano Energy (Jul. 20, 2012), available on-line at http://dx.doi.org/10.1016/j.nanoen.2012.07.020.

X. Yan et al., "Stronger Phonon Scattering by Larger Differences in Atomic Mass and Size in p-type half-Heuslers," Energy Environ. Sci., May 2012, 5, 7543-7548.

Buschow et al., "Magneto-Optical Properties of Metallic Ferromagnetic Materials," Journal of Magnetism and Magnetic Materials 38 (1983), pp. 1-22.

Evers et al., "Ternary Transition Metal Antimonides and Bimuthides with MgAgAs-type and Filled NiAs-type Structure," Journal of Alloys and Compounds, 252 (1997), pp. 93-97.

Poon et al., "Bandgap Features and Thermoelectric Properties of Ti-Based Half-Heusler Alloys," 18th International Conference on Thermoelectrics, Baltimore, MD, Aug. 1999, pp. 45-51.

Sportouch et al., "Thermoelectric Properties of Half-Heusler Phases: ErNi$_{1-x}$Cu$_x$Sb, YNi$_{1-x}$Cu$_x$Sb and Zr$_x$Hf$_y$Ti$_z$NiSn," 18th International Conference on Thermoelectrics, Baltimore, MD, Aug. 1999, pp. 344-347.

Shinogi et al., "Hyperfine Fields of Non-Magnetic Atoms in Ferromagnetic Heusler Alloys: Co$_2$TiAl and Co$_2$TiGa," Journal of the Physical Society of Japan, vol. 53, No. 1, Jan. 1984, pp. 55-58.

Tobola et al., "Electronic Phase Diagram of the XTZ (X=Fe, Co, Ni; T=Ti, V, Zr, Nb, Mn; Z=Sn, Sb) Semi-Heusler Compounds," Journal of Alloys and Compounds, 296 (2000), pp. 243-252.

Tritt et al., "Effects of Various Grain Structure and Sizes on the Thermal Conductivity of Ti-based Half-Heusler Alloys," 20th International Conference on Thermoelectrics, Beijing, China, Jun. 2001, pp. 7-12.

Xia et al., "Thermoelectric Properties of Semimetallic (Zr, Hf) CoSb Half-Heusler Phases," Journal of Applied Physics, vol. 88, No. 4, Aug. 15, 2000, pp. 1952-1955.

Hohl et al., "Efficient Dopants for ZrNiSn-based Thermoelectric Materials," J. Phys.: Condens. Matter, vol. 11, 1999, pp. 1697-1709.

Jung et al., "Study of the 18-electron Band Gap and Ferromagnetism in Semi-Heusler Compounds by Non-Spin-Polarized Electronic Band Structure Calculations," Journal of Molecular Structure (Theochem), 527 (2000), pp. 113-119.

G.J. Poon, "Semiconductors and Semimetals, Chapter 2: Electronic and Thermoelectric Properties of Half-Heusler Alloys," vol. 70, 2001, Summary, 1pg.

Liu et al., "Enhanced Thermoelectric Properties in CoSb$_{3-x}$Te$_x$ Alloys Prepared by Mechanical Alloying and Spark Plasma Sintering," Journal of Applied Physics 102, 103717 (2007), 7pgs.

Xie et al., "Fast Preparation and Thermal Transport Property of TiCoSb-based Half-Heusler Compounds," Chinese Physics, vol. 16, No. 11, Nov. 2007, 4pgs.

Liu et al., "Thermoelectric Property Studies on Cu-Doped n-type Cu$_x$Bi$_2$Te$_{2.7}$Se$_{3.0}$ Nanocomposites," Adv. Energy Mater. 2011, 1, 577-587.

Xia et al., "Electrical Transport Properties of TiCoSb half-Heusler Phases That Exhibit High Resistivity," J. Phys.: Condens. Matter 13 (2001), 1-13.

Larson et al., "Structural Stability of Ni-containing half-Heusler Compounds," Physical Review B, vol. 62, No. 19, Nov. 15, 2000, 9pgs.

Mills, D., "Advances in Solar Thermal Electricity Technology," Solar Energy 76 (2004), 19-31.

Kraemer et al. "High-Performance Flat-Panel Solar Thermoelectric Generators with High Thermal Concentration," Nature Materials, vol. 10, Jul. 2011, 7pgs.

Bhattacharya et al., "Effect of Boundary Scattering on the Thermal Conductivity of TiNiSn-based half-Heusler Alloys," Physical Review B, 77, 184203 (2008), 8pgs.

Bhattacharya et al., "Phonon Scattering Effects on Thermal Conductivity of TiNiSn-based half-Heusler Alloys," Journal of the South Carolina Academy of Science, vol. 6, Issue 2, Article 4, (2013).

Bell, Lon E. "Cooling, Heating, Generating Power, and Recovering Waste Heat with Thermoelectric Systems", Science, vol. 321, pp. 1457-1461(2008.

Dresselhaus et al., "New Directions for Low-Dimensional Thermoelectric Materials", Advanced Materials, vol. 19, 1-12 (2007).

Heremans et al., "Enhancement of Thermoelectric Efficiency in PbTe by Distortion of the Electronic Density of States", Science, vol. 321, pp. 554-557 (2008).

Hsu et al., "Cubic AgPb$_m$SbTe$_{2+m}$: Bulk Thermoelectric Materials with High Figure of Merit", Science, vol. 303, 818-821 (2004).

Liu et al., "Recent advances in thermoelectric nanocomposites", NanoEnergy vol. 1, 42-56 (2012).

Poudel, B. et al., "High Thermoelectric Performance of Nanostructured Bismuth Antimony Telluride Bulk Alloys", Science, 320, 634-638 (2008).

Shi et al., "Low thermal conductivity and high thermoelectric figure of merit in n-type BaxYbyCo4Sb12 double-filled skutterudites", Appl. Phys. Lett., 92, 182101 (2008).

Tobola et al., "Crossover from semiconductor to magnetic metal in semi-Heusler phases as a function of valence electron concentration", J. Phys.: Condens. Matter, 10, 1013-1032 (1998).

Wang et al., "Enhanced thermoelectric figure of merit in nanostructured n-type silicon germanium bulk alloy", Appl. Physics Letters, 93, 193121 (2008).

Xie et al., "High thermoelectric performance BiSbTe alloy with unique low-dimensional structure", J. Appl. Phys., 105, 113713 (2009).

Yang et al., "Solubility study in Yb in *n*-type skutterudites Yb$_x$Co$_4$Sb$_{12}$ and their enhanced thermoelectric properties", Physical Review B, 80, 115329 (2009).

Yang et al., "Evaluation of Half-Heusler Compounds as Thermoelectric Materials Based on the Calculated Electrical Transport Properties" Advanced Functional Materials, 18, 2880-2888 (2008).

International Preliminary Report on Patentability received in connection with international application No. PCT/US2011/065841; mailed Jul. 4, 2013.

* cited by examiner (a)

(b)

(c)

(d)

(e)

(f)

HALF-HEUSLER ALLOYS WITH ENHANCED FIGURE OF MERIT AND METHODS OF MAKING

This application is a continuation-in-part of U.S. application Ser. No. 13/330,216, filed on Dec. 19, 2011, which claims the benefit of U.S. Provisional Application No. 61/424,878, filed Dec. 20, 2010.

This invention was made with government support under grant number DOE DE-FG02-00ER45805 awarded by US Department of Energy, under grant number DE-SC0001299 awarded by the U.S. Department of Energy, and under grant number DE-EE0004840 awarded by the U.S. Department of Energy. The government has certain rights in the invention.

FIELD

The present invention is directed to thermoelectric materials and specifically to half-Heusler alloys.

BACKGROUND

Half-Heuslers (HHs) are intermetallic compounds which have great potential as high temperature thermoelectric materials for power generation. However, the dimensionless thermoelectric figure-of-merit (ZT) of HHs is lower than that of the most state-of-the-art thermoelectric materials. HHs are complex compounds: MCoSb (p-type) and MNiSn (n-type), where M can be Ti or Zr or Hf or combination of two or three of the elements. They form in cubic crystal structure with a F4/3m (No. 216) space group. These phases are semiconductors with 18 valence electron count (VEC) per unit cell and a narrow energy gap. The Fermi level is slightly above the top of the valence band. The HH phases have a fairly decent Seebeck coefficient with moderate electrical conductivity. The performance of thermoelectric materials depends on ZT, defined by $ZT=(S^2\sigma/\kappa)T$, where $\sigma$ is the electrical conductivity, S the Seebeck coefficient, $\kappa$ the thermal conductivity, and T the absolute temperature. Half-Heusler compounds may be good thermoelectric materials due to their high power factor ($S^2\sigma$). It has been reported that the MNiSn phases are promising n-type thermoelectric materials with exceptionally large power factors and MCoSb phases are promising p-type materials. In recent years, different approaches have been reported that have improved the ZT of half-Heusler compounds by mainly optimizing the compositions. However, the observed peak ZT is only around 0.5 for p-type and 0.8 for n-type due to their relatively high thermal conductivity.

SUMMARY

Embodiments include a thermoelectric half-Heusler material comprising at least one of Ti, Zr, Hf, at least one of Ni and Co and at least one of Sn and Sb, wherein the material comprises grains having at least one of a median grain size and a mean grain size less than one micron.

In various embodiments, the material may be an n-type half-Heusler material having a formula $Hf_{1-x}Zr_xNiSn_ySb_{1-y}$, where $0.25<x<1.0$ and $0.95\leq y\leq 0.999$.

In various embodiments, the material may be a p-type half-Heusler material having a ternary (Hf, Zr, Ti) composition with the formula $Hf_{1+\delta-x-y}Zr_xTi_yCoSb_{1+\delta-z}Sn_z$, where $0\leq x\leq 1.0$, $0\leq y\leq 1.0$, $0\leq z\leq 1.0$, and $-0.1\leq\delta\leq 0.1$, such as $Hf_{1+\delta-x-y}Zr_xTi_yCoSb_{1+\delta-z}Sn_z$, where $0\leq x\leq 1.0$, $0<y<1.0$, $0.15\leq z\leq 0.25$, and $-0.1\leq\delta\leq 0$.

Further embodiments include a method of making a nanocomposite thermoelectric material that includes combining and arc melting constituent elements of the thermoelectric material to form an alloy of the thermoelectric material, ball milling the solid casting of the thermoelectric material into nanometer scale mean size particles, and consolidating the nanometer size particles to form the thermoelectric material having at least one of a median grain size and a mean grain size less than one micron.

In various embodiments, the method may further include annealing the consolidated thermoelectric material, such as annealing at a temperature between 700-800° C. in an inert gas.

DETAILED DESCRIPTION

Figure 1:
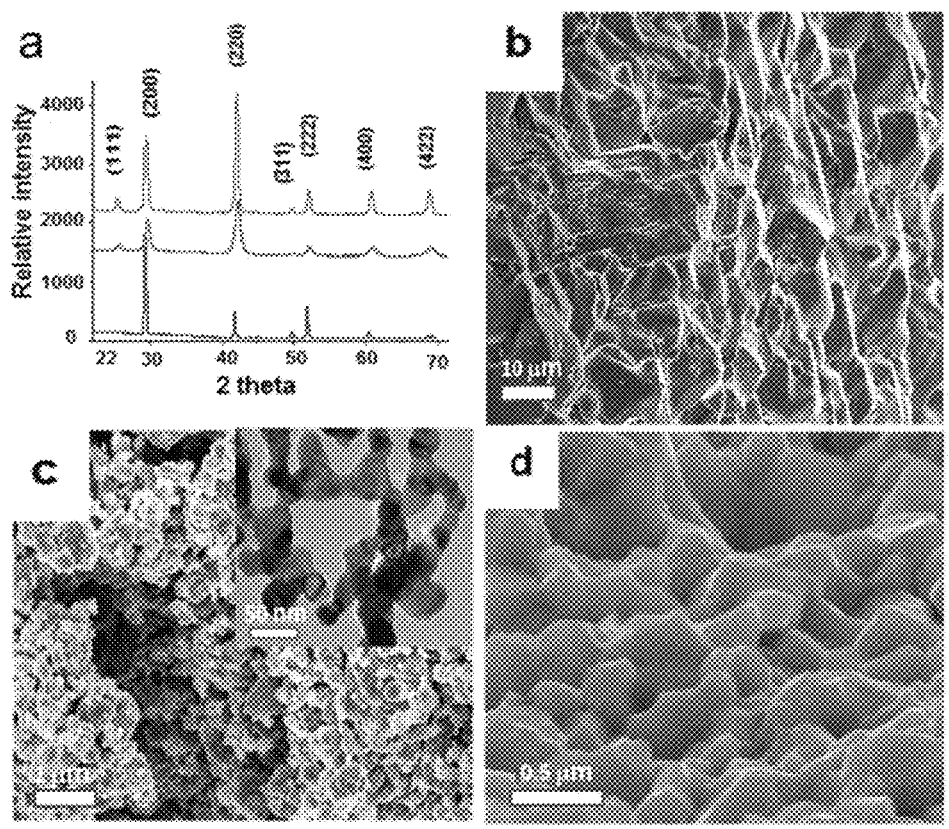
FIG. 1 illustrates XRD patterns (a) (bottom curve: arc melted ingot; middle curve: ball milled powder; and top curve: hot pressed sample). SEM images of arc-melted ingot (b), ball milled nanopowder with TEM image as inset (c), and hot-pressed $Hf_{0.75}Zr_{0.25}NiSn_{0.99}Sb_{0.01}$ samples (d).

An enhancement in the dimensionless thermoelectric figure-of-merit (ZT) of n-type half-Heusler materials using a nanocomposite approach has been achieved. A peak ZT of 1.0 was achieved at 600-700° C., which is about 25% higher than the previously reported highest value. In an embodiment, the samples were made by ball milling ingots of composition $Hf_{0.75}Zr_{0.25}NiSn_{0.99}Sb_{0.01}$ into nanopowders and DC hot pressing the powders into dense bulk samples. The ingots are formed by arc melting the elements. The ZT enhancement mainly comes from reduction of thermal conductivity due to increased phonon scattering at grain boundaries and crystal defects, and optimization of antimony doping.

By using a nanocomposite half-Heusler material, the inventors have achieved a greater than 35% ZT improvement from 0.5 to 0.8 in p-type half-Heusler compounds at temperatures above 400° C. Additionally, the inventors have achieved a 25% improvement in peak ZT, from 0.8 to 1.0 at temperatures above 400° C., in n-type half-Heusler compounds by the same nanocomposite approach. The ZT enhancement is not only due to the reduction in the thermal conductivity but also an increase in the power factor. These nanostructured samples may be prepared, for example, by DC hot pressing a ball milled nanopowder from ingots which are initially made by an arc melting process. In an embodiment, the hot pressed, dense bulk samples are nanostructured with grains having a mean grain size less than 300 nm in which at least 90% of the grains are less than 500 nm in size. In an embodiment, the grains have a mean size in a range of 10-300 nm. In an embodiment, the grains have a mean size of around 200 nm. Typically, the grains have random orientations. Further, many grains may include 10-50 nm size (e.g., diameter or width) nanodot inclusions within the grains.

Embodiments of the half-Heusler materials may include varying amounts of Hf, Zr, Ti, Co, Ni, Sb, Sn depending on whether the material is n-type or p-type. Other alloying elements such as Pb may also be added. Example p-type materials include, but are not limited to, Co containing and Sb rich/Sn poor $Hf_{0.5}Zr_{0.5}CoSb_{0.8}Sn_{0.2}$, $Hf_{0.3}Zr_{0.7}CoSb_{0.7}Sb_{0.3}$, $Hf_{0.5}Zr_{0.5}CoSb_{0.8}Sn_{0.2}$+1% Pb, $Hf_{0.5}Ti_{0.5}CoSb_{0.8}Sn_{0.2}$, and $Hf_{0.5}Ti_{0.5}CoSb_{0.6}Sn_{0.4}$. Example n-type materials include, but are not limited to, Ni containing and Sn rich/Sb poor $Hf_{0.75}Zr_{0.25}NiSn_{0.975}Sb_{0.025}$, $Hf_{0.25}Zr_{0.25}Ti_{0.5}NiSn_{0.994}Sb_{0.006}$, $Hf_{0.25}Zr_{0.25}NiSn_{0.99}Sb_{0.01}$ $(Ti_{0.30}Hf_{0.35}Zr_{0.35})Ni(Sn_{0.994}Sb_{0.006})$, $Hf_{0.25}Zr_{0.25}Ti_{0.5}NiSn_{0.99}Sb_{0.01}$, $Hf_{0.5}Zr_{0.25}Ti_{0.25}NiSn_{0.99}Sb_{0.01}$ and $(Hf,Zr)_{0.5}Ti_{0.5}NiSn_{0.998}Sb_{0.002}$.

The ingot may be made by arc melting individual elements of the thermoelectric material in the appropriate ratio to form the desired thermoelectric material. Preferably, the individual elements are 99.9% pure. More preferably, the individual elements are 99.99% pure. In an alternative embodiment, two or more of the individual elements may first be combined into an alloy or compound and the alloy or compound used as one of the starting materials in the arc melting process. In an embodiment, ball milling results in a nanopowder with nanometer size particles that have a mean size less than 100 nm in which at least 90% of the particles are less than 250 nm in size. In another embodiment, the nanometer size particles have a mean particle size in a range of 5-100 nm.

The inventors have discovered that the figure of merit of thermoelectric materials improves as the grain size in the thermoelectric material decreases. In one embodiment of the method, thermoelectric materials with nanometer scale (less than 1 micron) grains are produced, i.e., 95%, such as 100% of the grains have a grain size less than 1 micron. Preferably, the nanometer scale mean grain size is in a range of 10-300 nm. Embodiments of the method may be used to fabricate any thermoelectric material. In another embodiment, the method includes making half-Heusler materials with nanometer scale grains. The method may be used to make both p-type and n-type half-Heusler materials. In one embodiment, the half-Heusler material is n-type and has the formula $Hf_{1+\delta-x-y}Zr_xTi_yNiSn_{1+\delta-z}Sb_z$, where $0 \leq x \leq 1.0$, $0 \leq y \leq 1.0$, $0 \leq z \leq 1.0$, and $-0.1 \leq \delta \leq 0.1$ (to allow for slightly non-stoichiometric material), such as $Hf_{1-x-y}Zr_xTi_yNiSn_{1-z}Sb_z$, where $0 \leq x \leq 1.0$, $0 \leq y \leq 1.0$, and $0 \leq z \leq 1.0$ when $\delta=0$ (i.e., for the stoichiometric material). In another embodiment, the half-Heusler is a p-type material and has the formula $Hf_{1+\delta-x-y}Zr_xTi_yCoSb_{1+\delta-z}Sn_z$, where $0 \leq x \leq 1.0$, $0 \leq y \leq 1.0$, $0 \leq z \leq 1.0$, and $-0.1 \leq \delta \leq 0$ (to allow for slightly non-stoichiometric material), such as $Hf_{1-x-y}Zr_xTi_yCoSb_{1-z}Sn_z$, where $0 \leq x \leq 1.0$, $0 \leq y \leq 1.0$, and $0 \leq z \leq 1.0$ when $\delta=0$ (i.e., for the stoichiometric material).

The following examples of methods and thermoelectric materials of the present invention. These examples are illustrative and not meant to be limiting.

n-Type Half-Heusler Materials

The n-type half-Heusler materials were prepared by melting hafnium (Hf) (99.99%, Alfa Aesar), zirconium (Zr) (99.99%, Alfa Aesar) chunks, nickel (Ni) (99.99%, Alfa Aesar), tin (Sn) (99.99%, Alfa Aesar), and antimony (Sb) (99.99%, Alfa Aesar) pieces according to composition $Hf_{0.75}Zr_{0.25}NiSn_{0.99}Sb_{0.01}$ using an arc melting process. The melted ingot was then milled for 1-50 hours to get the desired nanopowders with a commercially available ball milling machine (SPEX 800M Mixer/Mill). The mechanically prepared nanopowders were then pressed at temperatures of 9001200° C. by using a dc hot press method in graphite dies with a 12.7 mm central cylindrical opening diameter to get nanostructured bulk half-Heusler samples.

The samples were characterized by X-ray diffraction (XRD), scanning electron microscopy (SEM), and transmission electron microscopy (TEM) to study their crystallinity, homogeneity, average grain size, and grain size distribution of the nanoparticles. These parameters affect the thermoelectric properties of the final dense bulk samples. The volume densities of these samples were measured using an Archimedes' kit.

The nanostructured bulk samples were then cut into 2 mm×2 mm×12 mm bars for electrical conductivity and Seebeck coefficient measurements on a commercial equipment (Ulvac, ZEM-3), 12.7 mm diameter discs with appropriate thickness for thermal diffusivity measurements on a laser flash system (Netzsch LFA 457) from 100 to 700° C., and 6 mm diameter discs with appropriate thickness for specific heat capacity measurements on a differential scanning calorimeter (200-F3, Netzsch Instruments, Inc.) from room temperature to 600° C. (The data point at 700° C. was extrapolated). Then, the thermal conductivity was calculated as the product of the thermal diffusivity, specific heat capacity, and volume density of the samples. To confirm the reproducibility of the sample preparation process and reliability of the measurements of nanocrystalline bulk samples, the same experimental conditions were repeated 3-6 times for each composition. It was found that the thermoelectric properties are reproducible within 5% under the same experimental conditions. The volume densities of three measured nanostructured samples (runs 1, 2 and 3) were 9.73, 9.70, and 9.65 gcm$^{-3}$, respectively.

In embodiments, a nanostructured approach has been used to reduce the lattice thermal conductivity along with the optimization of antimony concentrations to optimize the electrical conductivity for the highest power factor. Since the ingot of $Hf_{0.75}Zr_{0.25}NiSn_{0.975}Sb_{0.025}$ composition is the previously reported best n-type HHs with a peak ZT of 0.8, nanostructured samples of compositions $Hf_{0.75}Zr_{0.25}NiSn_{1-z}Sb_z$ (z=0.005, 0.01, and 0.025) were prepared and measured. It was observed that the best ZT values are obtained with a $Hf_{0.75}Zr_{0.25}NiSn_{0.99}Sb_{0.01}$ composition. It is believed that this is due to a nanostructuring process and optimization of antimony concentration.

The results for the temperature dependent thermoelectric properties of n-type half-Heusler samples of composition $Hf_{0.75}Zr_{0.25}NiSn_{0.99}Sb_{0.01}$ are provided below. FIG. 1 shows the XRD patterns (FIG. 1a) (bottom curve: ingot; middle curve: ball milled powder; and top curve: hot pressed sample), and SEM image of the fractured surface of arc-melted ingot (FIG. 1b), SEM image of the ball milled powder with TEM image as inset (FIG. 1c), and SEM image of the fractured surface of the hot pressed samples (FIG. 1d). The XRD patterns (FIG. 1a) clearly show that the sample is completely alloyed after arc melting, and the peaks are well matched with those of half-Heusler phases. FIG. 1b clearly shows that the ingot has large particles ranging from 10 micrometers and up. These large particles are easily broken into nanoparticles by ball milling (FIG. 1c) with grain size of around 50 nm (inset of FIG. 1c), and a significant grain growth takes place during the hot pressing process (FIG. 1d). Moreover, TEM has been carried out to study the microstructures of the hot pressed samples.

Figure 2:
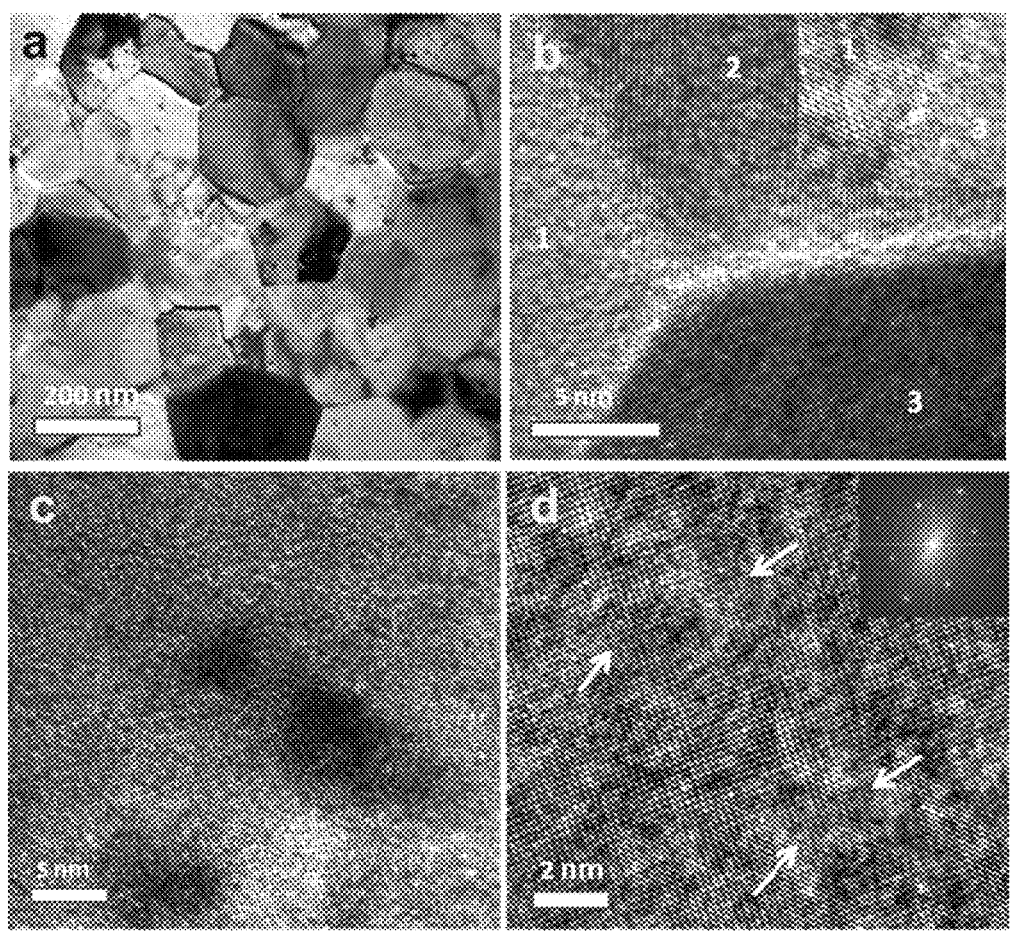
FIG. 2 illustrates low- (a), and high-magnification (b-d) TEM images of nanostructured $Hf_{0.75}Zr_{0.25}NiSn_{0.99}Sb_{0.01}$ samples made by ball milling and hot pressing. The inset in b) is to show the crystalline nature of grain 1 with a rotation. The inset in d) is to show the grains as perfect crystalline structures.

FIG. 2 shows a low-(FIG. 2a), and high-magnification (FIGS. 2b-d) TEM images of the hot pressed $Hf_{0.75}Zr_{0.25}NiSn_{0.99}Sb_{0.01}$ samples. TEM images (FIG. 2a) confirm the grain size observed by SEM image, in the range of around 200-300 nm, the existence of clear crystalline grain boundaries (FIG. 2b, the inset shows grain 1 is also crystalline even though it looks amorphous due to a different orientation when image was taken), some precipitates or aggregates in the matrix (FIG. 2c), and the discontinuous heavily-distorted crystal lattice, pointed by arrows (FIG. 2d). The small grains, precipitates, and lattice distortions are desirable for lower thermal conductivity due to possible increase in phonon scattering.

Figure 3:
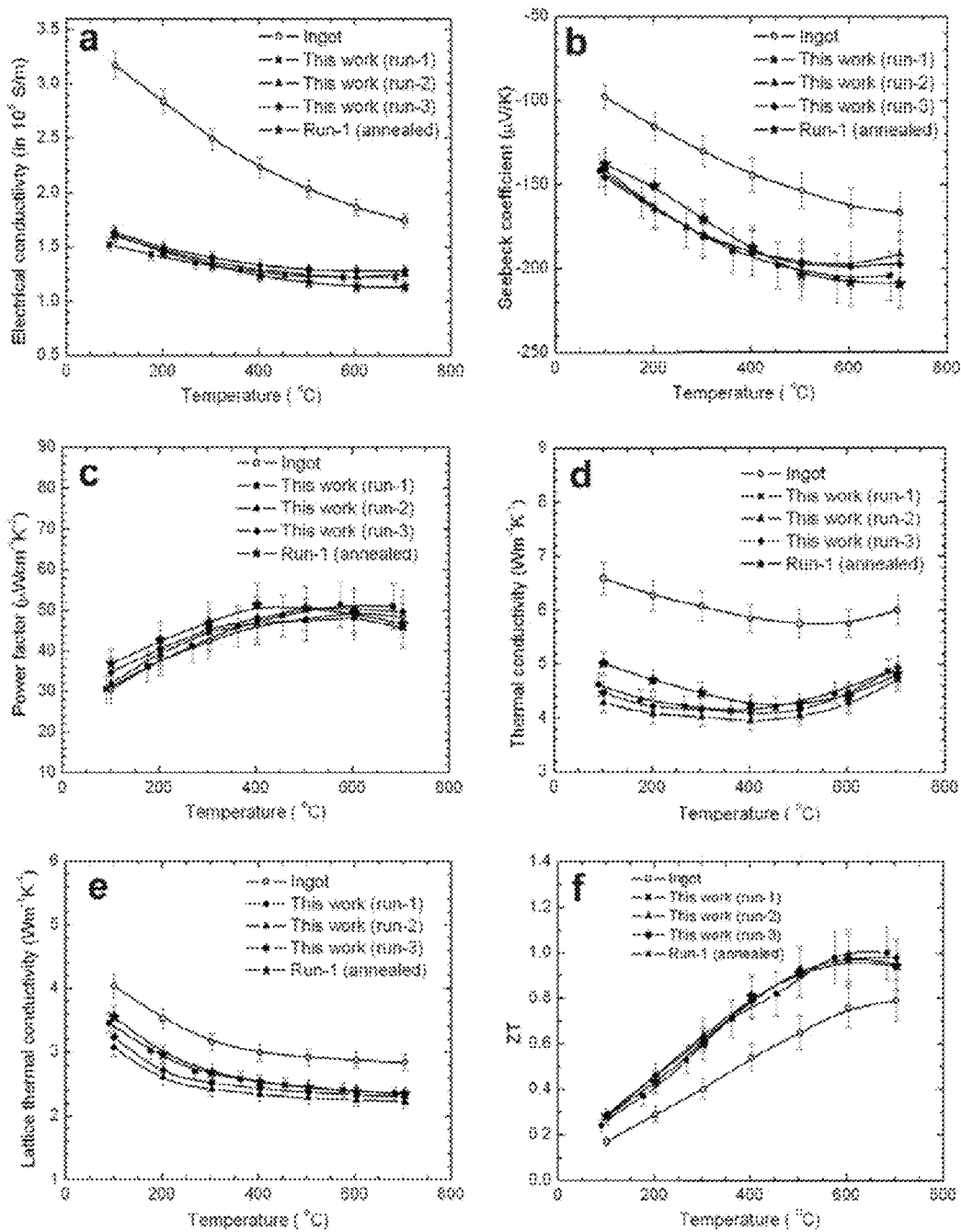
FIG. 3 illustrates temperature dependent electrical conductivity (a), Seebeck coefficient (b), power factor (c), total thermal conductivity (d), lattice thermal conductivity (e), and ZT (0 of nanostructured $Hf_{0.75}Zr_{0.25}NiSn_{0.99}Sb_{0.01}$ samples (filled squares, triangles, and diamonds), and the annealed sample at 800° C. for 12 hours in air (stars) (the line is for viewing guidance only) in comparison with the ingot sample (open circles) which matches the previously reported best n-type half-Heusler composition.

FIGS. 3a-3f show the temperature dependent electrical conductivity (FIG. 3a), Seebeck coefficient (FIG. 3b), power factor (FIG. 3c), thermal conductivity (FIG. 3d), lattice thermal conductivity (FIG. 3e), and ZT (FIG. 3O of the three ball milled and hot pressed nanostructured samples (runs 1, 2 & 3, which are prepared by the same procedure) with a composition of $Hf_{0.75}Zr_{0.25}NiSn_{0.99}Sb_{0.01}$ in comparison with a reference sample of the previously reported best n-type half-Heusler samples by Culp et al. with a composition of $Hf_{0.75}Zr_{0.25}NiSn_{0.975}Sb_{0.025}$. These nanostructured and ingot samples are measured by the same measurement systems. FIG. 3a clearly shows that the electrical conductivity of the nanostructured $Hf_{0.75}Zr_{0.25}NiSn_{0.99}Sb_{0.01}$ samples is much lower than that of the ingot sample, which is desired for lower electronic contribution to the thermal conductivity. The Seebeck coefficient of the nanostructured $Hf_{0.75}Zr_{0.25}NiSn_{0.99}Sb_{0.01}$ samples is higher in comparison with the ingot sample (FIG. 3b). This could be due to the lower doping (antimony) concentration. As a result, the power factor of the nanostructured $Hf_{0.75}Zr_{0.25}NiSn_{0.99}Sb_{0.01}$ samples is almost the same as that of the reference $Hf_{0.75}Zr_{0.25}NiSn_{0.975}Sb_{0.025}$ sample (FIG. 3c). However, the thermal conductivity of the nanostructured $Hf_{0.75}Zr_{0.25}NiSn_{0.99}Sb_{0.01}$ sample is significantly lower than that of the reference $Hf_{0.75}Zr_{0.25}NiSn_{0.975}Sb_{0.025}$ sample (FIG. 3d). The lower thermal conductivity of nanostructured $Hf_{0.75}Zr_{0.25}NiSn_{0.99}Sb_{0.01}$ samples is due to both the lower electrical conductivity and the expected stronger grain boundary scattering resulting in lower lattice thermal conductivity (FIG. 3e). The lattice thermal conductivity ($\kappa_{lattice}$) was calculated by subtracting the carrier ($\kappa_{carrier}$) and bipolar ($\kappa_{bipolar}$) contributions from the total thermal conductivity ($\kappa_{total}$), where the carrier contribution was obtained from Wiedemann-Franz law by using temperature dependent Lorenz number, and the bipolar contribution is taken into account by $\kappa_{lattice}$ being proportional to $T^{-1}$. Since both the ingot and nanostructured samples are heavily doped (degenerate semiconductors), a single band approximation is used to calculate the Lorenz number. As a result, a peak ZT of around 1.0 at 600-700° C. (FIG. 3O is observed, which is about 25% higher than that of the ingot sample. Thus, n-type half-Heusler materials with ZT greater than 0.8, such as 0.8-1, at 700° C. are made using the exemplary methods. This enhancement in ZT by ball milling and hot pressing is mainly due to the reduction in electronic and thermal conductivities. FIG. 3 shows that the results of nanostructured samples are reproducible within the experimental errors. FIG. 3 also includes the results of an annealed nanostructured sample (run-1), which does not show any significant degradation in thermoelectric properties after annealing. The sample was annealed at 800° C. for 12 hours in air. This is an accelerated condition since the application temperature is expected to be below 700° C.

Figure 4:
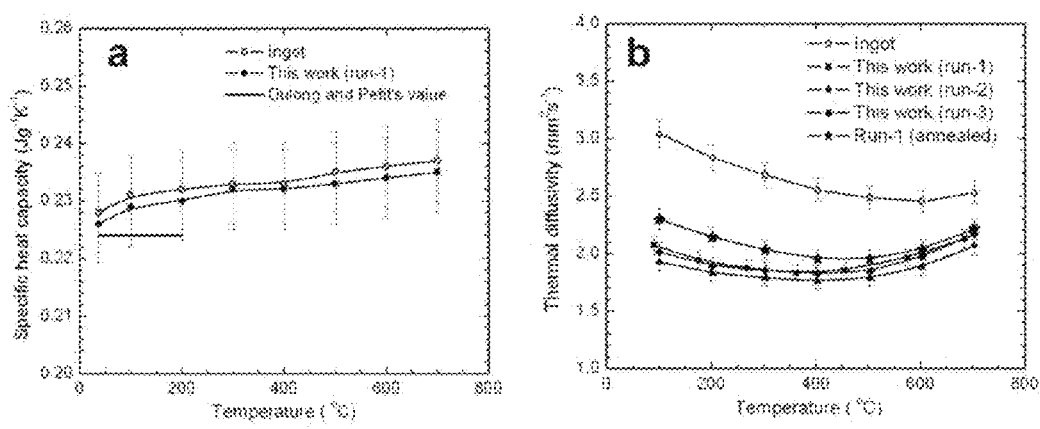
FIG. 4 illustrates temperature dependent specific heat capacity (a), and thermal diffusivity (b) of arc-melted and then ball milled and hot pressed $Hf_{0.75}Zr_{0.25}NiSn_{0.99}Sb_{0.01}$ samples (filled squares, triangles, and diamonds), and the annealed sample at 800° C. for 12 hours in air (stars) in comparison with the ingot sample (open circles).

Also shown is the temperature dependent specific heat capacity (FIG. 4a) and thermal diffusivity (FIG. 4b) of nanostructured $Hf_{0.75}Zr_{0.25}NiSn_{0.99}Sb_{0.01}$ samples in comparison with a reference $Hf_{0.75}Zr_{0.25}NiSn_{0.975}Sb_{0.025}$ ingot sample. FIG. 4 clearly shows that the specific heat capacity of nanostructured $Hf_{0.75}Zr_{0.25}NiSn_{0.99}Sb_{0.01}$ samples is almost the same the ingot sample (FIG. 4a) and these values agree fairly well with the Dulong and Petit value of specific heat capacity (solid line). However, the thermal diffusivity of the nanostructured $Hf_{0.75}Zr_{0.25}NiSn_{0.99}Sb_{0.01}$ sample is significantly lower (FIG. 4b) than that of the ingot sample due to the small grain size effect and lower electronic contribution.

Since the size of the nanoparticles is useful in reducing the thermal conductivity to achieve higher ZT values, it is possible to further increase ZT of the n-type half-Heusler compounds by making the grains even smaller. In these experiments, grains of 200 nm and up (FIG. 2a) were made. It is possible, however, to achieve a grain size less than 100 nm by preventing grain growth during hot-press with a grain growth inhibitor. Exemplary grain growth inhibitors include, but are not limited to, oxides (e.g., $Al_2O_3$), carbides (e.g., SiC), nitrides (e.g., AlN) and carbonates (e.g., $Na_2CO_3$).

A cost effective ball milling and hot pressing technique has been applied to n-type half-Heuslers to improve the ZT. A peak ZT of 1.0 at 700° C. is observed in nanostructured $Hf_{0.75}Zr_{0.25}NiSn_{0.99}Sb_{0.01}$ samples, which is about 25% higher than the previously reported best peak ZT of any n-type half-Heuslers. This enhancement in ZT mainly results from reduction in thermal conductivity due to the increased phonon scattering at the grain boundaries of nanostructures and optimization of carrier contribution leading to lower electronic thermal conductivity, plus some contribution from the increased electron power factor. Further ZT improvement is possible if the grains are made less than 100 nm.

Figure 5:
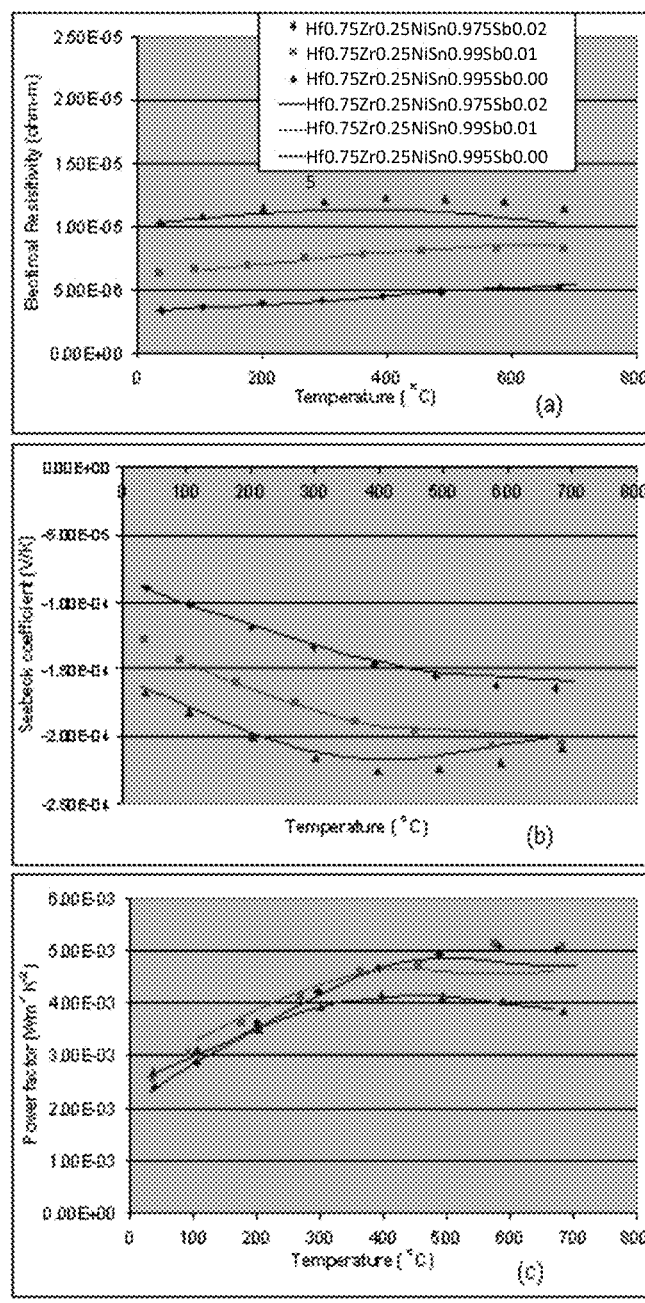
FIG. 5 illustrates the temperature dependent electrical conductivity (FIG. 5a), Seebeck coefficient (FIG. 5b), power factor (FIG. 5c), thermal conductivity (FIG. 5d), and ZT (FIG. 5e) of arc melted and ball milled $Hf_{0.75}Zr_{0.25}Ni Sn_{1-z}Sb_z$ (z=0.005, 0.01, 0.025) compositions arc melted and ball milled in-house (points) and arc melted by vendor and ball milled in-house (lines).
Figure 5:
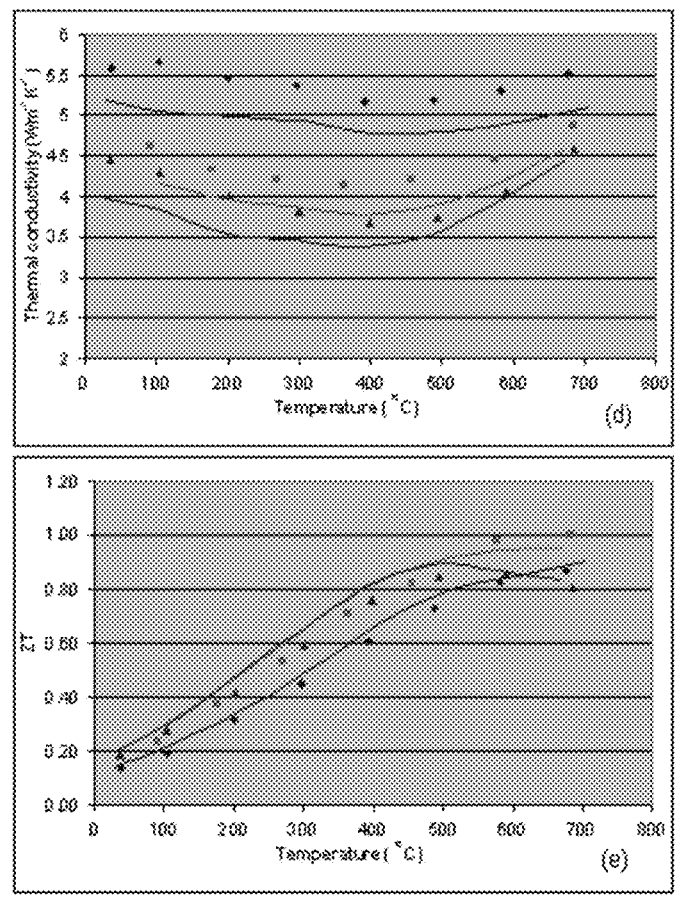
Figure 6:
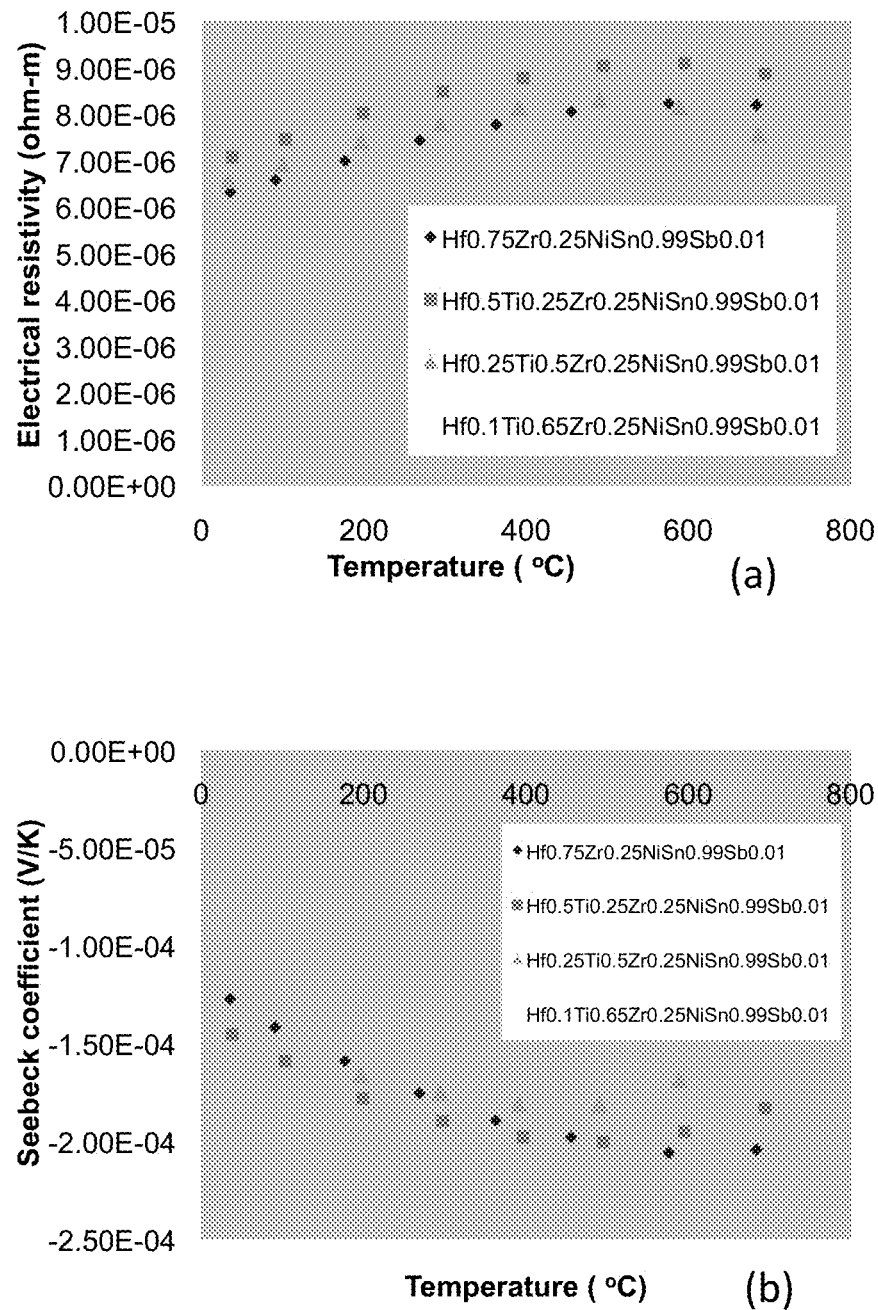
FIG. 6 illustrates the temperature dependent electrical resistivity (FIG. 6a), Seebeck coefficient (FIG. 6b), thermal conductivity (FIG. 6c), and ZT (FIG. 6d) of arc melted and ball milled (15 hrs, and pressed at 1000° C.) $Hf_{1-x}Ti_xZr_{0.25}Sn_{0.99}Sb_{0.01}$ (x=0, 0.25, 0.5, 0.65).
Figure 6:
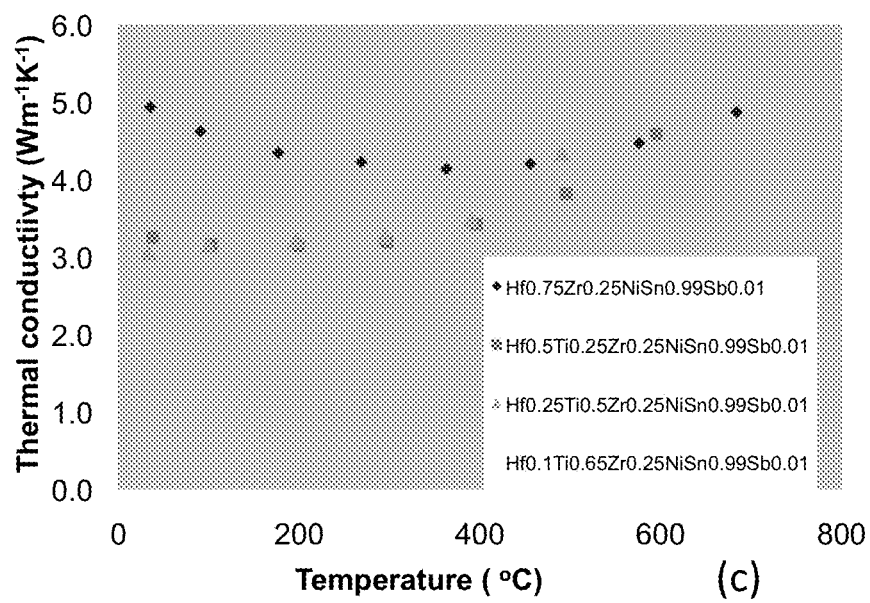
Figure 6:
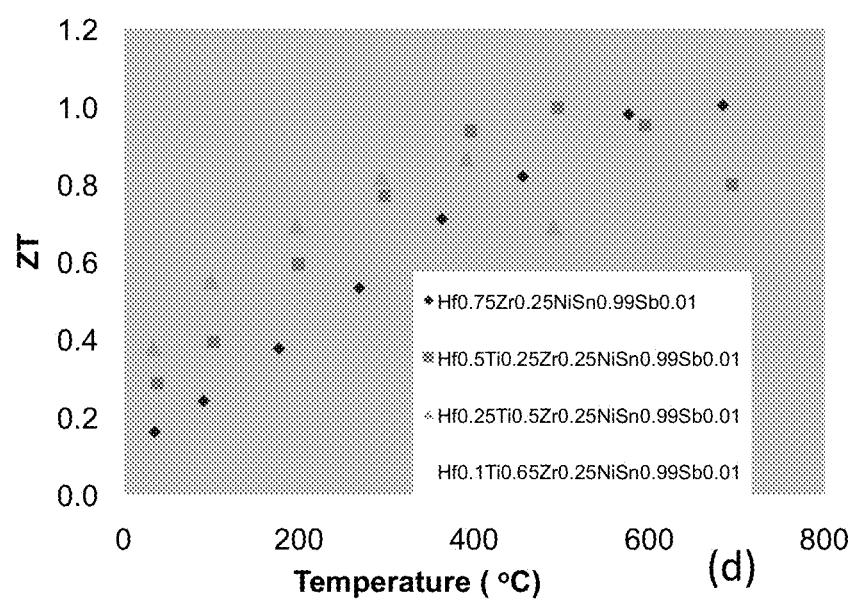
Figure 7:
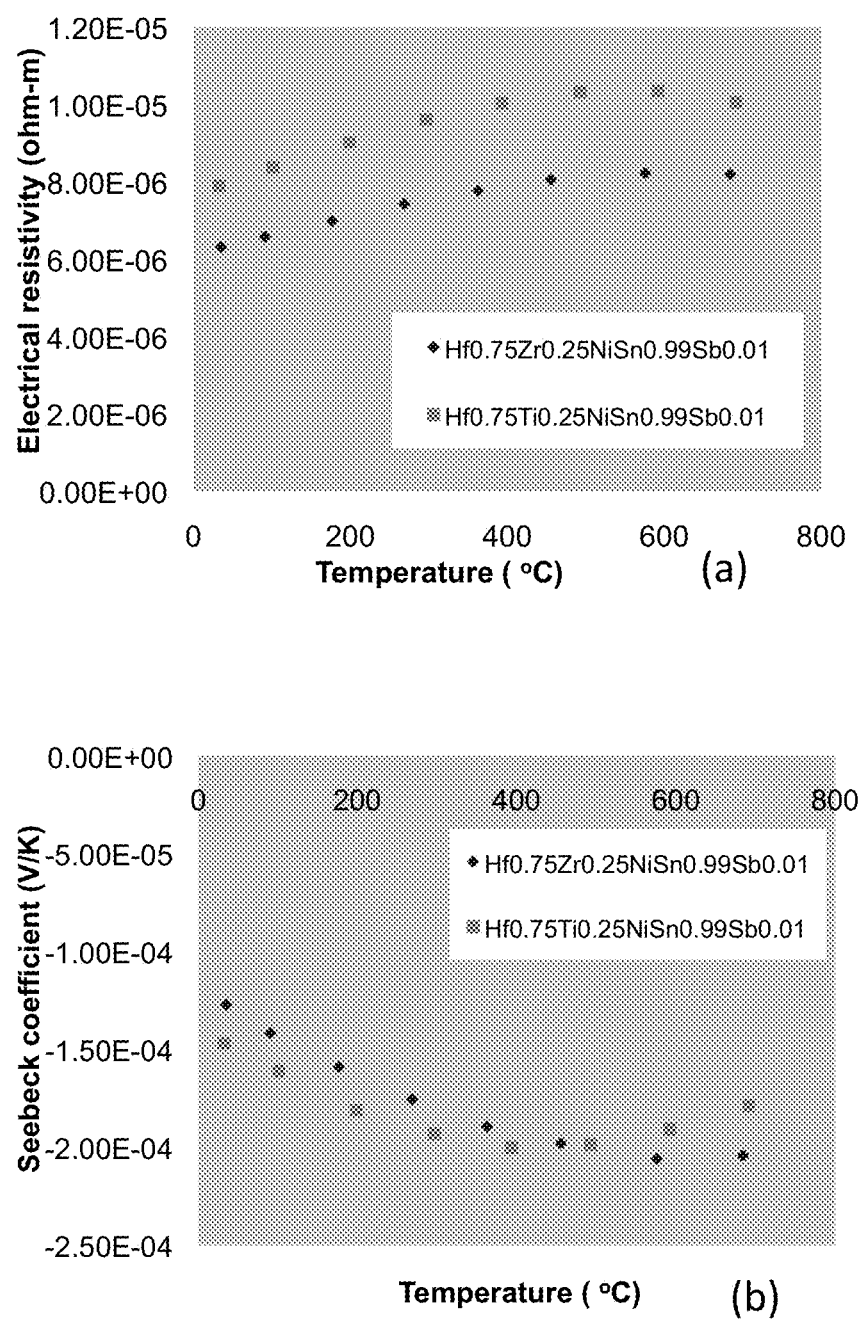
FIG. 7 illustrates the temperature dependent electrical resistivity (FIG. 7a), Seebeck coefficient (FIG. 7b), thermal conductivity (FIG. 7c), and ZT (FIG. 7d) of arc melted and ball milled $Hf_{0.75}Zr_{0.25}NiSn_{0.99}Sb_{0.01}$ and $Hf_{0.75}Ti_{0.25}NiSn_{0.99}Sb_{0.01}$.
Figure 7:
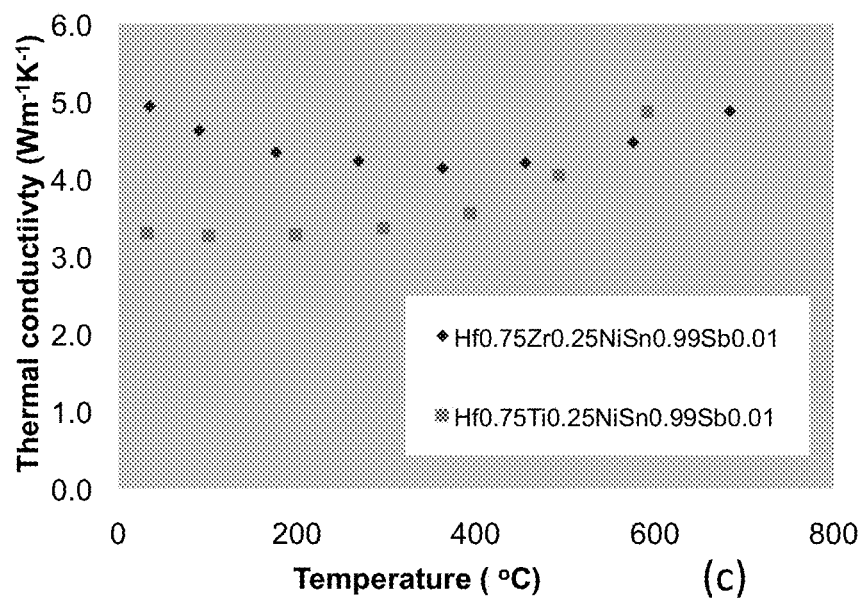
Figure 7:
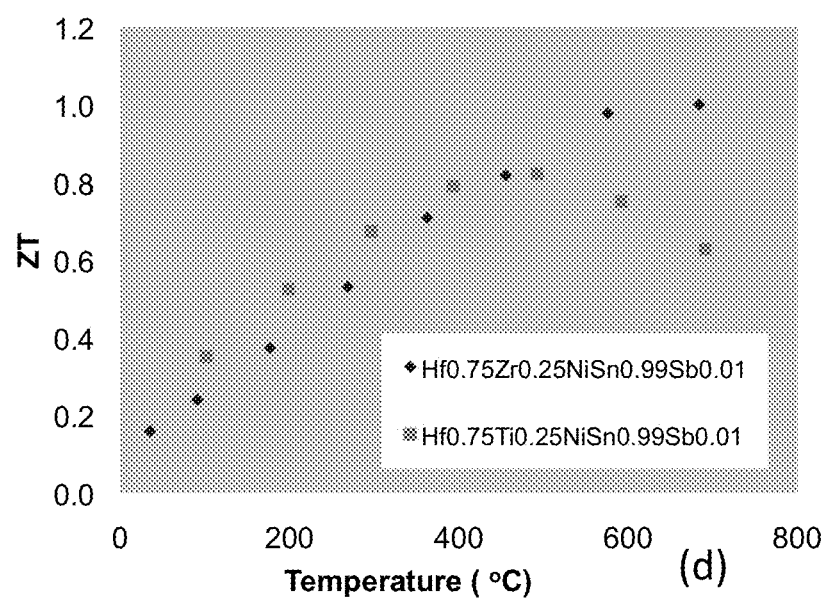

The effect of composition, arc melting and ball milling on the thermoelectric properties of other n-type thermoelectric materials are illustrated in FIGS. 5-7. FIG. 5 illustrates the temperature dependent electrical conductivity (FIG. 5a), Seebeck coefficient (FIG. 5b), power factor (FIG. 5c), thermal conductivity (FIG. 5d), and ZT (FIG. 5e) of arc melted and ball milled $Hf_{0.75}Zr_{0.25}NiSn_{1-x}Sb_x$ (x=0.005, 0.01, 0.025) compositions arc melted and ball milled in-house (points) and arc melted by vendor and ball milled in-house (lines). The good match between the in-house arc melted and vendor arc melted materials after bill milling indicates that the small grain size achieved in ball milling is the predominate factor in achieving superior thermoelectric properties, especially the figure of merit. FIG. 5e further indicates that a 10% improvement in the figure of merit (ZT) can be achieved with compositions in which $0.0075 \leq x \leq 0.015$.

FIG. 6 illustrates the effect of adding Ti on the temperature dependent electrical conductivity (FIG. 6a), Seebeck coefficient (FIG. 6b), thermal conductivity (FIG. 6c), and ZT (FIG. 6d) of arc melted and ball milled (15 hrs, and pressed at 1000° C.) $Hf_{1-x}Ti_xZr_{0.25}NiSn_{0.99}Sb_{0.01}$ (x=0, 0.25, 0.5, 0.65). After Ti substitution, the electrical resistivity increases at first and starts to decrease after certain Ti concentration. The Seebeck coefficient decreases at higher temperatures for all Ti doped samples. This indicates the decrease in carrier concentration after Ti substitution. After Ti substitution, the thermal conductivity decreases at lower temperatures but reaches similar values at high temperatures. This is a carrier concentration effect. The peak ZT is 1.0 for the low Ti % (0.25) containing sample, but is shifted to a lower temperature (500° C.). The peak ZT decreases with a larger concentration of Ti. Thus, a Ti free sample achieved the highest ZT (ZT=1) at higher temperature (e.g., 700° C.). Thus, n-type half-Heusler samples with $Ti \leq 0.5$ (e.g., $0 \leq x \leq 0.3$) exhibit the highest ZT at higher temperatures (e.g., 700° C.).

FIG. 7 illustrates the temperature dependent electrical conductivity (FIG. 7a), Seebeck coefficient (FIG. 7b), thermal conductivity (FIG. 7c), and ZT (FIG. 7d) of arc melted and ball milled $Hf_{0.75}Zr_{0.25}NiSn_{0.99}Sb_{0.01}$ and $Hf_{0.75}Ti_{0.25}NiSn_{0.99}Sb_{0.01}$ samples. With Ti replacement of Zr, the electrical resistivity increases. However the Seebeck coefficient increases only at lower temperatures but decreases at higher temperatures. It appears that the carrier concentration decreases with Ti replacement. The high temperature (600-700° C.) ZT of the Zr containing sample is approximately 20% higher than that of the Ti containing sample.

Therefore, as shown in FIGS. 3, 5, 6 and 7, for the n-type thermoelectric material, the figure of merit, ZT, is greater than 0.7, preferably greater than 0.8 at a temperature greater than 400° C., such as 0.7 to 1 in a temperature range of 400 to 700° C. For example, ZT is greater than 0.8, preferably greater than 0.9 at a temperature greater than or equal to 500° C., such as such 0.8 to 1 in a temperature range of 500 to 700° C. ZT is greater than 0.9 at a temperature greater than or equal to 600° C., such as such 0.9 to 1 in a temperature range of 600 to 700° C. ZT is equal to or greater than 0.9 (e.g., 0.95 to 1) at a temperature of 700° C.

P-Type Half-Heusler Materials

In a typical experiment, the arc welded alloyed ingot with the composition of $Hf_{0.5}Zr_{0.5}CoSb_{0.8}Sn_{0.2}$ was loaded into a jar with grinding balls and then subjected to a mechanical ball milling process. For different ball milling time intervals, a small amount of as-milled powder was taken out for size investigation by transmission electron microscope (TEM) (JEOL 2010). Correspondingly, some nanopowders were pressed into pellets with a diameter of 12.7 mm by the direct current induced hot press method. The freshly fractured surfaces of the as-pressed samples were observed by scanning electron microscope (SEM) (JEOL 6340F) and TEM to show the grain size of the samples.

To study the thermoelectric properties, polished bars of about 2×2×12 mm and disks of 12.7 mm in diameter and 2 mm in thickness were made. The bar samples were used to measure the electrical conductivity and Seebeck coefficient, and the disk samples were used to measure the thermal conductivity. The four-probe electrical conductivity and the Seebeck coefficient were measured using commercial equipment (ULVAC, ZEM3). The thermal diffusivity was measured using a laser flash system (LFA 457 Nanoflash, Netzsch Instruments, Inc.). Specific heat was determined by a DSC instrument (200-F3, Netzsch Instruments, Inc.). The volume density was measured by the Archimedes method. The thermal conductivity was calculated as the product of thermal diffusivity, specific heat, and volume density. The uncertainties are 3% for electrical conductivity, thermal diffusivity and specific heat, and 5% for Seebeck coefficient, leading to an 11% uncertainty in ZT.

The experiments were repeated more than 10 times and confirmed that the peak ZT values were reproducible within 5%.

Figure 8:
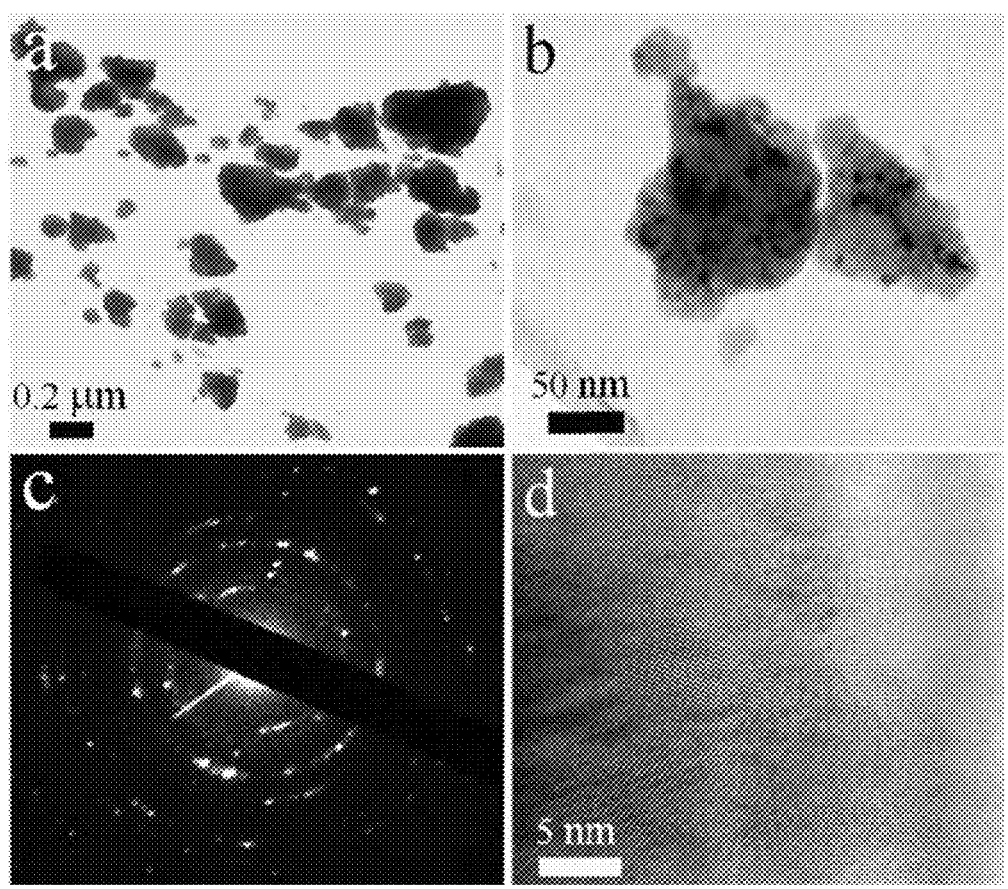
FIG. 8 illustrates (a) low and (b) medium magnification TEM images of, (c) selected area electron diffraction patterns of, and (d) high magnification TEM image of the ball milled $Hf_{0.5}Zr_{0.5}CoSb_{0.8}Sn_{0.2}$ nanopowders. The selected area electron diffraction patterns in (c) show the multi-crystalline nature of an agglomerated cluster in (b).

FIG. 8 shows TEM images of the ball milled nanopowders. The low (FIG. 8a) and medium (FIG. 8b) magnification TEM images show that the average cluster size of the nanopowders ranges from 20 nm to 500 nm. However, those big clusters are actually agglomerates of many much smaller crystalline powder particles, which are confirmed by the corresponding selected area electron diffraction (SAED) patterns (FIG. 8c) obtained inside a single cluster (FIG. 8b). The high resolution TEM image (FIG. 8d) shows that the sizes of the small powder particles are in the range of 5-10 nm.

Figure 9:
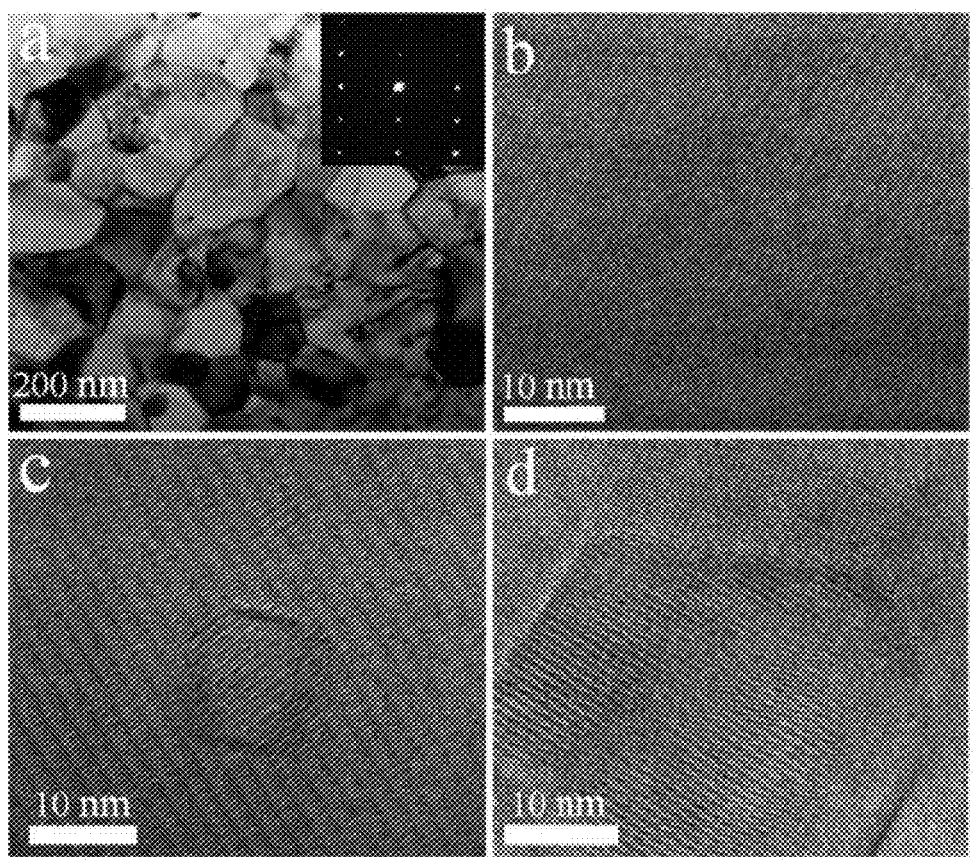
FIG. 9 illustrates TEM images of hot pressed nanostructured $Hf_{0.5}Zr_{0.5}CoSb_{0.8}Sn_{0.2}$ samples under low (a) and high magnifications (b, c, d). The inset in (a) is the selected area electron diffraction patterns showing the single crystalline nature of the individual grains.

FIG. 9 displays the TEM images of the as-pressed bulk samples pressed from the ball milled powder. The low magnification TEM image is presented in FIG. 9a, from which we can see that the grain sizes are in the range of 50-300 nm with an estimated average size being about 100-200 nm. Therefore, there is a significant grain growth during the hot pressing process. The selected area electron diffraction (SAED) pattern (inset of FIG. 9a) of each individual grains indicates that the individual grains are single-crystalline. The high resolution TEM image (FIG. 9b) demonstrates the good crystallinity inside each individual grains. FIG. 9c shows one nanodot (i.e., small crystalline inclusion) embedded inside the matrix, such dots having a size (e.g., width or diameter) of 10-50 nm are commonly observed in most of the grains. The compositions of both the nanodot and its surrounding areas are checked by energy dispersive spectroscopy (EDS), showing Hf rich and Co deficient composition for the nanodot compared to the sample matrix (i.e., the larger grains). Another feature pertaining to the sample is that small grains (~30 nm) are also common (FIG. 9d), which have similar composition as the surrounding bigger grains determined by EDS. It is believed that the non-uniformity in both the grain sizes and the composition all contribute to the reduction of thermal conductivity.

Figure 10:
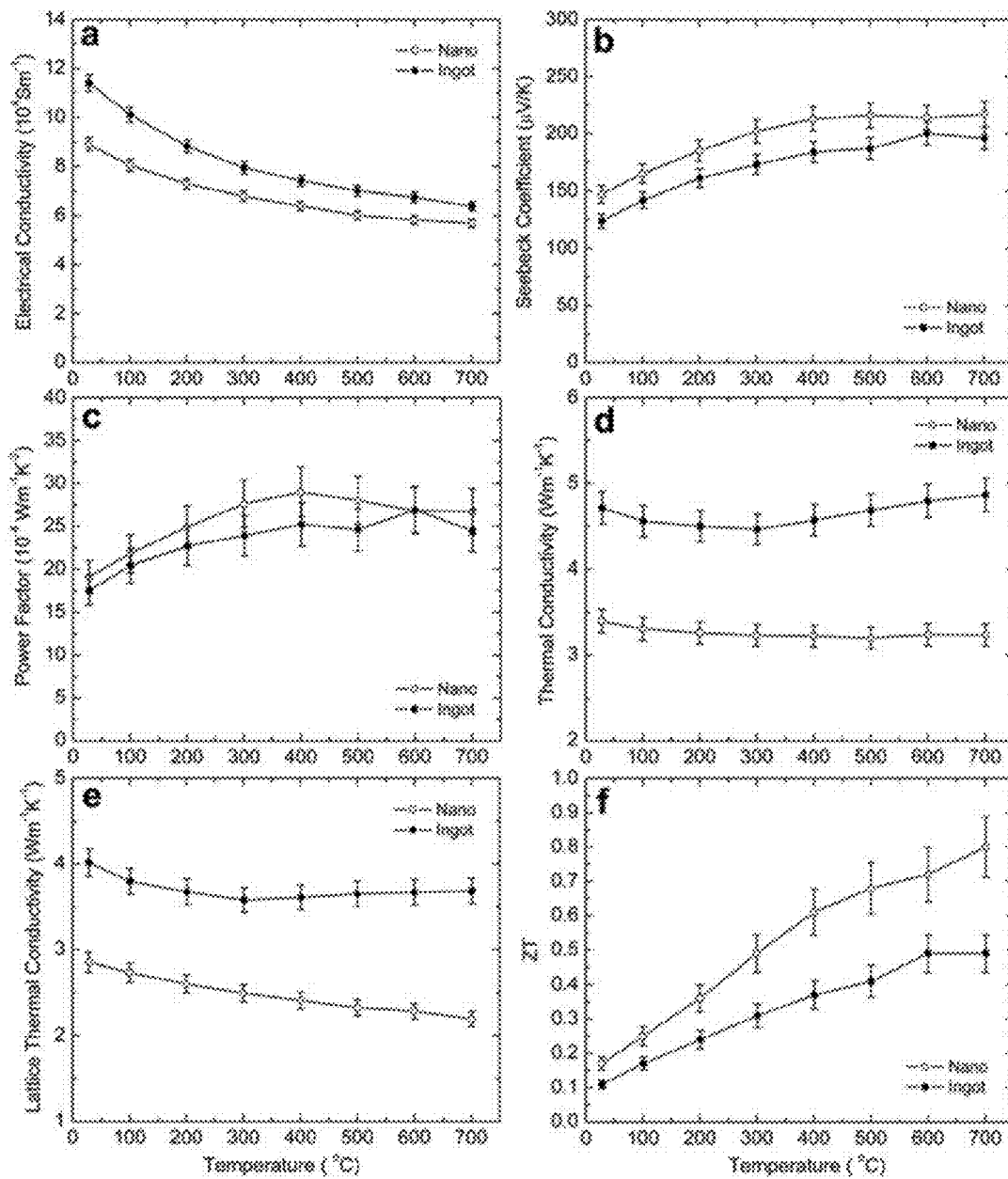
FIG. 10 illustrates temperature-dependent (a) electrical conductivity, (b) Seebeck coefficient, (c) power factor, (d) total thermal conductivity, (e) lattice part of thermal conductivity, and (f) ZT of ball milled and hot pressed sample in comparison with that of the ingot for a $Hf_{0.5}Zr_{0.5}CoSb_{0.8}Sn_{0.2}$ material.

The temperature-dependent thermoelectric (TE) properties of the hot pressed $Hf_{0.5}Zr_{0.5}CoSb_{0.8}Sb_{0.2}$ bulk samples in comparison with that of the ingot are plotted in FIG. 10. For all of the samples examined, the temperature-dependence of the electrical conductivity was found to exhibit semimetallic or degenerate semiconductor behavior (FIG. 10a). Specifically, the electrical conductivities of all the ball milled and hot pressed samples are lower than that of the ingot. The mobility and carrier concentration at room temperature have been measured to be 3.86 $cm^2V^{-1}s^1$ and $1.6\times10^{21}$ $cm^3$, respectively. The mobility is lower than the previously reported value while the carrier concentration is higher. Electrical conductivities of our ball milled samples decrease slowly at the higher temperature range. The Seebeck coefficients (FIG. 10b) of the ball milled samples are higher than that of the ingot for the whole temperature range. These facts strongly indicate that grain boundaries may be trapping electrons, leading to increased holes in the sample and energy filtering effect where low energy holes are preferentially scattered at the grain boundaries. As a result of the improvement in the Seebeck coefficient and a slight decrease in the electrical conductivity, the power factor (FIG. 10c) of ball milled and hot pressed samples is higher than that of the ingot. The total thermal conductivity of the ball milled and hot pressed samples (FIG. 10d) decreases gradually with temperature up to 500° C. and does not change too much after that, which shows a much weaker bi-polar effect. The reduction of the thermal conductivity in the ball milled and hot pressed nanostructured samples compared with the ingot is mainly due to the increased phonon scattering at the numerous interfaces of the random nanostructures. To get a quantitative view of the effect of ball milling and hot pressing on phonon transport, the lattice thermal conductivity ($\kappa_l$) was estimated by subtracting the electronic contribution ($\kappa_e$) from the total thermal conductivity ($\kappa$). The electronic contribution to the thermal conductivity ($\kappa_e$) can be estimated using the Wiedemann-Franz law. The Lorenz number can be obtained from the reduced Fermi energy, which can be calculated from the Seebeck coefficient at room temperature and the two band theory. Within expectation, the lattice part of the thermal conductivity (FIG. 10e) decreases with temperature. For the ingot sample, $\kappa_e$=0.7 $Wm^{-1}K^{-1}$ and $\kappa_l$=4.01 $Wm^{-1}K^{-1}$ were obtained at room temperature, whereas for the ball milled and hot pressed samples $\kappa_e$=0.54 $Wm^{-1}K^{-1}$ due to a lower electrical conductivity and $\kappa_l$=2.86 $Wm^{-1}K^{-1}$ at room temperature. The lattice thermal conductivity of the ball milled and hot pressed samples at room temperature is about 29% lower than that of the ingot, which is mainly due to a stronger boundary scattering in the nanostructured sample. It appears that the lattice part is still a large portion of the total thermal conductivity. If an average grain size below 100 nm is achieved during hot pressing, the thermal conductivity can be expected to be further reduced. The slightly improved power factor, coupled with the significantly reduced thermal conductivity, makes the ZT (FIG. 10f of the ball milled and hot pressed samples greatly improved in comparison with that of the ingot. The peak ZT of all the ball milled and hot pressed samples reached 0.8 at 700° C., a 60% improvement over the believed highest journal reported ZT value of 0.5 obtained in ingot, showing promise as p-type material for high temperature applications. Thus, p-type half-Heusler materials with ZT≥0.7 at high temperatures (e.g., 600-700° C.), such as 0.7-0.8 are obtained.

Figure 11:
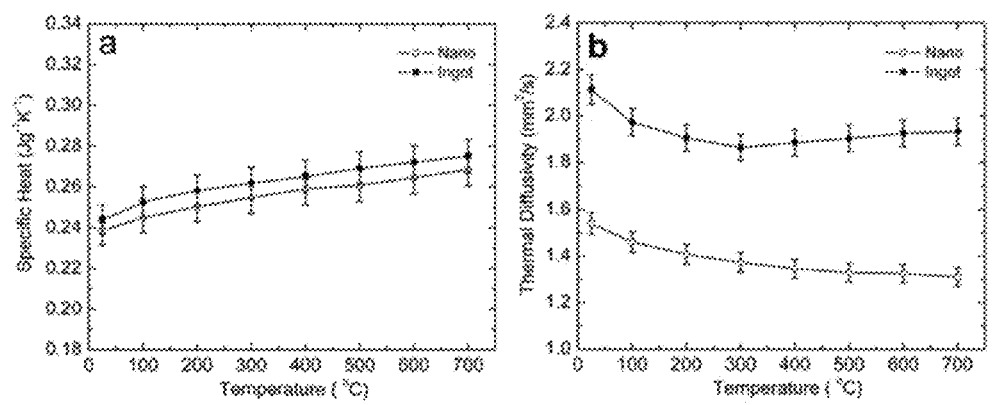
FIG. 11 illustrates temperature-dependent specific heat (a) and thermal diffusivity (b) of ball milled and hot pressed sample in comparison with that of the ingot for a $Hf_{0.5}Zr_{0.5}CoSb_{0.8}Sn_{0.2}$ material.

The specific heat (FIG. 11a) and thermal diffusivity (FIG. 11b) of the ball milled and hot pressed samples compared with that of the ingot sample. The specific heat (FIG. 11a) of both the ingot and the ball milled and hot pressed samples increases steadily with temperature up to 600° C. (the limit of our DSC measurement instrument). The specific heat value at 700° C. was obtained by a reasonable extrapolation. The specific heat difference of about 3% is within the experimental error of the measurement. It is clear that the major decrease is in thermal diffusivity (FIG. 11b) with the ball milled and hot pressed sample consistently lower than that of the ingot sample for the whole temperature range, which is the solid evidence showing the effect of grain boundaries on phonon scattering.

In summary, enhancement in ZT of p-type half-Heusler alloys was achieved. The average grain size of 100-200 nm of the hot pressed bulk samples is much larger than the 5-10 nm particle size of the ball milled precursor nanopowders, which is why the lattice thermal conductivity is still relatively high. If the grain size of the original nanopowders is preserved, such as with a grain growth inhibitor, a lower thermal conductivity and thus a much higher ZT can be expected. Besides boundary scattering, minor dopants, such as the Group VIA elements in the Periodic Table (e.g., S, Se, Te) on the Sb site, or the Group IVA elements (e.g., C, Si, Ge, Pb) on the Sn site, or the alloying or substituting of the Co or Ni with other transition metal elements (e.g., Fe, Cu, etc.), may also be introduced to enhance the alloy scattering, provided that they do not deteriorate the electronic properties. The ZT values are very reproducible within 5% from run to run on more than 10 samples made under similar conditions.

Figure 12:
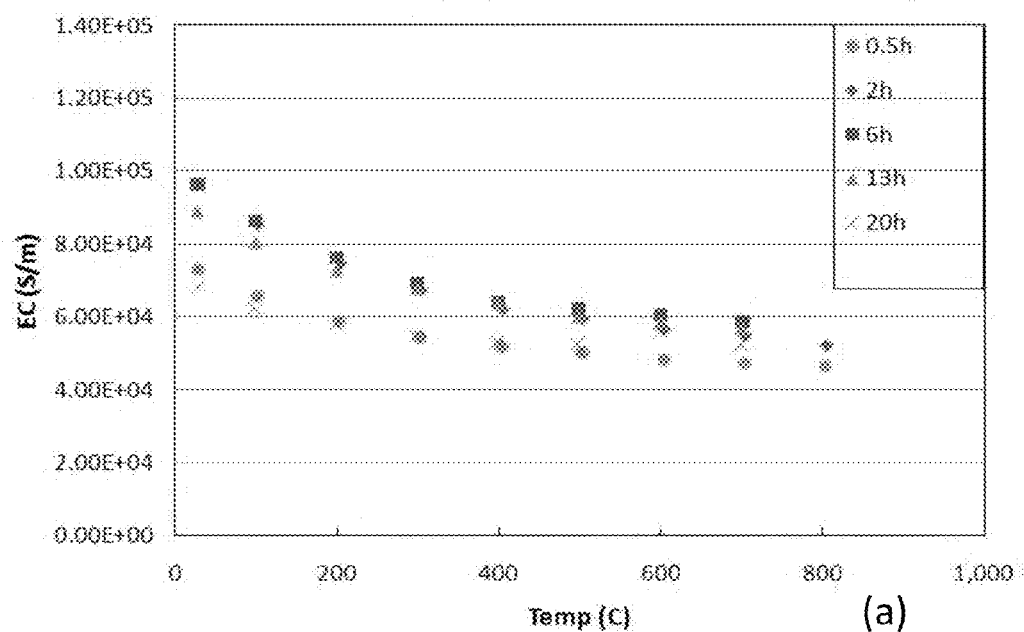
FIG. 12 illustrates the effect of bill milling time on the temperature-dependent (a) electrical conductivity, (b) Seebeck coefficient, (c) power factor, (d) total thermal conductivity, (e) lattice part of thermal conductivity, and (f) ZT of ball milled and hot pressed $Hf_{0.5}Zr_{0.5}CoSb_{0.8}Sn_{0.2}$.
Figure 12:
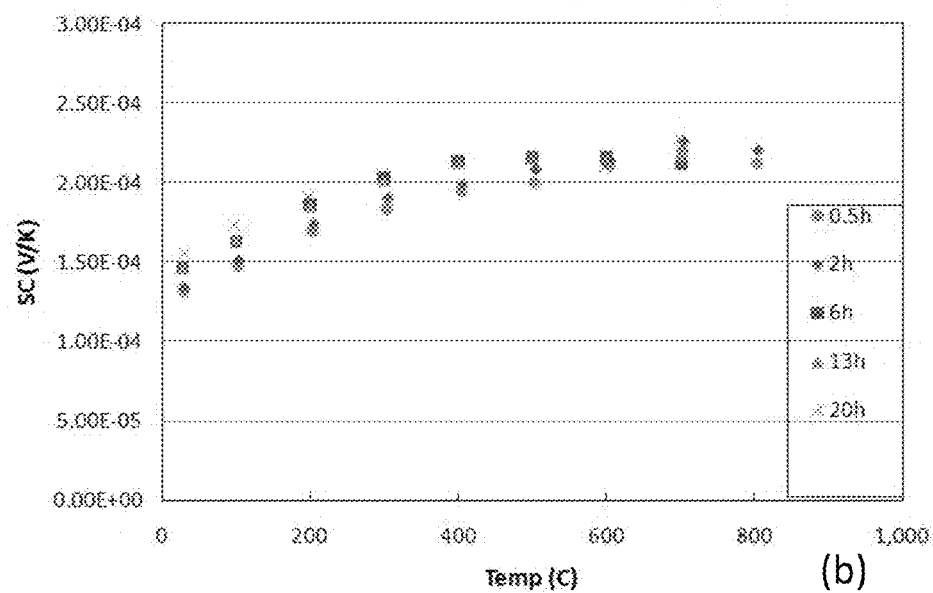
Figure 12:
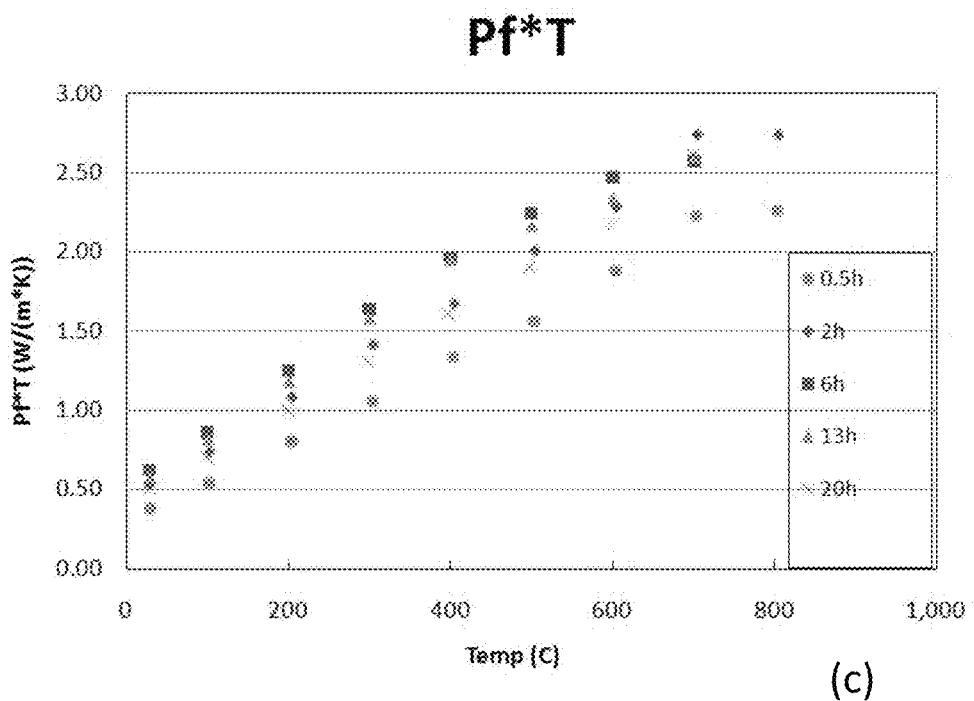
Figure 12:
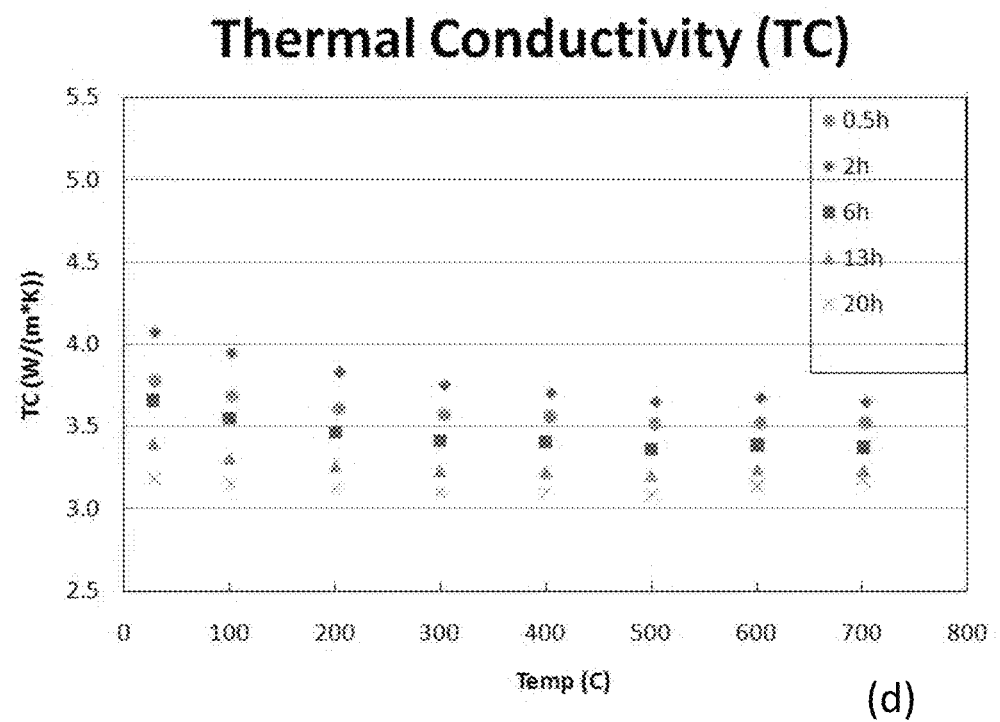
Figure 12:
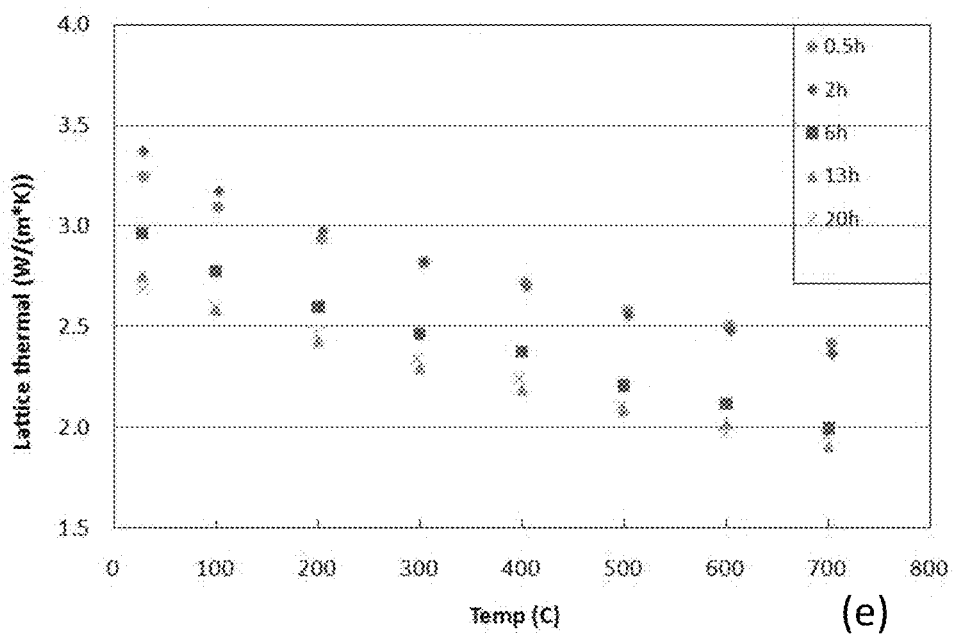
Figure 12:
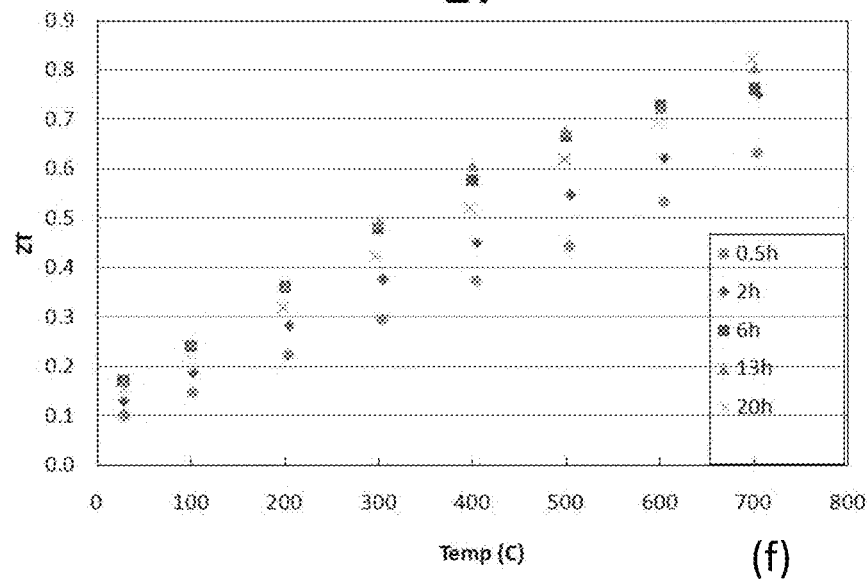

FIG. 12 illustrates the effect of bill mill time on the temperature-dependent (a) electrical conductivity, (b) Seebeck coefficient, (c) power factor, (d) total thermal conductivity, (e) lattice part of thermal conductivity, and (f) ZT of ball milled and hot pressed $Hf_{0.5}Zr_{0.5}CoSb_{0.8}Sn_{0.2}$. Samples were ball milled for 0.5, 2, 6, 13 and 20 hours shown by the circle, diamond, square, triangle and "x" symbols, respectively, in FIG. 12. TEM and SEM analysis verified that increasing ball mill time resulted in smaller size nanoparticles and increases in ZT.

Therefore, as shown in FIGS. 10 and 12, for the p-type thermoelectric material, the figure of merit, ZT, is greater than 0.5 at a temperature greater than 400° C., such 0.5 to 0.82 in a temperature range of 400 to 700° C. For example, ZT is greater than 0.6 at a temperature greater than or equal to 500° C., such as such 0.6 to 0.82 in a temperature range of 500 to 700° C. ZT is greater than 0.7 at a temperature greater than or equal to 600° C., such as such 0.7 to 0.82 in a temperature range of 600 to 700° C. ZT is equal to or greater than 0.8 (e.g., 0.8 to 0.82) at a temperature of 700° C. Thus, for example, the improvement of ZT at 700° C. is greater than 60% (0.5 to 0.8).

Preferred Embodiments

The inventors have discovered that replacing Hf with Ti in n-type half Heusler thermoelectric materials lowers the thermal conductivity and raises the figure of merit. Additionally, the inventors have discovered that replacing Zr with Ti in p-type half Heusler thermoelectric materials lowers the thermal conductivity of these materials and raises the figure of merit. The following are examples of methods and thermoelectric materials of these embodiments. These examples are illustrative and not meant to be limiting.

n-Type Half-Heusler Materials

The effect of titanium partial substitution for hafnium on thermoelectric properties of hafnium and zirconium-based n-type half-Heuslers have been studied by using a nanocomposite approach. A peak ZT of 1.0 is observed at 500° C. in samples with a composition of $Hf_{0.5}Zr_{0.25}Ti_{0.25}NiSn_{0.99}Sb_{0.01}$. The ZT values of $Hf_{0.5}Zr_{0.25}Ti_{0.25}NiSn_{0.99}Sb_{001}$ are significantly higher than those of $Hf_{0.75}Zr_{0.25}NiSn_{0.99}Sb_{0.01}$ at lower temperatures, which is very much desired for mid-range temperature applications such as waste heat recovery in car exhaust systems.

Significant improvements in ZT are found at lower temperatures, such as less than 750° C., such as 300-750° C., such as 400-600° C., with a peak ZT of 1.0 at 500° C. in (Hf, Zr, Ti) based n-type nanostructured HHs by using the cost-effective and mass-producible nanocomposite approach. The ZT improvement at lower temperatures and the shift in peak ZT benefits from the change in carrier concentration caused by the partial substitution of Ti for Hf.

Even though the peak ZT remains comparable with the previously reported results, the shift in the peak of ZT values toward lower temperatures (e.g., the ZT peak is located between 400 and 600° C., such as about 500° C. and is greater than 0.9 in this temperature range) is desirable for medium temperature applications such as waste heat recovery in vehicles. These nanostructured samples are prepared by dc hot pressing the ball milled nanopowders of an ingot which is initially made by arc melting process. These nanostructured samples comprise polycrystalline grains of sizes ranging from 200 nm and up with random orientations.

Experimental

Nanostructured half-Heusler phases were prepared by melting hafnium (Hf) (99.99%, Alfa Aesar), titanium (Ti) (99.99%, Alfa Aesar), and zirconium (Zr) (99.99%, Alfa Aesar) chunks with nickel (Ni) (99.99%, Alfa Aesar), tin (Sn) (99.99%, Alfa Aesar), and antimony (Sb) (99.99%, Alfa Aesar) pieces according to the required composition (Hf, Ti, Zr)Ni(Sn, Sb) using arc melting process. Then the melted ingot was ball milled for 5-20 hours to get the desired nanopowders. The mechanically prepared nanopowders were then pressed at temperatures of 1000-1050° C. by a dc hot pressing method in graphite dies with a 12.7 mm central cylindrical opening diameter to get bulk nanostructured half-Heusler samples.

The samples were characterized by X-ray diffraction (XRD) and transmission electron microscopy (TEM) to study their crystallinity, composition, homogeneity, the average grain size, and grain size distribution of the nano particles. These parameters affect the thermoelectric properties of the final dense bulk samples. The volumetric mass densities of these samples were measured using an Archimedes' kit.

The nanostructured bulk samples were then cut into 2 mm×2 mm×12 mm bars for electrical conductivity and Seebeck coefficient measurements, 12.7 mm diameter discs with appropriate thickness for thermal diffusivity and Hall coefficient measurements, and 6 mm diameter discs with appropriate thickness for specific heat capacity measurements. The electrical conductivity and Seebeck coefficient were measured by commercial equipment (ZEM-3, Ulvac), the thermal diffusivity was measured by a laser flash system (LFA 457, Netzsch) from room temperature to 700° C., the carrier concentration and mobility at room temperature were tested from Hall measurements, and the specific heat capacity was measured on a differential scanning calorimeter (200-F3, Netzsch Instruments, Inc.). The thermal conductivity was calculated as the product of the thermal diffusivity, specific heat capacity, and volumetric density of the samples. The volumetric densities are 9.73, 9.01, 8.17, and 7.74 gcm$^{-3}$ for $Hf_{0.75-x}Ti_xZr_{0.25}NiSn_{0.99}Sb_{0.01}$ with x=0, 0.25, 0.5, and 0.65, respectively.

Results and Analyses

Figure 13:
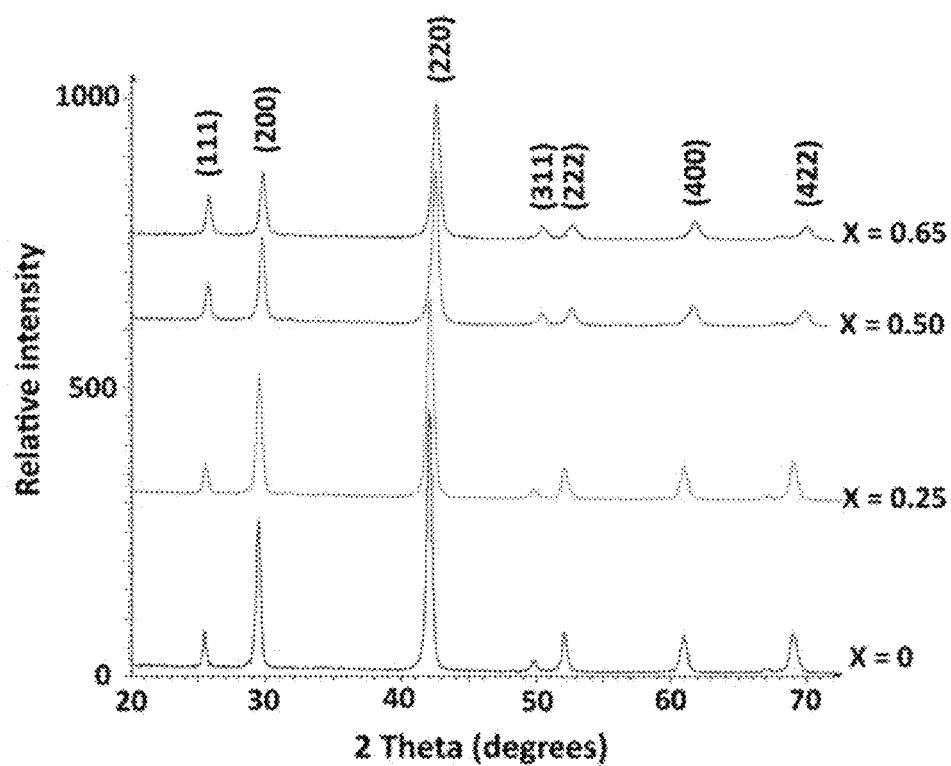
FIG. 13 illustrates XRD patterns of samples of $Hf_{0.75-x}Ti_xZr_{0.25}NiSn_{0.99}Sb_{0.01}$ (x=0, 0.25, 0.5, and 0.65).

The results for the temperature dependent thermoelectric properties for n-type half-Heusler phase of compositions $Hf_{0.75-x}Ti_xZr_{0.25}NiSn_{0.99}Sb_{0.01}$ (x=0, 0.25, 0.5, and 0.65) are illustrated in FIGS. 13-16. FIG. 13 shows the XRD patterns of the arc melted and ball milled samples of $Hf_{0.75-x}Ti_xZr_{0.25}NiSn_{0.99}Sb_{0.01}$ (x=0, 0.25, 0.5, and 0.65) compositions. The XRD patterns of all compositions are similar and well matched with those obtained for half-Heusler phases showing good quality of the sample for better thermoelectric properties.

Figure 14:
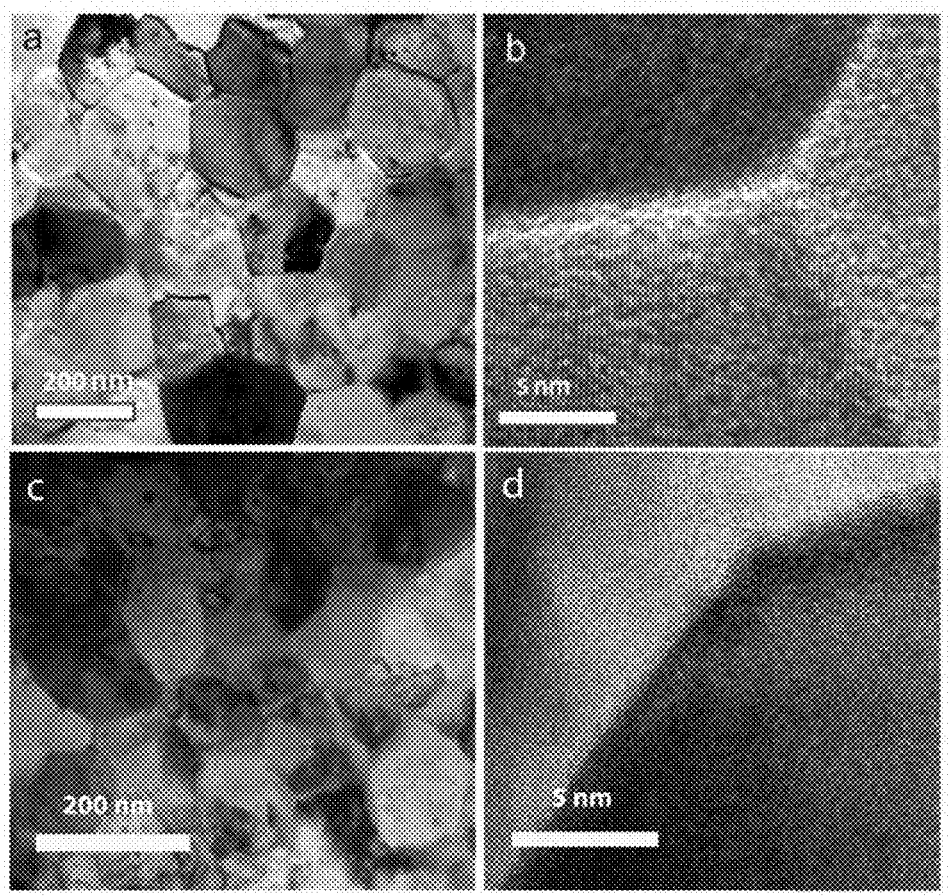
FIG. 14 illustrates TEM images of samples of $Hf_{0.75}Zr_{0.25}NiSn_{0.99}Sb_{0.01}$ (FIGS. 14a & b) and $Hf_{0.5}Ti_{0.25}Zr_{0.25}NiSn_{0.99}Sb_{0.01}$ (FIGS. 14c & d).

FIG. 14 shows TEM images of the arc melted and ball milled samples of $Hf_{0.75}Zr_{0.25}NiSn_{0.99}Sb_{0.01}$ (FIGS. 14a and 14b) and $Hf_{0.5}Ti_{0.25}Zr_{0.25}NiSn_{0.99}Sb_{0.01}$ (FIGS. 14c and 14d) compositions. FIGS. 14a-14d clearly show that the ball milled and hot-pressed samples of both $Hf_{0.75}Zr_{0.25}NiSn_{0.99}Sb_{0.01}$ (FIG. 14a) and $Hf_{0.5}Ti_{0.25}Zr_{0.25}NiSn_{0.99}Sb_{0.01}$ compositions (FIG. 14c) contains the grains of around 200-300 nm sizes showing no difference in grain size due to Ti substitution. FIG. 14 also shows that the grain boundaries and crystallinity of both samples are similar (FIGS. 14b and 14d).

Figure 15:
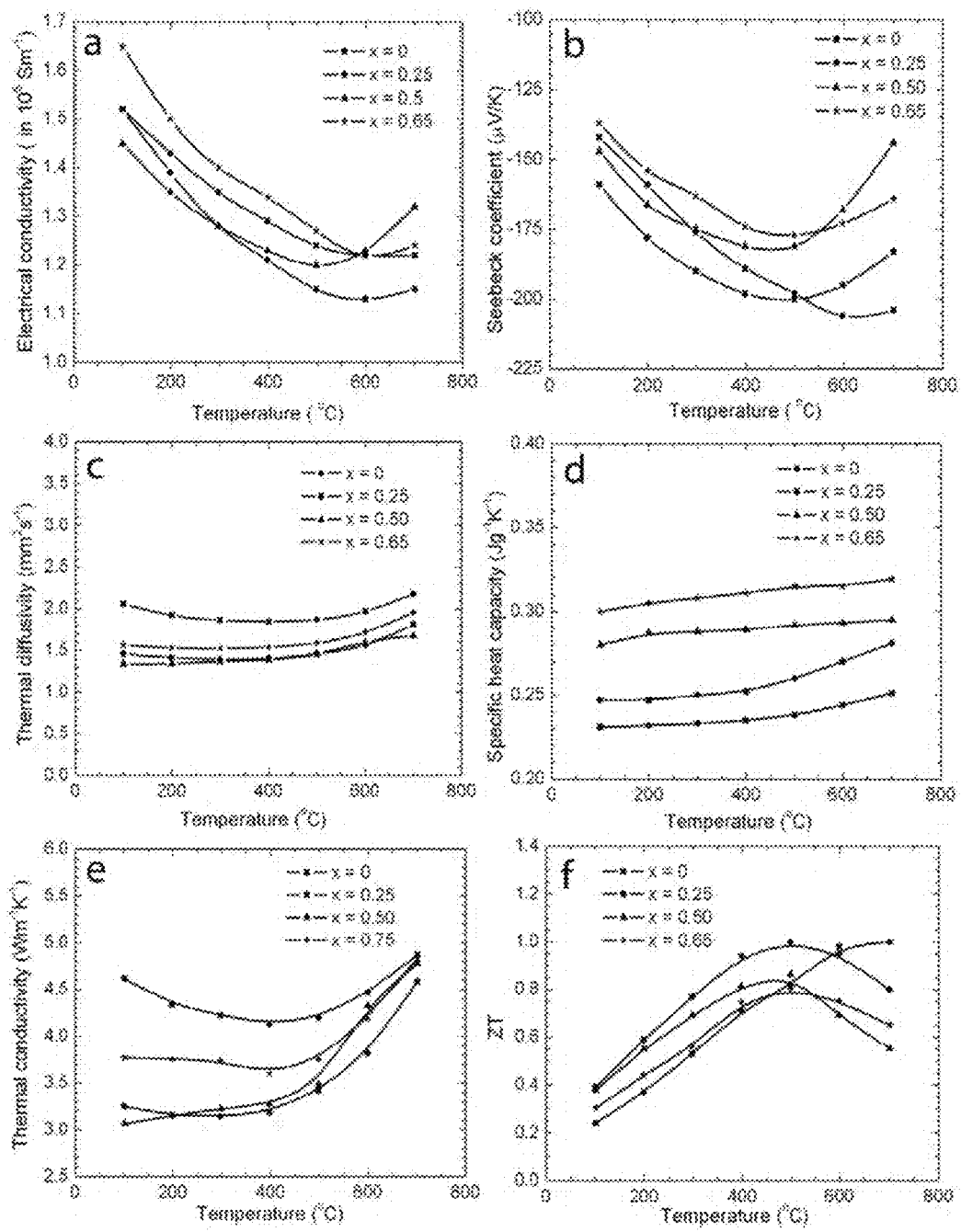
FIG. 15 illustrates (a) temperature dependent electrical conductivity, (b) Seebeck coefficient, (c) thermal diffusivity, (d) specific heat capacity, (e) thermal conductivity, and (f) ZT of nanostructured $Hf_{0.75-x}Ti_xZr_{0.25}NiSn_{0.99}Sb_{0.01}$ (x=0.25, 0.5, and 0.65) in comparison to previously reported (Hf, Zr)-based best n-type half-Heusler $Hf_{0.75}Zr_{0.25}NiSn_{0.99}Sb_{0.01}$.

FIG. 15 show the temperature dependent electrical conductivity (FIG. 15a), Seebeck coefficient (FIG. 15b), thermal diffusivity (FIG. 15c), specific heat capacity (FIG. 15d), thermal conductivity (FIG. 15e), and ZT (FIG. 15f) of nanostructured $Hf_{0.75-x}Ti_xZr_{0.25}NiSn_{0.99}Sb_{0.01}$ (x=0.25, 0.5, and 0.65) compositions in comparison to the previously reported (Hf, Zr) based best n-type half-Heusler composition ($Hf_{0.75}Zr_{0.25}NiSn_{0.99}Sb_{0.01}$) prepared through arc melting and ball milling process. FIGS. 15a and 15b clearly show that the electrical resistivity and Seebeck coefficient increase a little bit and then decrease with the increase of Ti concentration. However, the thermal diffusivity of Ti substituted samples [$Hf_{0.75-x}Ti_xZr_{0.25}NiSn_{0.99}Sb_{0.01}$ (x=0.25, 0.5, and 0.65)] is significantly lower than those of $Hf_{0.75}Zr_{0.25}NiSn_{0.99}Sb_{0.01}$ composition (FIG. 15c) showing alloy scattering effect. Since, the specific heat capacity increases with increasing Ti content (FIG. 15d) due to lower atomic mass, the thermal conductivity of Ti substituted samples decreases at lower temperatures in comparison to $Hf_{0.75}Zr_{0.25}NiSn_{0.99}Sb_{0.01}$ sample (FIG. 15e). As a result, the ZT values are improved at lower temperatures with a peak ZT of 1.0 at 500° C. in $Hf_{0.5}Ti_{0.25}Zr_{0.25}NiSn_{0.99}Sb_{0.01}$ composition in comparison to the previously reported (Hf, Zr) based best n-type half-Heusler composition ($Hf_{0.75}Zr_{0.25}NiSn_{0.99}Sb_{0.01}$) (FIG. 2f). The improvement in ZT at lower temperatures could be beneficial for medium temperature applications such as waste heat recovery in vehicles.

Figure 16:
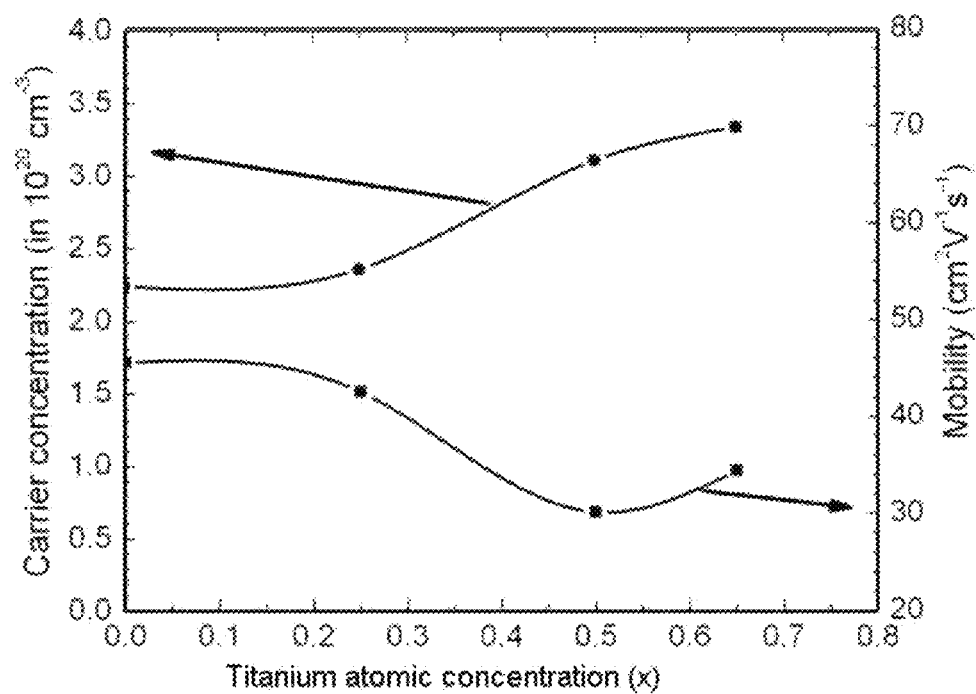
FIG. 16 illustrates carrier concentration and mobility of nanostructured $Hf_{0.75-x}Ti_xZr_{0.25}NiSn_{0.99}Sb_{0.01}$ (x=0, 0.25, 0.5, and 0.65) at room temperature.

FIG. 16 shows the room temperature carrier concentration and mobility of nanostructured $Hf_{0.75-x}Ti_xZr_{0.25}NiSn_{0.99}Sb_{0.01}$ (x=0.25, 0.5, and 0.65) compositions. FIG. 16 clearly shows that the behaviors of electrical conductivity (FIG. 15a) and Seebeck coefficient (FIG. 15b) in $Hf_{0.75-x}Ti_xZr_{0.25}NiSn_{0.99}Sb_{0.01}$ (x=0.25, 0.5, and 0.65) compositions are due to the increase in carrier concentration and decrease in mobility with the Ti concentration. The increase in carrier concentration with Ti concentration (FIG. 16) could be possibly due to the decrease in band gap after Ti substitution. It is clear that the carrier concentration in the range of (2-3)×10$^{20}$ cm$^{-3}$ is too high. Further optimization of the composition may improve the ZT much higher than 1. Therefore, the preferred composition of this embodiment is a half-Heusler material having a formula $Hf_{1-x-y}Zr_xTi_yNiSn_{1-z}Sb_z$, where 0≤x≤1, 0≤y≤1, 0≤z≤1, preferably, 0≤x≤0.5, 0≤y≤0.5, 0≤z≤0.2.

Thermoelectric properties of titanium, zirconium, and hafnium (Ti, Zr, Hf) based n-type half-Heuslers have been studied by using a cost effective nanocomposite approach, and a peak ZT of 1.0 is observed at 500° C. in nanostructured $Hf_{0.5}Zr_{0.25}Ti_{0.25}NiSn_{0.99}Sb_{0.01}$ composition. The nanostructured samples are initially prepared by ball milling and hot pressing of arc melted samples. The peak ZT value did not increase but the ZT values are improved at lower temperatures. The improved ZT at lower temperatures could be significant for medium temperature applications such as waste heat recovery.

p-Type Half-Heusler Materials

High lattice thermal conductivity has been the bottleneck for further improvement of thermoelectric figure-of-merit (ZT) of half-Heuslers (HHs) $Hf_{1-x}Zr_xCoSb_{0.8}Sn_{0.2}$. Theoretically the high lattice thermal conductivity can be reduced by exploring larger differences in atomic mass and size in the crystal structure. This embodiment demonstrates that lower than ever reported thermal conductivity in p-type HHs can indeed be achieved when Ti is used to replace Zr, i.e., $Hf_{1-x}Ti_xCoSb_{0.8}Sn_{0.2}$, due to larger differences in atomic mass and size between Hf and Ti than Hf and Zr. The highest peak ZT of about 1.1 in the system $Hf_{1-x}Ti_xCoSb_{0.8}Sn_{0.2}$ (0.1≤x≤0.5; x=0.1, 0.2, 0.3, and 0.5) was achieved with x=0.2 at 800° C.

The investigation of the thermoelectric properties of $Hf_{1-x}Ti_xCoSb_{0.8}Sn_{0.2}$ (0.1≤x≤0.5; x=0.1, 0.2, 0.3, and 0.5) proves that $Hf_{0.8}Ti_{0.2}CoSb_{0.8}Sn_{0.2}$ has indeed the lowest thermal conductivity 2.7 Wm$^{-1}$K$^{-1}$ leading to the highest ZT of greater than 1, such as about 1.1 at 800° C. due to the strong phonon scattering without too much penalty on the power factor.

Methods

Alloyed ingots with compositions $Hf_{1-x}Ti_xCoSb_{0.8}Sn_{0.2}$ (x=0.1, 0.2, 0.3, and 0.5) were first formed by arc melting a mixture of appropriate amount of individual elements according to the stoichiometry. Then the ingot was loaded into a ball milling jar with grinding balls inside an argon-filled glove box and then subjected to a mechanical ball-milling process to make nanopowders. Finally bulk samples were obtained by consolidating the nanopowders into pellets with a diameter of 12.7 mm, using the direct current induced hot-press method. X-ray diffraction (XRD) (PANalytical X'Pert Pro) analysis with a wavelength of 0.154 nm (Cu Kα) was performed on as-pressed samples with different Hf/Ti ratios. The freshly fractured surface of as-pressed $Hf_{0.8}Ti_{0.2}CoSb_{0.8}Sn_{0.2}$ samples was observed by scanning electron microscope (SEM) (JEOL) and transmission electron microscope (TEM).

To measure the thermoelectric properties of bulk samples, bars of about 2×2×12 mm and disks of 12.7 mm in diameter and 2 mm in thickness were made. The bar samples were used to measure the electrical conductivity and Seebeck coefficient on a commercial equipment (ULVAC, ZEM3). The disk samples were used to obtain the thermal conductivity, which is calculated as the product of thermal diffusivity, specific heat, and volumetric density. The volumetric density was measured using an Archimedes' kit. The specific heat was determined by a High-Temperature DSC instrument (404C, Netzsch Instruments, Inc.). The thermal diffusivity was measured using laser flash system (LFA 457 Nanoflash, Netzsch Instruments, Inc.). The uncertainties are 3% for electrical conductivity, thermal diffusivity, and specific heat, and 5% for the Seebeck coefficient, leading to an 11% uncertainty in ZT.

The experiments were repeated several times and confirmed that the peak ZT values were reproducible within experimental errors. Additionally, the same sample was measured up to 800° C. again after the first measurement and found that there was no degradation in both individual properties and the ZTs.

Results and Discussions

Figure 17:
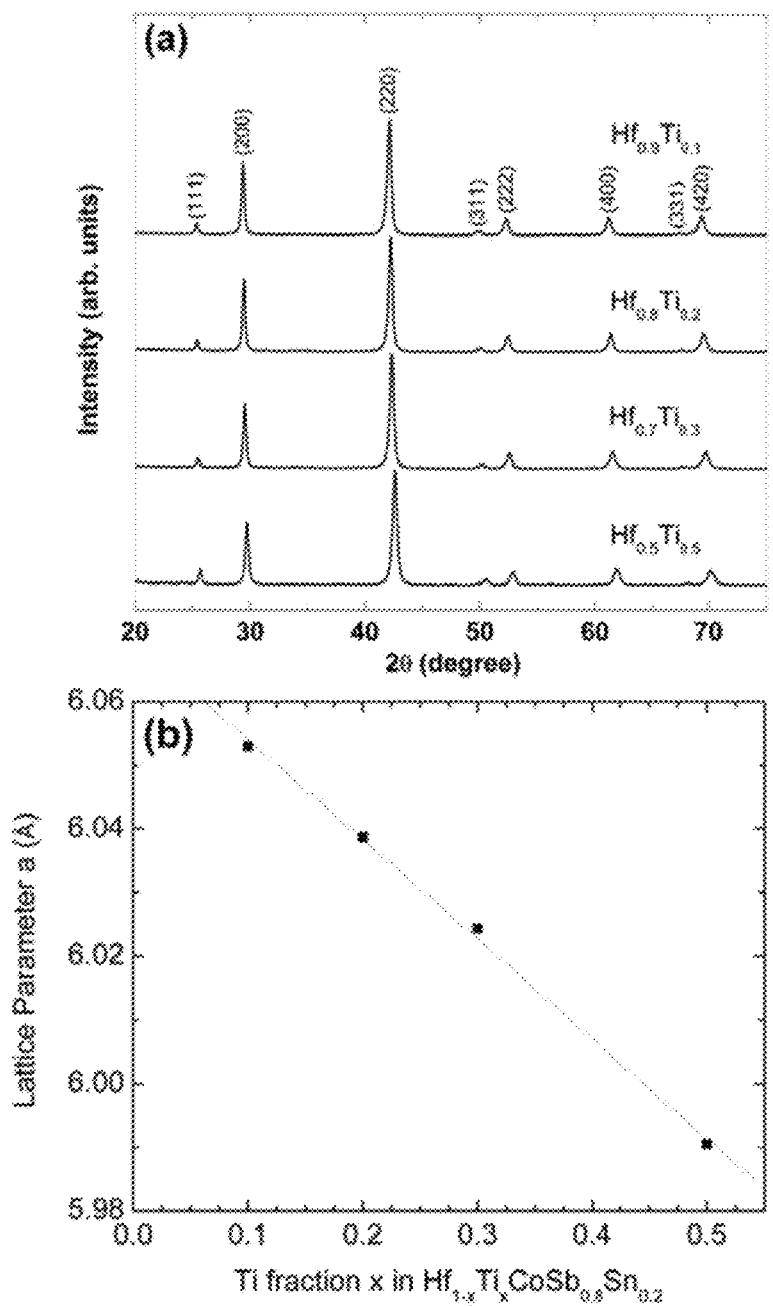
FIG. 17 illustrates (a) XRD patterns and (b) lattice parameters extracted from XRD patterns of as-pressed $Hf_{1-x}Ti_xCoSb_{0.8}Sn_{0.2}$ (x=0.1, 0.2, 0.3 and 0.5) samples.

FIG. 17a shows the XRD patterns of the as-pressed $Hf_{1-x}Ti_xCoSb_{0.8}Sn_{0.2}$ (x=0.1, 0.2, 0.3, and 0.5) samples. The diffraction peaks of all samples are well-matched with those of half-Heusler phases. No noticeable impurity phases are observed. A close scrutiny reveals that XRD peaks shift towards higher angles with increasing Ti, suggesting that Ti replace the Hf to form alloys. The lattice parameters a of all samples has been estimated with different Hf/Ti ratios and plotted the results with respect to Ti fraction x in FIG. 17b. As expected, the lattice parameter decreases linearly with increasing Ti, following the Vegard's law.

Figure 18:
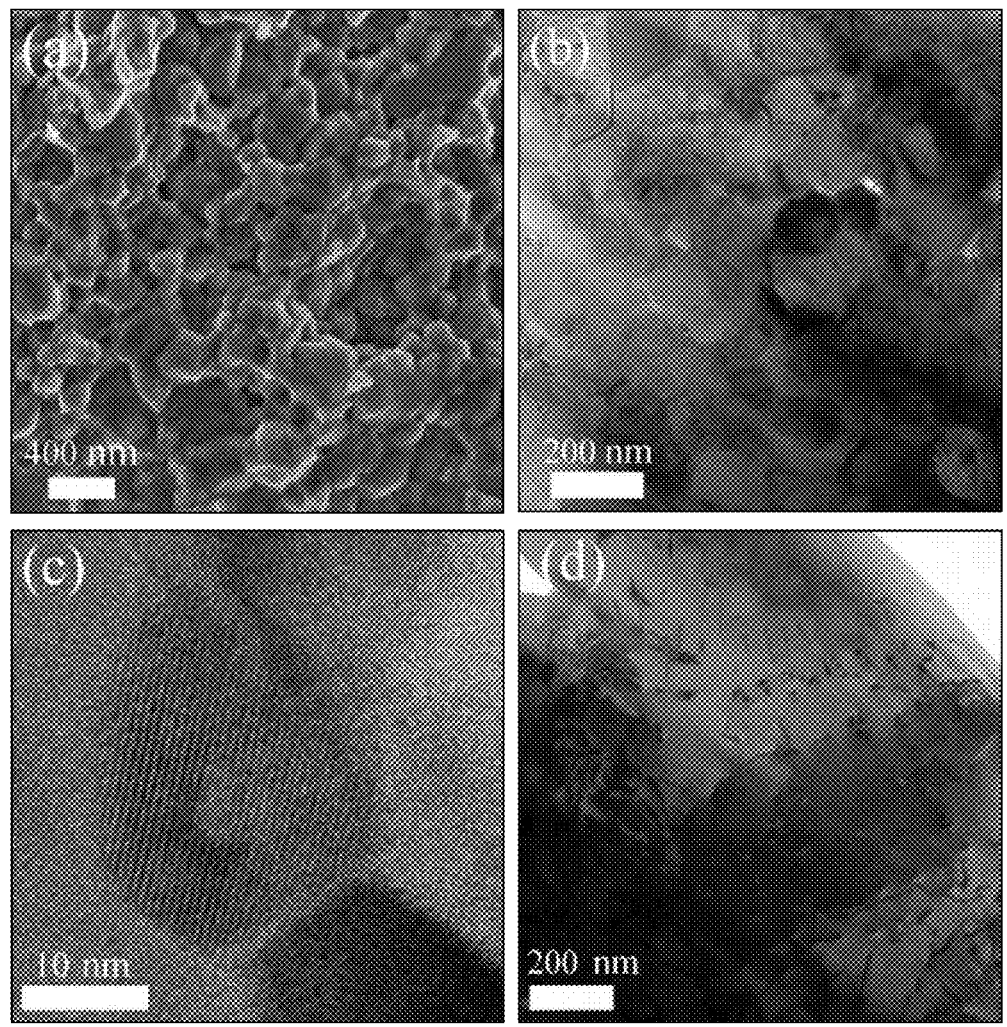
FIG. 18 illustrates (a) SEM image and (b-d) TEM images of as-pressed $Hf_{0.8}Ti_{0.2}CoSb_{0.8}Sn_{0.2}$ sample.

The SEM image of the as-pressed $Hf_{0.8}Ti_{0.2}CoSb_{0.8}Sn_{0.2}$ sample is displayed in FIG. 18a, where the grain sizes are in the range of 50-300 nm with an estimated average size about 100-200 nm. The TEM image (FIG. 18b) confirms the average grain size observed from the SEM image, which is ~200 nm and below. FIG. 18c shows two nanodots sitting on the grain boundaries. These nanodots are commonly observed inside the samples. One feature pertaining to the samples is that dislocations are also common, as shown in FIG. 18d. The origin of the dislocations is still under investigation. The small grains, nanodots, and dislocations are all favorable for a low lattice thermal conductivity due to enhanced phonon scattering.

Figure 19:
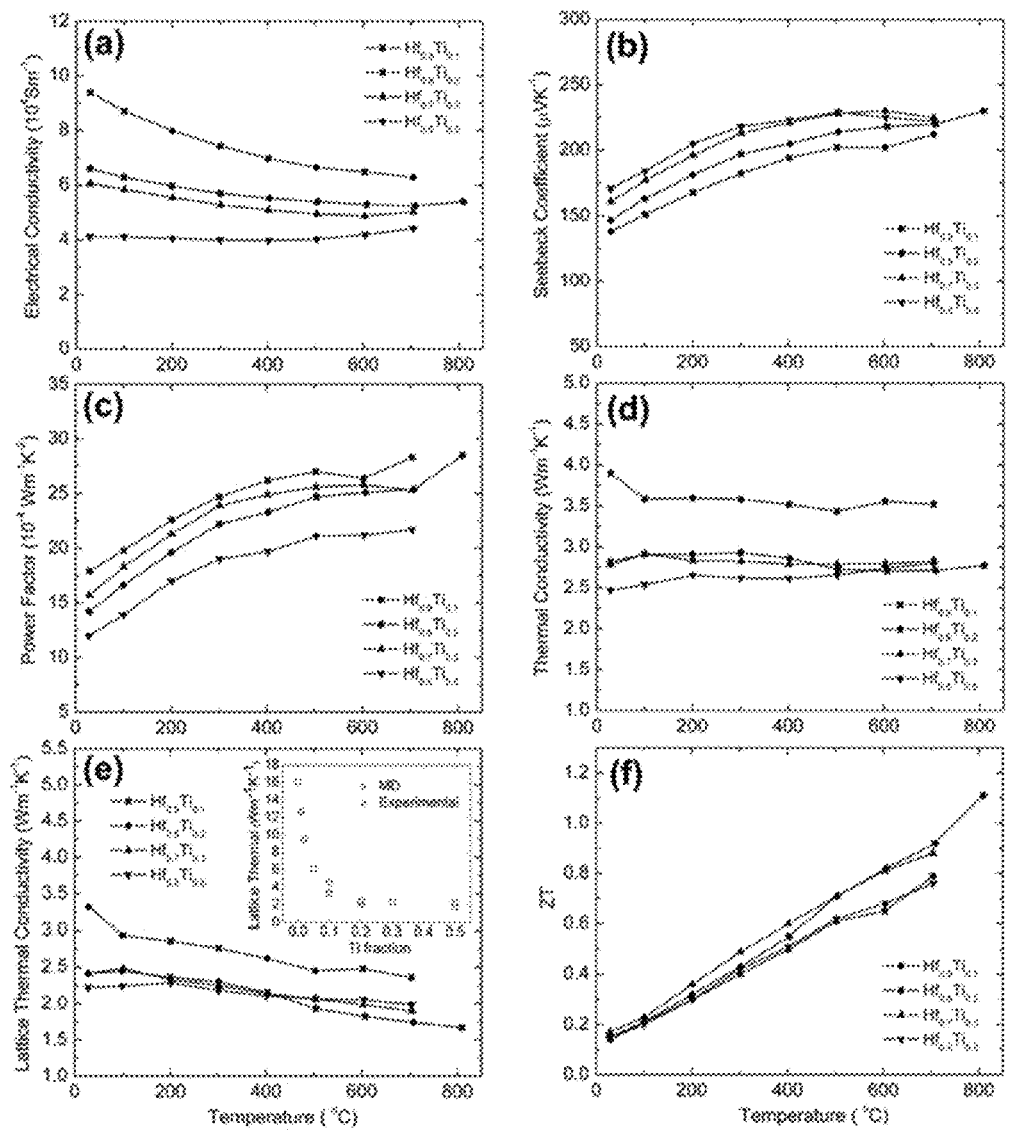
FIG. 19 illustrates the temperature-dependent (a) electrical conductivity, (b) Seebeck coefficient, (c) power factor, (d) thermal conductivity, (e) lattice thermal conductivity, and (f) ZT of $Hf_{1-x}Ti_xCoSb_{0.8}Sn_{0.2}$ (x=0.1, 0.2, 0.3 and 0.5) samples. The lattice thermal conductivities of $Hf_{1-x}Ti_xCoSb_{0.8}Sn_{0.2}$ (x=0.1, 0.2, 0.3 and 0.5) samples at room temperature are plotted in comparison with molecular dynamics (MD) calculations on $Hf_{1-x}Ti_xCoSb$ in the inset of FIG. 19e.

FIG. 19 shows the temperature-dependent thermoelectric (TE) properties of $Hf_{1-x}Ti_xCoSb_{0.8}Sn_{0.2}$ (x=0.1, 0.2, 0.3, and 0.5) samples. All these samples have been made by ball milling the as-arc-melted ingot using the same ball milling time and hot pressing conditions. The electrical conductivities are plotted in FIG. 19a, where electrical conductivity decreases with increasing Ti for the whole temperature range. In addition, bipolar effect starts to take place at lower temperatures when Ti changes from 0.1 to 0.5. The Seebeck coefficient follows roughly the trend of increasing with increasing of Ti, opposite to the trend of electrical conductivity (FIG. 19b). Meanwhile, the differences in Seebeck coefficients among various compositions are diminished at elevated temperatures. FIG. 19c demonstrates the temperature-dependent power factor. $Hf_{0.9}Ti_{0.1}CoSb_{0.8}Sn_{0.2}$ has the highest power factor whereas $Hf_{0.5}Ti_{0.5}CoSb_{0.8}Sn_{0.2}$ has the lowest power factor for the whole temperature range. Benefiting from weaker bipolar effect, the power factor of $Hf_{0.8}Ti_{0.2}CoSb_{0.8}Sn_{0.2}$ increases steadily with respect to temperature and reaches as high as $28.5 \times 10^{-4}$ $Wm^{-1}K^{-2}$ at 800° C.

FIG. 19d shows the temperature-dependent total thermal conductivity of $Hf_{1-x}Ti_xCoSb_{0.8}Sn_{0.2}$ (x=0.1, 0.2, 0.3, and 0.5) samples. For the whole temperature range, thermal conductivities of $Hf_{0.8}Ti_{0.2}CoSb_{0.8}Sn_{0.2}$, $Hf_{0.2}Ti_{0.3}CoSb_{0.8}Sn_{0.2}$, and $Hf_{0.5}Ti_{0.5}CoSb_{0.8}Sn_{0.2}$ samples are similar with each other and much lower than that of $Hf_{0.9}Ti_{0.1}CoSb_{0.8}Sn_{0.2}$. The thermal conductivity of $Hf_{0.8}Ti_{0.2}CoSb_{0.8}Sn_{0.2}$ changes very little with increasing temperature and the minimum value is 2.7 $Wm^{-1}K^{-1}$, the lowest achieved in p-type half-Heusler system. To get a clear view of how Hf/Ti ratio affects the lattice heat transport, the lattice thermal conductivity ($\kappa_l$) was estimated by subtracting both the electronic contribution ($\kappa_e$) ($\kappa_{bipolar}$) and the bipolar contribution (from the total thermal conductivity ($\kappa_e$) while $\kappa_e$ was obtained using the Wiedemann-Franz law. The Lorenz number was calculated from the reduced Fermi energy, which was estimated from the Seebeck coefficient at room temperature and the two band theory. Similar with the total thermal conductivity, lattice thermal conductivities of $Hf_{0.8}Ti_{0.2}CoSb_{0.8}Sn_{0.2}$, $Hf_{0.7}Ti_{0.3}CoSb_{0.8}Sn_{0.2}$, and $Hf_{0.5}Ti_{0.5}CoSb_{0.8}Sn_{0.2}$ samples are similar with each other and much lower than that of $Hf_{0.9}Ti_{0.1}CoSb_{0.8}Sn_{0.2}$ (FIG. 19e). A close look indicates that the lattice thermal conductivity of $Hf_{0.8}Ti_{0.2}CoSb_{0.8}Sn_{0.2}$ is the lowest at temperatures above 400° C., which may be due to some underestimates of the bipolar thermal conductivities for both $Hf_{0.7}Ti_{0.3}CoSb_{0.8}Sn_{0.2}$ and $Hf_{0.5}Ti_{0.5}CoSb_{0.8}Sn_{0.2}$ at elevated temperatures. As Ti is gradually introduced into $HfCoSb_{0.8}Sn_{0.2}$ system, lattice thermal conductivity experiences a sharp suppression from x=0.1 to x=0.2 and then becomes almost saturated above x=0.2. The theoretical calculations on $Hf_{1-x}Ti_xCoSb$ using molecular dynamics (MD) simulations via the harmonic and cubic force interatomic constants obtained from first principles calculations predicted such thermal conductivity decrease. The lattice thermal conductivities of $Hf_{1-x}Ti_xCoSb_{0.8}Sn_{0.2}$ (x=0.1, 0.2, 0.3, and 0.5) samples at room temperature are plotted in the inset of FIG. 19e in comparison with the calculations. It is very encouraging to see that our experimental data and the theoretical calculations are in very good agreement.

Because of the low thermal conductivity and high power factor achieved by partially substituting Hf with Ti, ZT of $Hf_{0.8}Ti_{0.2}CoSb_{0.8}Sn_{0.2}$ reached 1.1 at 800° C. and 0.9 at 700° C. (FIG. 19f), the highest ever reported value for p-type half-Heuslers, showing great promise for p-type material as an option in high temperature applications. For the first time, p-type half-Heusler materials have ZT above 1, the minimum ZT to be considered for real applications.

Figure 20:
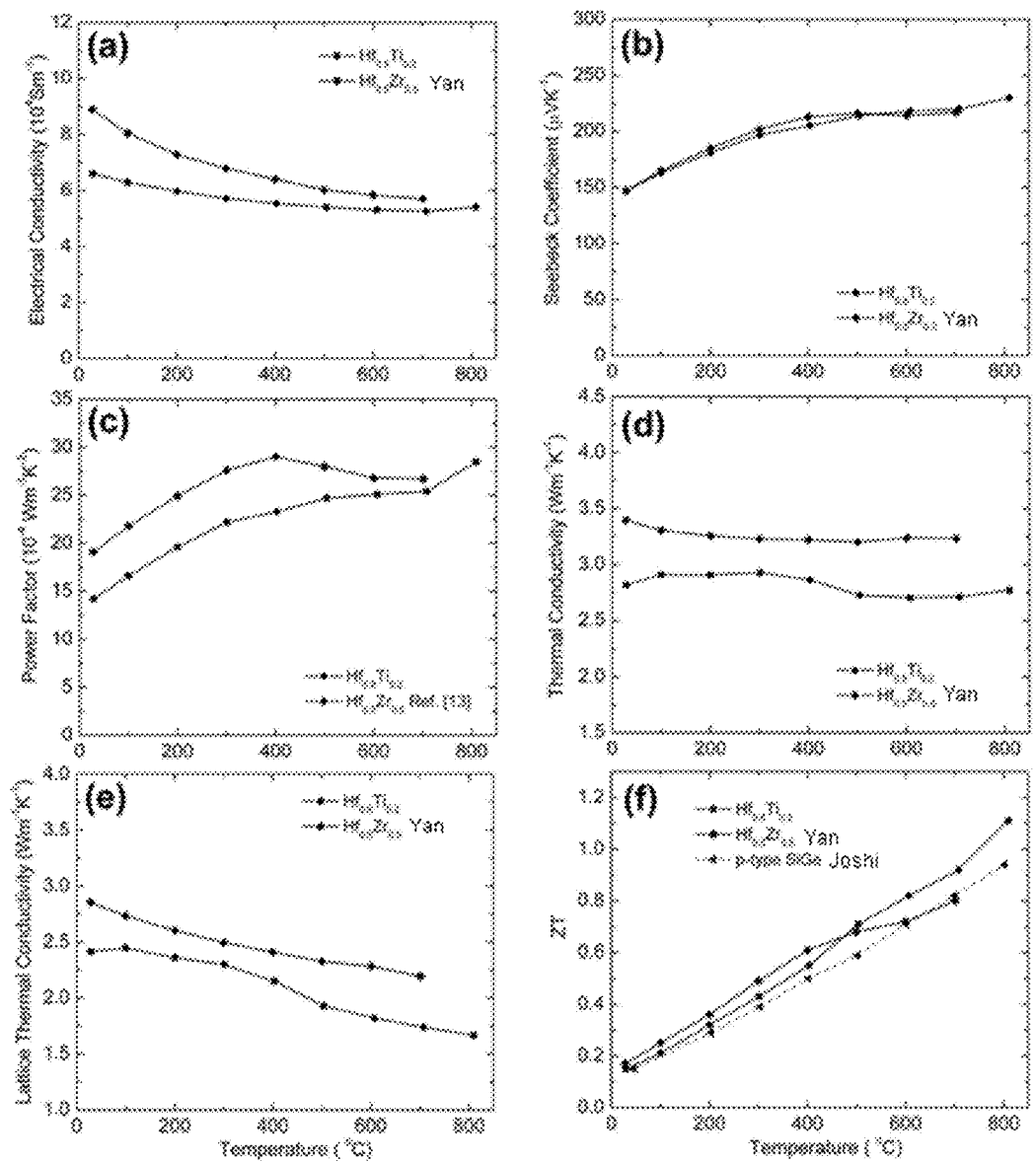
FIG. 20 illustrates the temperature-dependent (a) electrical conductivity, (b) Seebeck coefficient, (c) power factor, (d) thermal conductivity, (e) lattice thermal conductivity, and (f) ZT of $Hf_{0.8}Ti_{0.2}CoSb_{0.8}Sn_{0.2}$ and $Hf_{0.5}Zr_{0.5}CoSb_{0.8}Sn_{0.2}$. The ZT of p-type SiGe is also included in FIG. 20f for comparison.

In order to have an intuitive view of how large differences in atomic mass and size affect individual TE properties as well as ZT, the temperature-dependent TE properties of nanostructured bulk sample $Hf_{0.8}Ti_{0.2}CoSb_{0.8}Sn_{0.2}$ in comparison with that of $Hf_{0.5}Zr_{0.5}CoSb_{0.8}Sn_{0.2}$ described in X. Yan et al., Nano Lett. 11, 556-560 (2011) are plotted in FIG. 20. Both samples have been subjected to the same ball milling and hot pressing conditions to minimize the size effect on the transport properties. The electrical conductivity of $Hf_{0.5}Zr_{0.5}CoSb_{0.8}Sn_{0.2}$ is higher than that of $Hf_{0.8}Ti_{0.2}CoSb_{0.8}Sn_{0.2}$ for the whole temperature range and the difference becomes smaller with increasing temperature (FIG. 20a). In contrast, the Seebeck coefficient of $Hf_{0.8}Ti_{0.2}CoSb_{0.8}Sn_{0.2}$ is almost the same with that of $Hf_{0.5}Zr_{0.5}CoSb_{0.8}Sn_{0.2}$ for all the temperatures (FIG. 20b). As a result of the reduced electrical conductivity, the power factor of $Hf_{0.8}Ti_{0.2}CoSb_{0.8}Sn_{0.2}$ is lower than that of $Hf_{0.5}Zr_{0.5}CoSb_{0.8}Sn_{0.2}$ from 100° C. to 700° C. (FIG. 20c). However, this reduced power factor is compensated by the much reduced thermal conductivity (FIG. 20d), which yields an enhanced ZT especially at higher temperatures (FIG. 20f). The total thermal conductivity of $Hf_{0.8}Ti_{0.2}CoSb_{0.8}Sn_{0.2}$ is ~17% lower than that of $Hf_{0.5}Zr_{0.5}CoSb_{0.8}Sn_{0.2}$ (FIG. 20d), indicating that the combination of Hf and Ti is more effective in reducing thermal conductivity than the combination of Hf and Zr. The origin of the thermal conductivity reduction achieved in $Hf_{0.8}Ti_{0.2}CoSb_{0.8}Sn_{0.2}$ in comparison with $Hf_{0.5}Zr_{0.5}CoSb_{0.8}Sn_{0.2}$ comes from two parts: electronic part and lattice part. Specifically, $\kappa_e$ of $Hf_{0.8}Ti_{0.2}CoSb_{0.8}Sn_{0.2}$ is about 6%-26% lower than that of $Hf_{0.5}Zr_{0.5}CoSb_{0.8}Sn_{0.2}$. The lattice thermal conductivity of $Hf_{0.8}Ti_{0.2}CoSb_{0.8}Sn_{0.2}$ is about 8-21% lower than that of $Hf_{0.5}Zr_{0.5}CoSb_{0.8}Sn_{0.2}$ (FIG. 20e), consistent with the effect of more thermal conductivity reduction by Hf and Ti combination in n-type half-Heusler system. The experimental results clearly show that thermal conductivity can be most effectively reduced in the combination of Hf and Ti, owing to the larger difference in atomic mass and size in the case of Hf and Ti combination. However, the lattice part still dominates the total thermal conductivity. If more alloy scattering and/or more boundary scattering by even smaller grains can be achieved, thermal conductivity is expected to be even more reduced. FIG. 20f clearly shows that the ZT of $Hf_{0.8}Ti_{0.2}CoSb_{0.8}Sn_{0.2}$ is comparable to that of $Hf_{0.5}Zr_{0.5}CoSb_{0.8}Sn_{0.2}$ at low temperatures and exceeds that of $Hf_{0.5}Zr_{0.5}CoSb_{0.8}Sn_{0.2}$ at temperatures above 500° C. (FIG. 20f), demonstrating great promise for high temperature applications. Data of p-type silicon germanium (SiGe) from G. Joshi et al., Nano Lett. 8, 4670 (2008), another promising p-type material for high temperature applications, are also included for comparison (FIG. 20f). $Hf_{0.8}Ti_{0.2}CoSb_{0.8}Sn_{0.2}$ has also cost advantages over SiGe due to the extremely high cost of Ge.

Although the binary $Hf_{1-x}Ti_xCoSb_{0.8}Sn_{0.2}$ composition has been optimized by tuning the Hf/Ti ratio and demonstrating the feasibility of thermal conductivity reduction and ZT enhancement, there still remains much room for further improvement. First, a ternary combination of Ti, Zr, and Hf at M site has given rise to higher ZT in n-type MNiSn system. However, there is little understanding about the influence of ternary combination of Ti, Zr, and Hf on the transport properties of p-type half-Heuslers, which deserves further investigation. Second, boundary scattering can be enhanced more by preserving nanosize of the precursor nanopowders during hot pressing. Combining enhanced alloying scattering along with enhanced boundary scattering, thermal conductivity is expected to be lowered even more and ZT is most likely to reach even higher.

Thus, in this embodiment, the half-Heusler material has a formula $Hf_{1-x-y}Zr_xTi_yCoSb_{1-z}Sn_z$, where $0 \le x \le 1$, $0 \le y \le 1$, $0 \le z \le 1$, preferably, $0 \le x \le 0.5$, $0 \le y \le 0.5$, $0 \le z \le 0.5$. The thermoelectric material preferably has a thermal conductivity <3 Wm$^{-1}$K$^{-1}$ at T<800° C., with a minimum thermal conductivity of less than 2.8 Wm$^{-1}$K$^{-1}$. The figure of merit, ZT, of this material is preferably greater or equal to 0.85 at 700° C. and greater than 1 at 800° C.

Larger differences in atomic mass and size between Hf and Ti than Hf and Zr at M site of p-type half-Heuslers of the MCoSb type are proved effective on reducing the lattice thermal conductivity by stronger phonon scattering, which leads to what the inventors believe is the lowest ever thermal conductivity of 2.7 Wm$^{-1}$K$^{-1}$ in $Hf_{0.8}Ti_{0.2}CoSb_{0.8}Sn_{0.2}$ achieved for the first time in any p-type HHs. As a result, a peak ZT of $Hf_{0.8}Ti_{0.2}CoSb_{0.8}Sn_{0.2}$ reached 1.1 at 800° C., which the inventors believe is the highest ever reported value for any p-type half-Heuslers, which paves the way for consideration of real practical applications of HHs for power generation applications.

Additional Embodiments

The inventors have discovered that replacing a larger portion of Hf with Zr in n-type half Heusler thermoelectric materials provides similar performance to $Hf_{0.75}Zr_{0.25}NiSn_{0.99}Sb_{0.01}$ at significantly reduced cost. The inventors have further discovered that annealing half Heusler thermoelectric materials at elevated temperature (e.g., 750° C.) in argon may promote a more uniform composition and raises the figure of merit.

Additionally, the inventors have discovered that p-type half Heusler thermoelectric materials having a ternary hafnium, zirconium, titanium composition, e.g., $Hf_{1+\delta-x-y}Zr_xTi_yCoSb_{1+\delta-z}Sn_z$, where $0 \le x \le 1.0$, $0 \le y \le 1.0$, $0 \le z \le 1.0$, and $-0.1 \le \delta \le 0$ (to allow for slightly non-stoichiometric material), such as $Hf_{1-x-y}Zr_xTi_yCoSb_{1-z}Sn_z$, where $0 < x < 1.0$, $0 \le y \le 1.0$, and $0 \le z \le 1.0$ when $\delta = 0$ (i.e., for the stoichiometric material), may provide a high figure of merit with relatively lower content of hafnium, thus reducing costs.

The following are examples of methods and thermoelectric materials of these embodiments. These examples are illustrative and not meant to be limiting.

n-Type Half-Heusler Materials with Reduced Hafnium Content

As discussed above, nanocomposite n-type and p-type half-Heusler thermoelectric materials, such as the n-type $Hf_{0.75}Zr_{0.25}NiSn_{0.99}Sb_{0.01}$ material formed by the nanocomposite approach described above, exhibit high mechanical strength, thermal stability, low toxicity, and improved thermoelectric performance (e.g., ZT), particularly over a temperature range (e.g., 20-700° C.) useful in many low- to mid-temperature applications, such as waste heat recovery in automobiles. The cost of these materials depends largely on the hafnium content of the material, since hafnium is significantly more expensive than the other constituents of the material. For example, in the case of the $Hf_{0.75}Zr_{0.25}NiSn_{0.99}Sb_{0.01}$ material, more than 90% of the total cost of the material may be attributable to the cost of hafnium. Thus, materials with similar performance characteristics but without the same high material costs are desirable.

This embodiment demonstrates that significant cost reduction in n-type HHs can be achieved while maintaining comparable material performance when Zr is used to replace >25 At % Hf, i.e., $Hf_{1-x}Zr_xNiSn_ySb_{1-y}$, where $0.25 < x < 1$, such as $0.5 \le x \le 0.9$, including x=0.5, 0.75 and 0.85, and y≈4.99 (e.g., 0.95-0.999). In other words, the Zr:Hf atomic ratio is ≥1:1, such as 2:1 to 6:1, including 3:1 to 5.66:1, and Hf comprises 50 At % or less of the M constituent in n-type half-Heusler material having a formula MNi(Sn, Sb), such as 10-50 At %, e.g., 15-25 At %.

Nanostructured half-Heusler phases were prepared by melting hafnium (Hf) (99.99%, Alfa Aesar) and zirconium (Zr) (99.99%, Alfa Aesar) chunks with nickel (Ni) (99.99%, Alfa Aesar), tin (Sn) (99.99%, Alfa Aesar) and antimony (Sb) (99.99%, Alfa Aesar) pieces according to the required composition (Hf, Zr)Ni(Sn, Sb) using arc melting process. Then the melted ingot was ball milled for 5 hours to get the desired nanopowders. The mechanically prepared nanopowders were then hot pressed at a peak temperature in a range of 800-1200° C. in graphite dies with a 12.7 mm central cylindrical opening diameter to get bulk nanostructured half-Heusler samples of $Hf_{1-x}Zr_xNiSn_{0.99}Sb_{0.01}$, with x=0.25, 0.5, 0.75 and 0.85.

The samples were characterized by X-ray diffraction (XRD), scanning electron microscopy (SEM) and transmission electron microscopy (TEM) to study their crystallinity, composition, homogeneity, the average grain size, and grain size distribution of the nano particles. These parameters affect the thermoelectric properties of the final dense bulk samples.

The nanostructured bulk samples were formed into 12.7 mm diameter discs with appropriate thickness for thermal diffusivity and Hall coefficient measurements, and 2 mm thick pellets for electrical conductivity and Seebeck coefficient measurements, The electrical conductivity and Seebeck coefficient were measured by commercial equipment (ZEM-3, Ulvac), the thermal diffusivity was measured by a laser flash system (LFA 457, Netzsch) from room temperature to 700° C., the carrier concentration and mobility at room temperature were tested from Hall measurements, and the specific heat capacity was measured on a differential scanning calorimeter (DSC-400, Netzsch Instruments, Inc.). The thermal conductivity was calculated as the product of the thermal diffusivity, specific heat capacity, and volumetric density of the samples.

Figure 21:
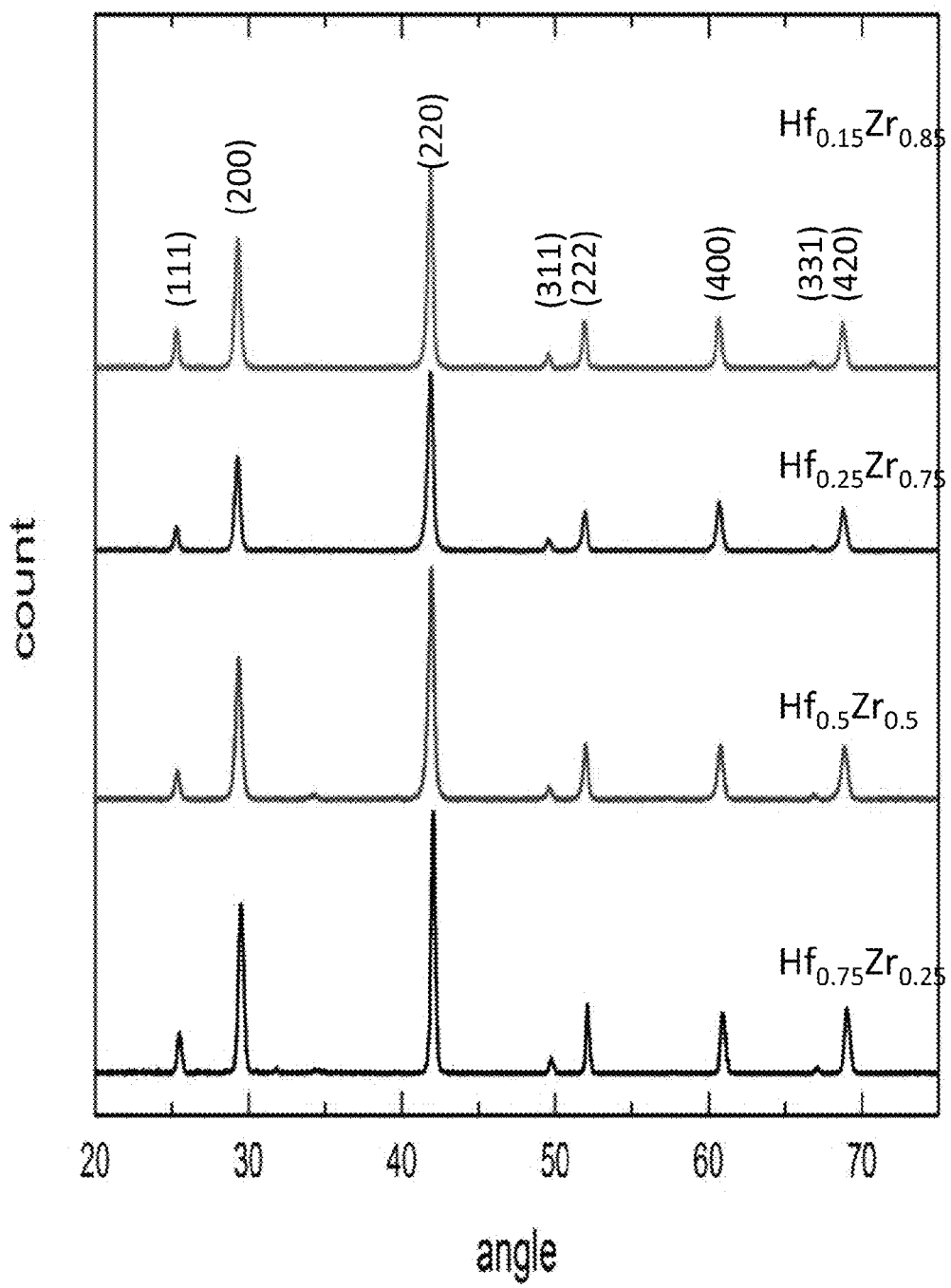
FIG. 21 illustrates XRD patterns of samples of $Hf_{1-x}Zr_xNiSn_{0.99}Sb_{0.01}$=0.85, 0.75, 0.5 and 0.25).

FIG. 21 shows the XRD patterns of the as-pressed $Hf_{x-1}Zr_xNiSn_{0.99}Sb_{0.01}$, with x=0.25, 0.5, 0.75 and 0.85. The diffraction peaks of all samples are well-matched with those of half-Heusler phases.

Figure 22:
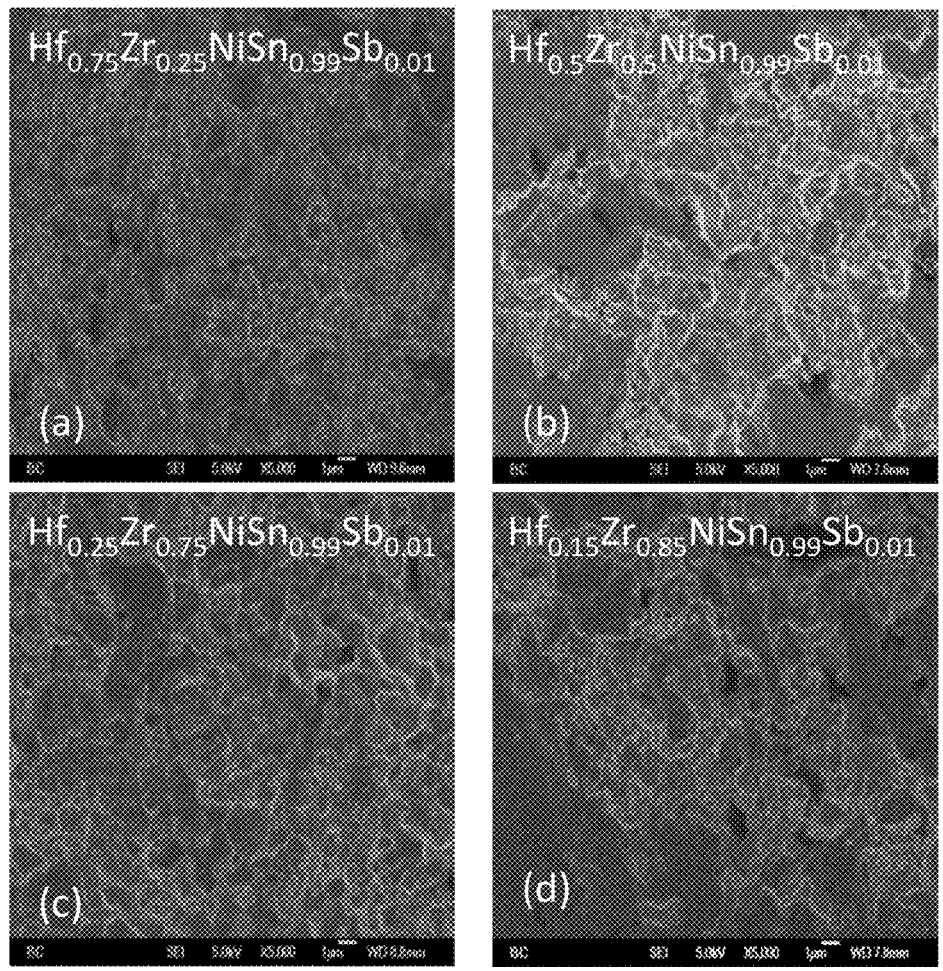
FIGS. 22a-d illustrate SEM images of as-pressed $Hf_{1-x}Zr_xNiSn_{0.99}Sb_{0.01}$ (x=0.85, 0.75, 0.5 and 0.25) samples.
Figure 23:
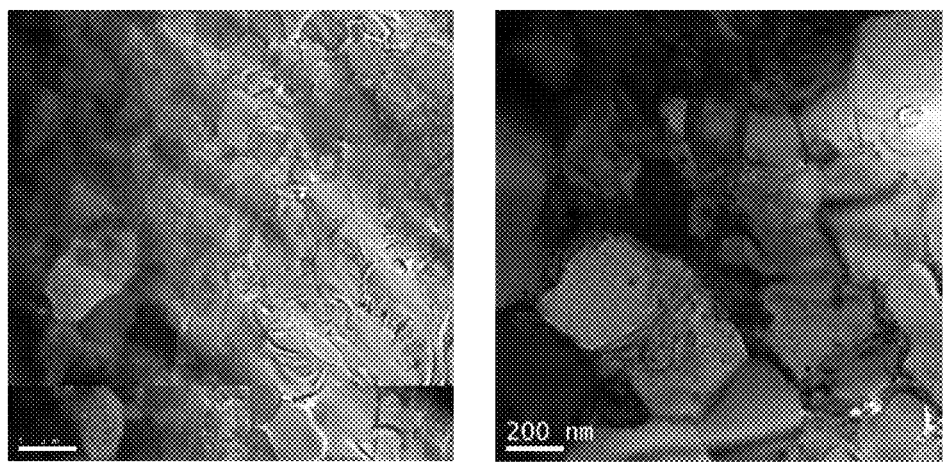
FIG. 23 illustrates representative TEM images of a $Hf_{1-x}Zr_xNiSn_{0.99}Sb_{0.01}$ sample.

The SEM images of the as-pressed $Hf_xZr_{1-x}NiSn_{0.99}Sb_{0.01}$ samples are displayed in FIGS. 22a-d, with x=0.25 (FIG. 22a), 0.5 (FIG. 22b), 0.75 (FIG. 22c) and 0.85 (FIG. 22d). There are no apparent differences in grain sizes for different compositions under SEM. The typical grain size is ~500 nm, which is slightly larger than in previous embodiments (e.g., 200 nm) due to a shorter ball milling time (i.e., 5 h vs. 12 h). Similar to the SEM results, the TEM image (FIG. 23) of a representative sample confirms the average grain size observed from the SEM image, which is ~500 nm due to the shorter ball milling times.

FIGS. 24a-d illustrate the electrical properties of the samples having varying hafnium concentrations. The Hall measurements show that with increased intermixing of Hf and Zr, the mobility decreases due to stronger scattering from a more significant alloying effect. The mobility decreases to its lowest level at the highest degree of Hf:Zr intermixing, i.e., $Hf_{0.5}Zr_{0.5}$.

Figure 24:
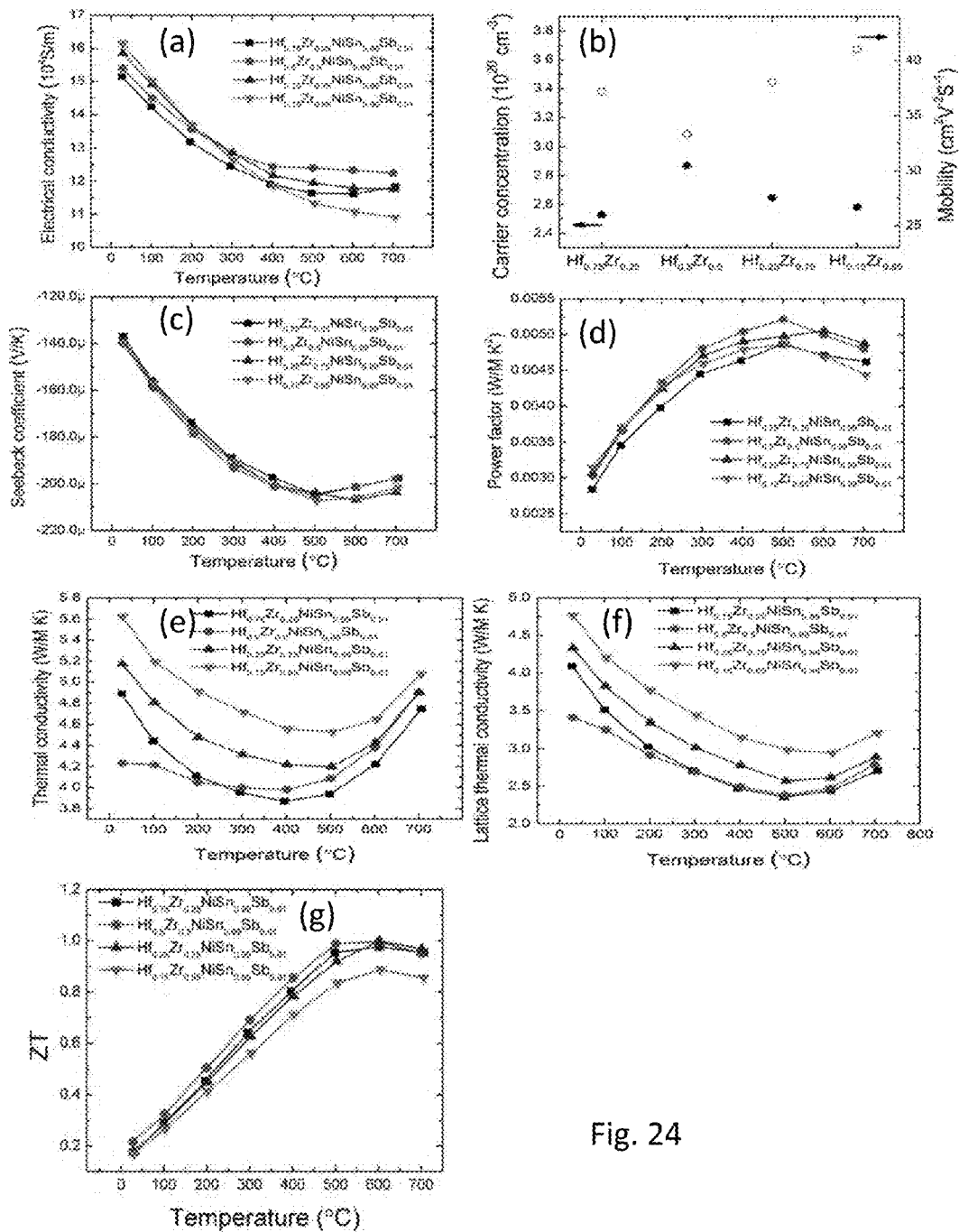
FIG. 24 illustrates the temperature-dependent (a) electrical conductivity, (b) carrier concentration, (c) Seebeck coefficient, (d) power factor, (e) thermal conductivity, (f) lattice thermal conductivity, and (g) ZT of $Hf_{1-x}Zr_xNiSn_{0.99}Sb_{0.01}$ (x=0.85, 0.75, 0.5 and 0.25) samples.
Figure 25:
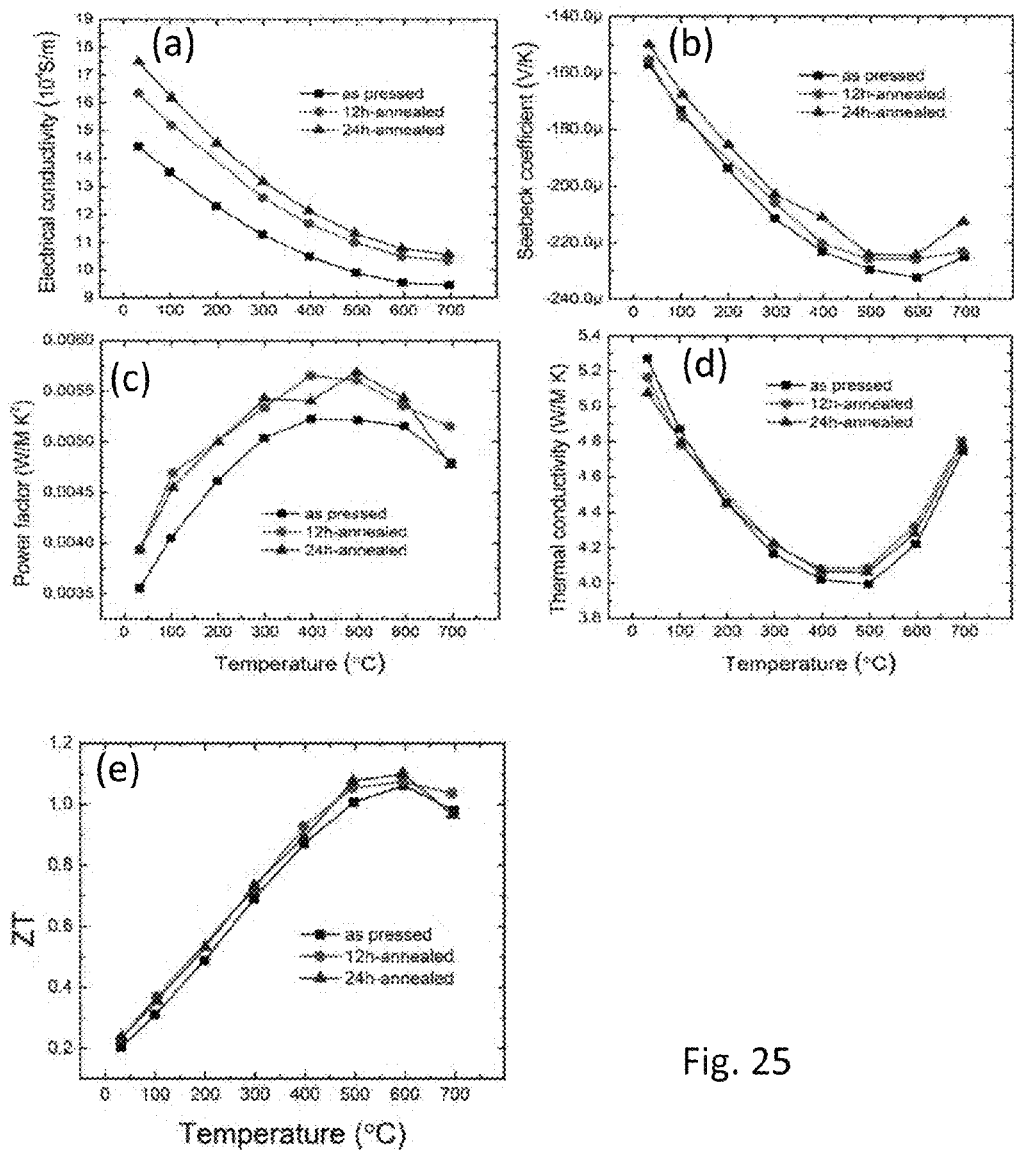
FIG. 25 illustrates the temperature-dependent (a) electrical conductivity, (b) Seebeck coefficient, (c) power factor, (d) thermal conductivity, and (e) ZT of nanocomposite n-type half-Heusler samples before and after annealing in Ar at 750° C. for 12 and 24 hours.

For the thermal properties of the samples, illustrated in FIGS. 24e and 24f, since all samples have a similar grain size, the difference in their lattice thermal conductivity can be related to the alloying effect. $Hf_{0.5}Zr_{0.5}$ shows the lowest lattice thermal conductivity, possibly due to the strongest alloying effect, which is consistent with the lowest electrical mobility from Hall measurements.

FIG. 24g illustrates the temperature-dependent dimensionless figure of merit (ZT) for all samples. The ZT values for the samples with >25 At % Zr replacement of Hf (i.e., $Hf_{0.5}Zr_{0.5}$, $Hf_{0.25}Zr_{0.75}$, and $Hf_{0.15}Zr_{0.85}$) are comparable to the ZT values for the $Hf_{0.75}Zr_{0.25}$ material from room temperature to 700° C. Thus, a comparable ZT performance for n-type HH material may be achieved while reducing hafnium usage up to three times compared to the $Hf_{0.75}Zr_{0.25}NiSn_{0.99}Sb_{0.01}$ material.

In embodiments, the ZT value for a half-Heusler material with >25 At % Zr replacement of Hf (i.e., $Hf_{x-1}Zr_xNiSn_ySb_{1-y}$, where 0.25<x<1) may be within 20%, e.g., within 10%, such as within 5%, of the ZT value of a $Hf_{0.75}Zr_{0.25}NiSn_ySb_{1-y}$ material over the range of 20-700° C. The peak ZT value of the embodiment material may be greater than 0.8 (e.g., 0.8-1.1, such as 1.0-1.1) for at least one temperature in the range between about 500-700° C.

The inventors have further discovered that annealing half Heusler thermoelectric materials at elevated temperature (e.g., 500-1500° C., such as 700-800° C., such as at about 750° C.) in an inert gas, such as argon, may promote a more uniform composition and raises the figure of merit. FIG. 25a-d illustrates the electrical properties of a sample of a nanocomposite n-type half-Heusler material before and after 750° C. annealing in Ar. The sample is plotted as-pressed (i.e., without annealing), following annealing for 12 hours, and following annealing for 24 hours. As illustrated in the temperature-dependent ZT plot of FIG. 25e, after annealing, the sample exhibits a thermally-stable slight improvement in the ZT value. Without wishing to be bound by theory, it is believed that this improvement in ZT is due to a more uniform composition after annealing. The annealing process may be used for other nanocomposite thermoelectric material alloys, such as p-type half-Heusler materials.

p-Type ternary (Hf, Zr, Ti) Half-Heusler Materials

The inventors have discovered that p-type half Heusler thermoelectric materials having a ternary hafnium, zirconium, titanium composition, e.g., $Hf_{1+\delta-x-y}Zr_xTi_yCoSb_{1+\delta-z}Sb_z$, where 0<x<1.0, 0<y<1.0, 0≤z≤1.0 (such as z~0.2, e.g., 0.15-0.25), and −0.1≤δ≤0 (to allow for slightly non-stoichiometric material), such as $Hf_{1-x-y}Zr_xTi_yCoSb_{1-x}Sn_z$, where 0<x<1.0, 0<y<1.0, and 0≤z≤1.0 (such as z~0.2, e.g., 0.15-0.25) when δ=0 (i.e., for the stoichiometric material), may provide a high figure of merit with relatively less use of hafnium, thus reducing costs.

Based on the best peak ZT of ~0.8 in $Hf_{0.5}Zr_{0.5}CoSb_{0.8}Sn_{0.2}$ and ~1 in $Hf_{0.8}Ti_{0.2}CoSb_{0.8}Sn_{0.2}$, the effect of ternary (Hf, Zr, and Ti) compositions in (Hf, Zr, Ti)$CoSb_{0.8}Sn_{0.2}$ system was examined to further improve the ZT and reduce the usage of Hf. By either partially replacing Hf and Zr with Ti in $Hf_{0.5}Zr_{0.5}CoSb_{0.8}Sn_{0.2}$ or partially replacing Hf and Ti with Zr in $Hf_{0.8}Ti_{0.2}CoSb_{0.8}Sn_{0.2}$, a peak ZT of at 800° C. was achieved in $Hf_{4/9}Zr_{4/9}Ti_{1/9}CoSb_{0.8}Sn_{0.2}$. Such a composition has two advantages over the two best binary compositions: higher ZT at high temperatures (e.g., >400° C., such as 600-800° C.) than $Hf_{0.5}Zr_{0.5}CoSb_{0.8}Sn_{0.2}$ and less Hf than $Hf_{0.8}Ti_{0.2}CoSb_{0.8}Sn_{0.2}$. Higher ZT with less Hf is very much desired since Hf is much more expensive than any of the other elements in the material. The ZT improvement is the result of thermal conductivity reduction due to phonon scattering by both alloy and nanostructure effect. In embodiments, the nanocomposite p-type ternary half-Heusler composition may have a ZT≥0.8, such as 0.8-1.0, for at least one temperature in the range 650-750° C. (e.g., 750° C.), and/or a ZT≥1.0, such as 1.0-1.1) for at least one temperature in the range 750-850° C. (e.g., 800° C.).

Four ternary compositions were prepared based on the best binary compositions: $Hf_{0.5}Zr_{0.5}CoSb_{0.8}Sn_{0.2}$ and $Hf_{0.8}Ti_{0.2}CoSb_{0.8}Sn_{0.2}$ by either adding a small amount of the third element into the best binary compositions or averaging the best two binary compositions. As a result, a peak ZT≥1.0 at 800° C. was achieved in $Hf_{4/9}Zr_{4/9}Ti_{1/9}CoSb_{0.8}Sn_{0.2}$, which has a little bit higher ZT than $Hf_{0.8}Ti_{0.2}CoSb_{0.8}Sn_{0.2}$, but much less Hf. This result is important for large scale applications of such materials for power generation since Hf is much more expensive than any of the other elements in these materials.

Figure 26:
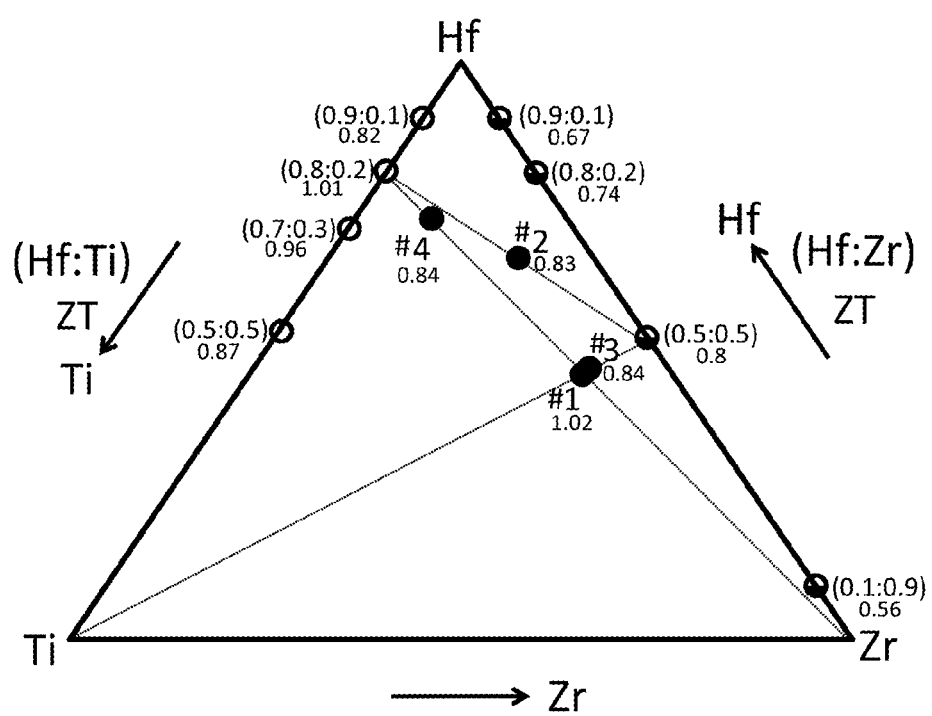
FIG. 26 is a phase diagram illustrating various compositions of ternary (Ti, Zr, Hf)$CoSb_{0.8}Sn_{0.2}$ p-type half-Heusler materials.

Samples with several compositions in (Ti, Zr, Hf)$CoSb_{0.8}Sn_{0.2}$ were prepared by varying only the ratios of Ti/Zr/Hf, termed as ternary when all three elements are used, shown in the phase diagram in FIG. 26: four ternary compositions (Nos. #1-4). The nominal compositions (Nos. #1-4) are listed in Table 1. The composition selection is based on the best binary compositions by either adding a small amount of the third element into the best binary compositions (Nos. #1, #3, and #4) or just averaging the best two binary compositions (No. #2). It will be understood that other ternary (Ti, Zr, Hf)$CoSb_{0.8}Sn_{0.2}$ compositions may be utilized in various embodiments. In embodiments, the M constituent in a p-type half-Heusler material having a formula MCo(Sb,Sn) may include <80 At % of hafnium, such as 40-75 At % hafnium, ≥10 At % of titanium, such as 10-50 At % titanium, and ≥10 At % of zirconium, such as 10-50 At % zirconium.

TABLE 1

| Sample | Nominal Composition | Theoretical Density (g/cm$^3$) | Measured Density (g/cm$^3$) | Relative Density |
|---|---|---|---|---|
| #1 | $Hf_{4/9}Zr_{4/9}Ti_{1/9}CoSb_{0.8}Sn_{0.2}$ | 9.19 | 9.14 | 99.4% |
| #2 | $Hf_{0.65}Zr_{0.25}Ti_{0.1}CoSb_{0.8}Sn_{0.2}$ | 9.53 | 9.34 | 97.9% |
| #3 | $Hf_{0.45}Zr_{0.45}Ti_{0.1}CoSb_{0.8}Sn_{0.2}$ | 9.21 | 8.94 | 97.1% |
| #4 | $Hf_{0.72}Zr_{0.1}Ti_{0.18}CoSb_{0.8}Sn_{0.2}$ | 9.84 | 9.54 | 96.9% |

Alloyed ingots were first formed by arc melting the mixture of appropriate amount of individual elements according to the designed stoichiometry shown in Table 1 under argon atmosphere. The ingot is typically remelted twice with each time flipping over the ingot to ensure the homogeneity during arc melting. The ingot was subsequently loaded into a ball-milling jar with grinding balls inside an argon-filled glove box and subjected to a mechanical ball-milling process to make nanopowders. Finally nanopowders were consolidated into bulk samples by the direct current induced hot-pressing method.

The freshly fractured surface of the best as-pressed $Hf_{4/9}Zr_{4/9}Ti_{1/9}CoSb_{0.5}Sn_{0.2}$ samples were observed by a scanning electron microscope (SEM, JEOL 6340F) and a high resolution transmission electron microscope (HRTEM, JEOL 2010F) to show the grain size of the samples. To study the thermoelectric properties of bulk samples, bars of about 2×2×12 mm$^3$ and disks of 12.7 mm in diameter and 2 mm in thickness were made. The bar samples were used to measure the electrical conductivity and Seebeck coefficient on a commercial equipment (ULVAC, ZEM3). The disk samples were used to obtain the thermal diffusivity, specific heat, and volumetric density, the product of these three parameters yields the thermal conductivity. The volumetric density was measured using an Archimedes' kit and listed in Table 1. The specific heat was determined by a High-Temperature DSC instrument (404C, Netzsch Instruments, Inc.). The thermal diffusivity was measured using a laser flash system (LFA 457 Nanoflash, Netzsch Instruments, Inc.). The uncertainties are 3% for electrical conductivity, thermal diffusivity, and specific heat, and 5% for the Seebeck coefficient, leading to an 11% uncertainty in ZT. The experiments of each composition were repeated at least three times and confirmed that the peak ZT values are reproducible within 5%. To increase the readability of all the curves, they are shown in the figures without error bars.

Figure 27:
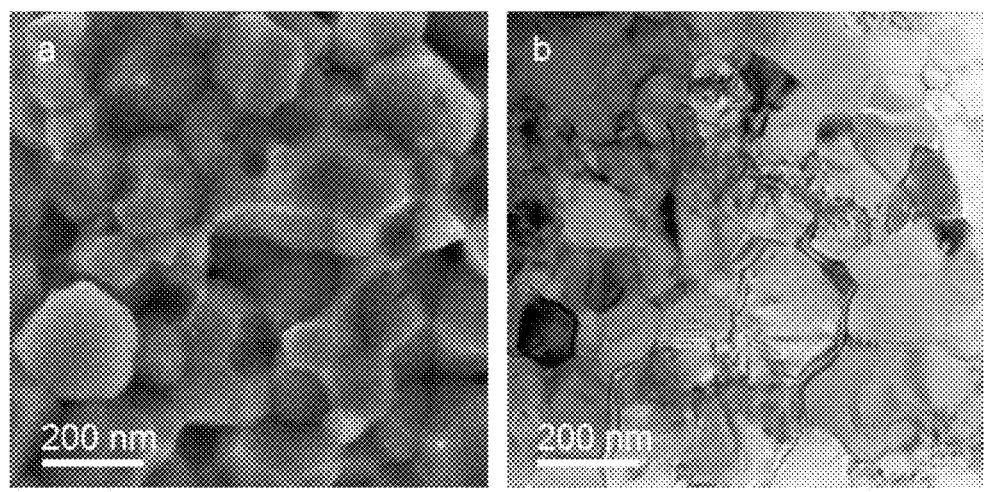
FIG. 27 illustrates (a) SEM image and (b) TEM image of an as-pressed $Hf_{4/9}Zr_{4/9}Ti_{1/9}CoSb_{0.8}Sn_{0.2}$ sample.

The SEM image of the as-pressed $Hf_{4/9}Zr_{4/9}Ti_{1/9}CoSb_{0.8}Sn_{0.2}$ sample is shown in FIG. 27a, from which it is seen that the average grain size is about 200 nm. The TEM image (FIG. 27b) confirms the average grain size observed in the SEM image.

Based on the best ZT of ~0.8 achieved in binary (Hf and Zr) composition $Hf_{0.5}Zr_{0.5}CoSb_{0.8}Sn_{0.2}$ in $Hf_{1-x}Zr_xCoSb_{0.8}Sn_{0.2}$ system and of ~1 in binary (Hf and Ti) composition $Hf_{0.8}Ti_{0.2}CoSb_{0.8}Sn_{0.2}$ in $Hf_{1-x}Ti_xCoSb_{0.8}Sn_{0.2}$ system, the effect of ternary (Hf, Zr, and Ti) compositions in (Hf, Zr, Ti)$CoSb_{0.8}Sn_{0.2}$ system were studied. Four compositions were made by either partial replacing Hf and Zr with Ti in the best binary $Hf_{0.5}Zr_{0.5}CoSb_{0.8}Sn_{0.2}$ to make $Hf_{0.45}Zr_{0.45}Ti_{0.1}CoSb_{0.8}Sn_{0.2}$ (composition No. #3) and $Hf_{4/9}Zr_{4/9}Ti_{1/9}CoSb_{0.8}Sn_{0.2}$ (composition No. #1), or by partial replacing Hf and Ti with Zr in the best binary $Hf_{0.8}Ti_{0.2}CoSb_{0.8}Sn_{0.2}$ to make $Hf_{0.72}Zr_{0.1}Ti_{0.18}CoSb_{0.8}Sn_{0.2}$ (composition No. #4) and $Hf_{4/9}Zr_{4/9}Ti_{1/9}CoSb_{0.8}Sn_{0.2}$ (composition No. #1), or by averaging the two best binary compositions to make $Hf_{0.65}Zr_{0.25}Ti_{0.1}CoSb_{0.8}Sn_{0.2}$ (composition No. #2).

Figure 28:
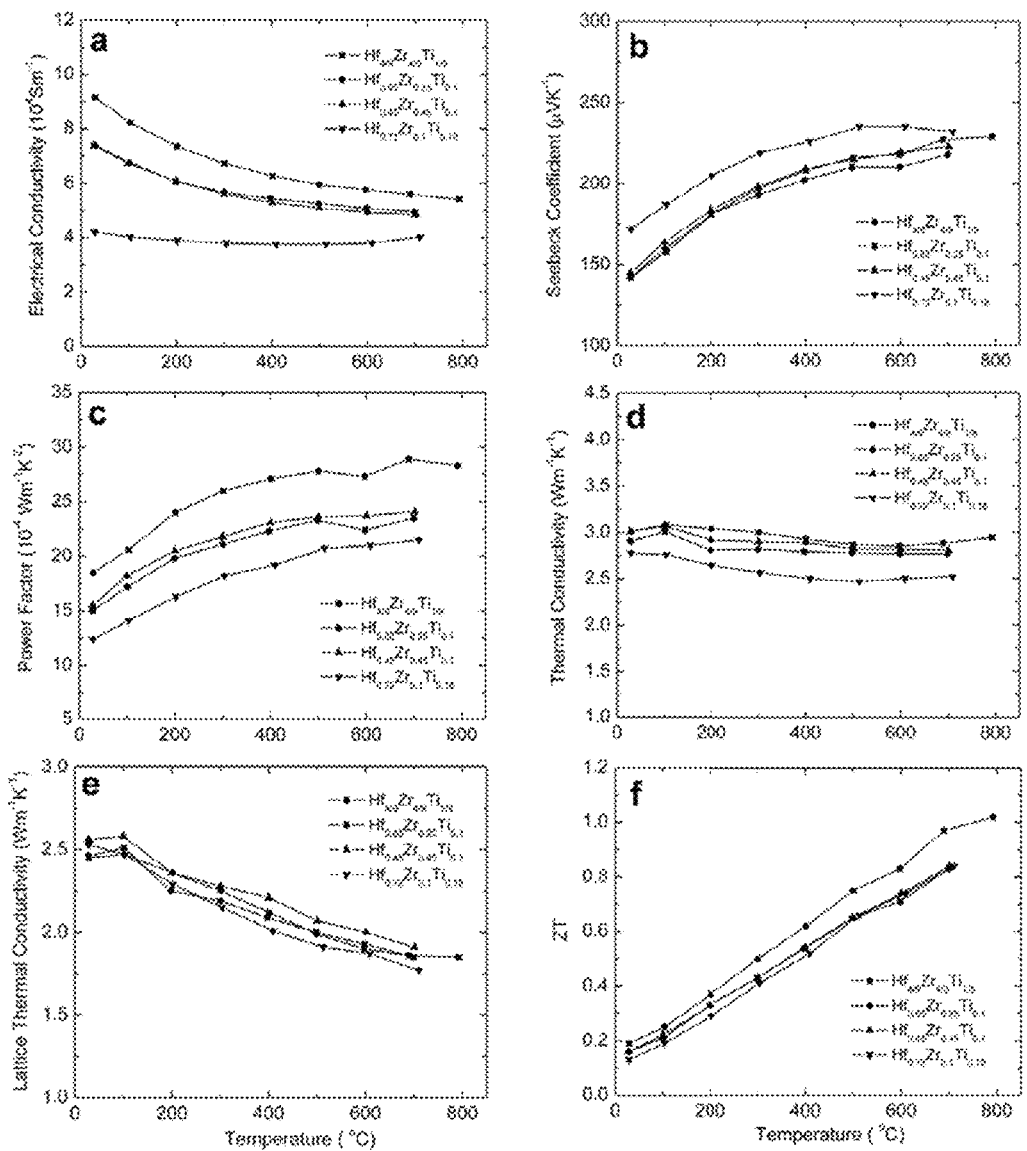
FIG. 28 illustrates the temperature-dependent (a) electrical conductivity, (b) Seebeck coefficient, (c) power factor, (d) thermal conductivity, (e) lattice thermal conductivity, and (f) ZT of four different ternary (Ti, Zr, Hf)$CoSb_{0.8}Sn_{0.2}$ samples.

FIG. 28 shows the temperature-dependent TE properties of four ternary compositions: $Hf_{4/9}Zr_{4/9}Ti_{1/9}CoSb_{0.8}Sn_{0.2}$ (No. #1), $Hf_{0.65}Zr_{0.25}Ti_{0.1}CoSb_{0.8}Sn_{0.2}$ (No. #2), $Hf_{0.45}Zr_{0.45}Ti_{0.1}CoSb_{0.8}Sn_{0.2}$ (No. #3) and $Hf_{0.72}Zr_{0.1}Ti_{0.18}CoSb_{0.8}Sn_{0.2}$ (No. #4). All these samples were made by the same ball-milling and hot-pressing conditions. FIG. 28a shows that $Hf_{4/9}Zr_{4/9}Ti_{1/9}CoSb_{0.8}Sn_{0.2}$ has the highest electrical conductivity while $Hf_{0.72}Zr_{0.1}Ti_{0.18}CoSb_{0.8}Sn_{0.2}$ has the lowest electrical conductivity. The electrical conductivities of $Hf_{0.65}Zr_{0.25}Ti_{0.1}CoSb_{0.8}Sn_{0.2}$ and $Hf_{0.45}Zr_{0.45}Ti_{0.1}CoSb_{0.8}Sn_{0.2}$ are similar to each other (FIG. 28a). The positive signs of Seebeck coefficients of all samples indicate p-type transport behavior (FIG. 28b). The Seebeck coefficients of $Hf_{4/9}Zr_{4/9}Ti_{1/9}CoSb_{0.8}Sn_{0.2}$, $Hf_{0.65}Zr_{0.25}Ti_{0.1}CoSb_{0.8}Sn_{0.2}$, and $Hf_{0.45}Zr_{0.45}Ti_{0.1}CoSb_{0.8}Sn_{0.2}$ are similar to each other and are lower than that of $Hf_{0.72}Zr_{0.1}Ti_{0.18}CoSb_{0.8}Sn_{0.2}$. FIG. 28c demonstrates the temperature-dependent power factor. $Hf_{4/9}Zr_{4/9}Ti_{1/9}CoSb_{0.8}Sn_{0.2}$ has the highest power factor whereas $Hf_{0.72}Zr_{0.1}Ti_{0.18}CoSb_{0.8}Sn_{0.2}$ has the lowest power factor for the whole temperature range. The power factor of $Hf_{4/9}Zr_{4/9}Ti_{1/9}CoSb_{0.8}Sn_{0.2}$ increases steadily with temperature and reaches as high as $28.9 \times 10^{-4}$ Wm$^{-1}$K$^{-2}$ at 700° C. and $28.3 \times 10^{-4}$ Wm$^{-1}$K$^{-2}$ at 800° C. FIG. 28d shows the temperature-dependent total thermal conductivity of the ternary compositions. Owing to their individual electrical conductivities, $Hf_{4/9}Zr_{4/9}Ti_{1/9}CoSb_{0.8}Sn_{0.2}$ has the highest thermal conductivity whereas $Hf_{0.72}Zr_{0.1}Ti_{0.18}CoSb_{0.8}Sn_{0.2}$ has the lowest thermal conductivity. The lattice thermal conductivity ($\kappa_l$) (FIG. 28e) was estimated by subtracting both the electronic contribution ($\kappa_e$) and the bipolar contribution ($\kappa_{bipolar}$) from the total thermal conductivity ($\kappa$) while $\kappa_e$ was obtained using the Wiedemann-Franz law. The temperature dependent Lorenz number was calculated from the reduced Fermi energies, which were estimated from the Seebeck coefficient with a consideration of the two-band model.

Because of the high power factor, the ZT of $Hf_{4/9}Zr_{4/9}Ti_{1/9}CoSb_{0.8}Sn_{0.2}$ reached at 800° C. and 0.97 at 700° C. (FIG. 28f), showing its promise as a p-type material in high temperature applications. The ZT of other ternary compositions are similar with each other and can reach 0.85 at 700° C. It should be noted that the shift of ZT peak to lower temperatures as observed in the n-type ternary half-Heusler system when doping Ti into p-type (Hf, Zr)$CoSb_{0.8}Sn_{0.2}$ system was not observed for the p-type ternary half-Heusler materials.

Figure 29:
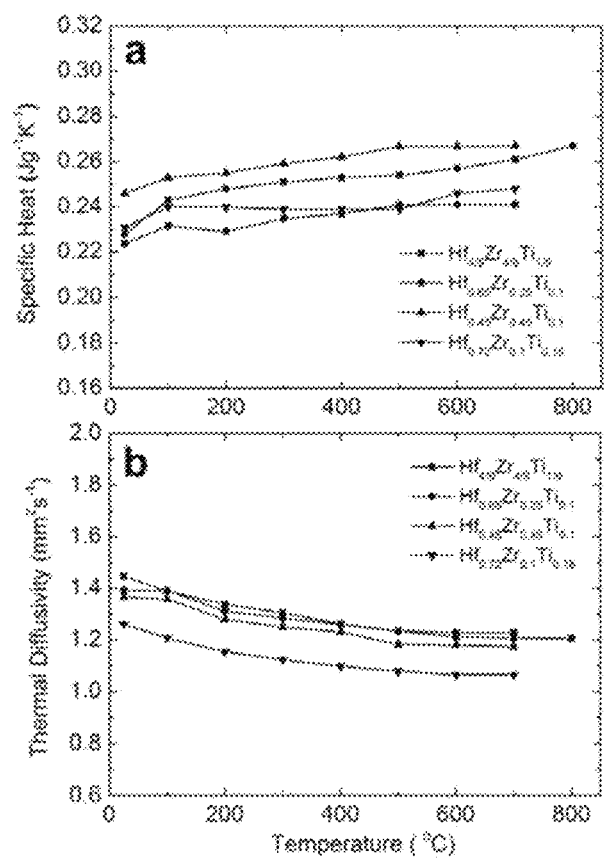
FIG. 29 illustrates the temperature-dependent (a) specific heat and (b) thermal diffusivity of four different ternary (Ti, Zr, Hf)$CoSb_{0.8}Sn_{0.2}$ samples.

FIG. 29 shows the specific heat (FIG. 29a) and thermal diffusivity (FIG. 29b) of ternary compositions. The specific heat of all the samples increases steadily with temperature. The specific heat of $Hf_{4/9}Zr_{4/9}Ti_{1/9}CoSb_{0.8}Sn_{0.2}$, which has the highest ZT for all temperatures, was measured using both a high-temperature DSC instrument (404C, Netzsch Instruments, Inc.), which can measure the sample beyond 800° C., and a laser flash system (LFA 457 Nanoflash, Netzsch Instruments, Inc.), together with a standard sample. The measurements from the two methods agree with each other within 3%. Thermal diffusivities of $Hf_{4/9}Zr_{4/9}Ti_{1/9}CoSb_{0.8}Sn_{0.2}$, $Hf_{0.65}Zr_{0.25}Ti_{0.1}CoSb_{0.8}Sn_{0.2}$, and $Hf_{0.45}Zr_{0.45}Ti_{0.1}CoSb_{0.8}Sn_{0.2}$ are similar with each other and are higher than that of $Hf_{0.72}Zr_{0.1}Ti_{0.18}CoSb_{0.8}Sn_{0.2}$ (FIG. 29b).

Figure 30:
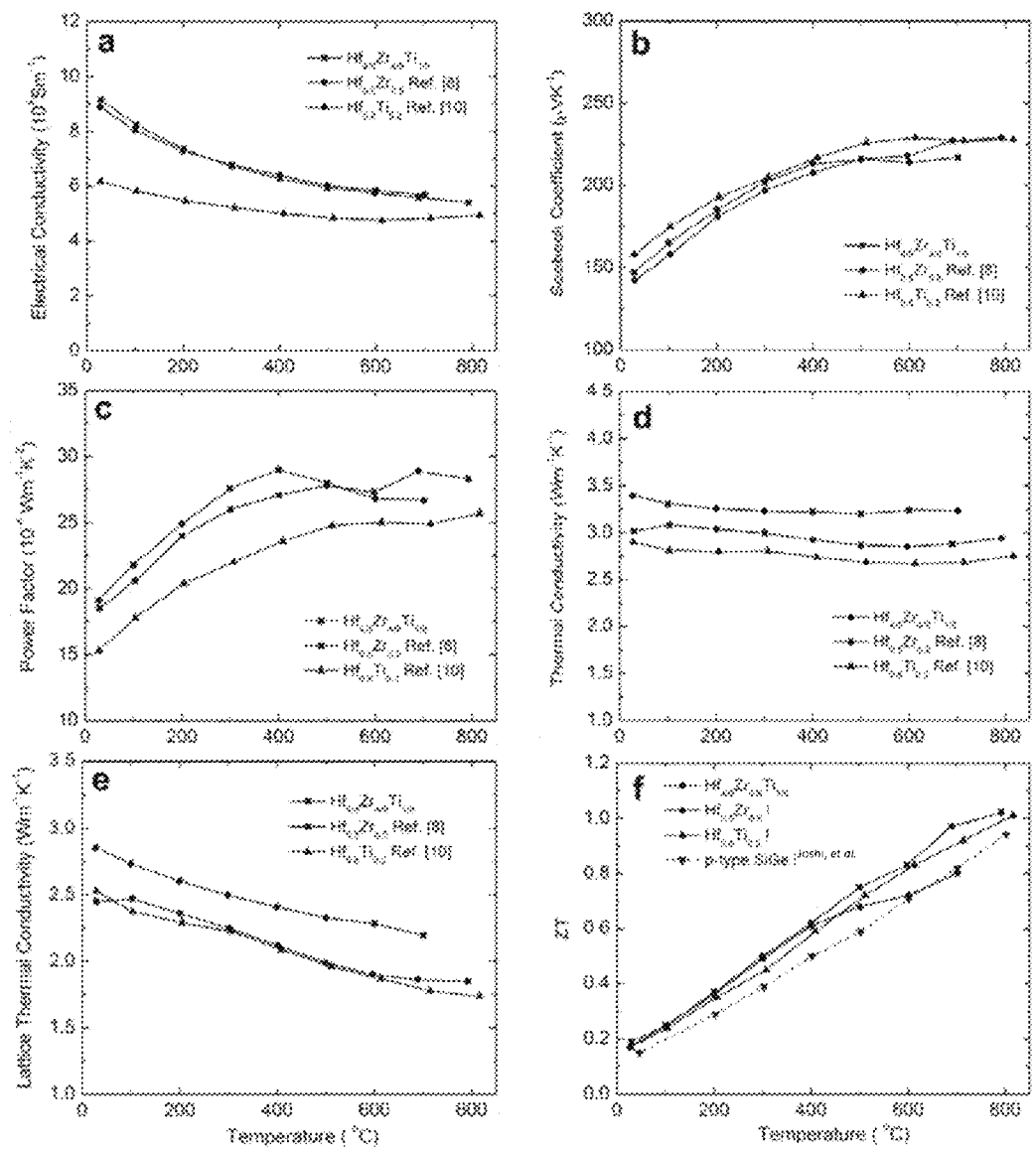
FIG. 30 illustrates the temperature-dependent (a) electrical conductivity, (b) Seebeck coefficient, (c) power factor, (d) thermal conductivity, (e) lattice thermal conductivity, and (f) ZT of a nanostructured bulk $Hf_{4/9}Zr_{4/9}Ti_{1/9}CoSb_{0.8}Sn_{0.2}$ sample in comparison to binary compositions $Hf_{0.5}Zr_{0.5}CoSb_{0.8}Sn_{0.2}$ and $Hf_{0.8}Ti_{0.2}CoSb_{0.8}Sn_{0.2}$ samples.

The temperature-dependent TE properties of nanostructured bulk sample $Hf_{4/9}Zr_{4/9}Ti_{1/9}CoSb_{0.8}Sn_{0.2}$ was plotted in comparison with the best binary compositions $Hf_{0.5}Zr_{0.5}CoSb_{0.8}Sn_{0.2}$ (see FIGS. 8-12 and related discussion above) and $Hf_{0.8}Ti_{0.2}CoSb_{0.8}Sn_{0.2}$ (see FIGS. 17-20 and related discussion above) in FIG. 30. The electrical conductivity of $Hf_{4/9}Zr_{4/9}Ti_{1/9}CoSb_{0.8}Sn_{0.2}$ is almost the same as that of $Hf_{0.5}Zr_{0.5}CoSb_{0.8}Sn_{0.2}$ and higher than that of $Hf_{0.8}Ti_{0.2}CoSb_{0.8}Sn_{0.2}$ for the whole temperature range (FIG. 30a). The Seebeck coefficient follows the opposite trend of electrical conductivity for the low temperature range (FIG. 30b). Meanwhile, the differences in Seebeck coefficients between $Hf_{4/9}Zr_{4/9}Ti_{1/9}CoSb_{0.8}Sn_{0.2}$ and $Hf_{0.8}Ti_{0.2}CoSb_{0.8}Sn_{0.2}$ are diminished at elevated temperatures. The power factor of $Hf_{0.8}Ti_{0.2}CoSb_{0.8}Sn_{0.2}$ is the lowest for all temperatures (FIG. 30c). The power factor of $Hf_{4/9}Zr_{4/9}Ti_{1/9}CoSb_{0.8}Sn_{0.2}$ is lower than that of $Hf_{0.5}Zr_{0.5}CoSb_{0.8}Sn_{0.2}$ for temperatures up to 500° C., after which the relationship is reversed (FIG. 30c). FIG. 30d shows the total thermal conductivity of all three samples. For the whole temperature range, thermal conductivity of $Hf_{4/9}Zr_{4/9}Ti_{1/9}CoSb_{0.8}Sn_{0.2}$ lies between those of $Hf_{0.5}Zr_{0.5}CoSb_{0.8}Sn_{0.2}$ and $Hf_{0.8}Ti_{0.2}CoSb_{0.8}Sn_{0.2}$ (FIG. 30d). The lattice thermal conductivity of $Hf_{4/9}Zr_{4/9}Ti_{1/9}CoSb_{0.8}Sn_{0.2}$ is similar to that of $Hf_{0.8}Ti_{0.2}CoSb_{0.8}Sn_{0.2}$ and much lower than that of $Hf_{0.5}Zr_{0.5}CoSb_{0.8}Sn_{0.2}$ (FIG. 30e), which is believed to be due to the atomic mass and size difference between Hf and Ti is larger than that between Hf and Zr. It appears that the lattice part is still a large portion of the total thermal conductivity. ZT of $Hf_{4/9}Zr_{4/9}Ti_{1/9}CoSb_{0.8}Sn_{0.2}$ is comparable with that of $Hf_{0.8}Ti_{0.2}CoSb_{0.8}Sn_{0.2}$ for temperatures up to 800° C. (FIG. 30f). ZT data of p-type silicon germanium (SiGe), another promising p-type material for high temperature applications, as described in Joshi et al., Nano Lett. 2008, 8, 4670, is also included for comparison (FIG. 30f). $Hf_{4/9}Zr_{4/9}Ti_{1/9}CoSb_{0.8}Sn_{0.2}$ has a clear cost advantage over both $Hf_{0.8}Ti_{0.2}CoSb_{0.8}Sn_{0.2}$ and SiGe due to the high cost of Hf and Ge in the respective materials.

Figure 31:
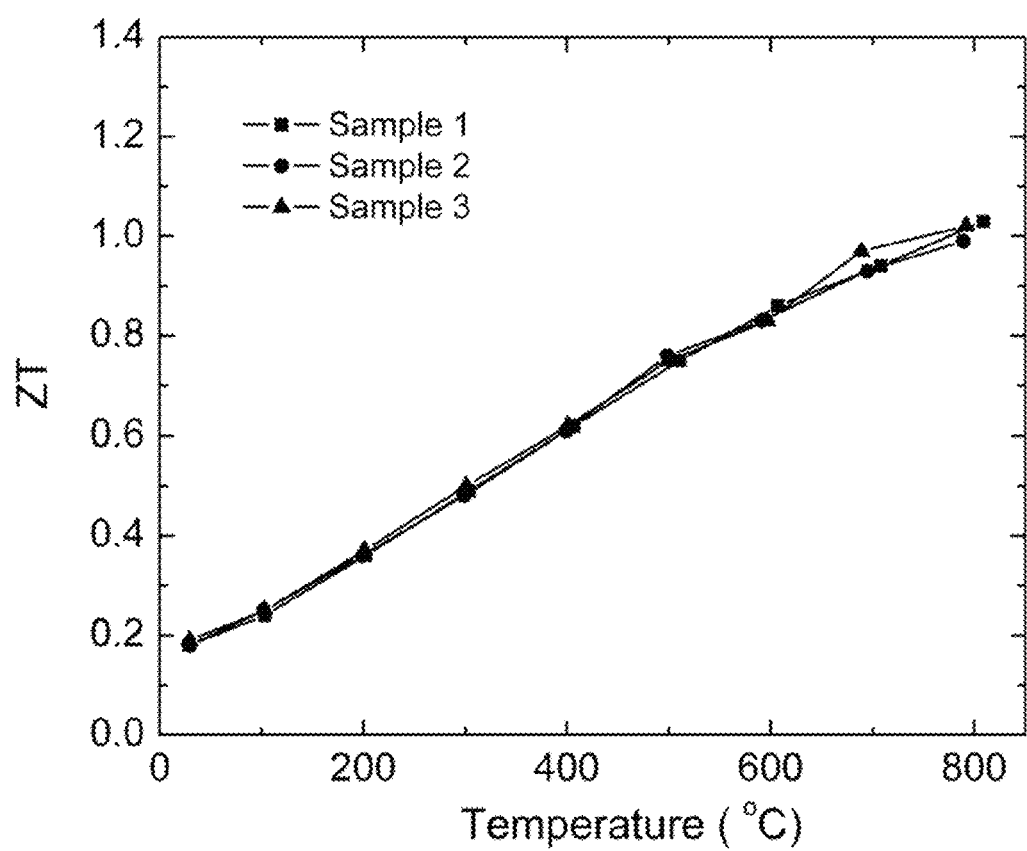
FIG. 31 illustrates temperature dependent ZT curves of different $Hf_{4/9}Zr_{4/9}Ti_{1/9}CoSb_{0.8}Sn_{0.2}$ samples.

The reported data is reproducible. Each composition has been repeated at least three times to make sure they are highly reproducible. A few typical ZT vs. T curves of $Hf_{4/9}Zr_{4/9}Ti_{1/9}CoSb_{0.8}Sn_{0.2}$ are shown in FIG. 31 to demonstrate the repeatability. It is seen that ZT values from batch to batch are within 5%, demonstrating its promising candidacy for high temperature applications.

Although ZT≥1.0 has been demonstrated in ternary p-type half-Heusler composition $Hf_{4/9}Zr_{4/9}Ti_{1/9}CoSb_{0.8}Sn_{0.2}$, there still exists room for further improvement not only in ZT but also reduction of Hf usage in the composition. The percentage of Hf in the sum of Ti, Zr, and Hf is still high (~44%), Hf dominates the final cost of the products due to its high cost. Further reduction in grain size for lower thermal conductivity may enable additional reduction in Hf (e.g., below 25%) without compromising ZT. A grain size of less than about 200 nm (e.g., 100-175 nm avg. grain size) may further reduce the thermal conductivity. Introducing grain growth inhibitors into the material to prevent grain growth during hot-pressing may provide much smaller grain size and thus lower thermal conductivity. Oxides may also be useful for this purpose.

Different ternary compositions in p-type half-Heusler system were tested based on the best binary compositions $Hf_{0.5}Zr_{0.5}CoSb_{0.8}Sn_{0.2}$ and $Hf_{0.8}Ti_{0.2}CoSb_{0.8}Sn_{0.2}$. As a result, ZT of 0.97 at 700° C. and at 800° C. has been achieved in $Hf_{4/9}Zr_{4/9}Ti_{1/9}CoSb_{0.8}Sn_{0.2}$ in which less Hf is used than $Hf_{0.8}Ti_{0.2}CoSb_{0.8}Sn_{0.2}$. The ternary compositions may be further optimized by reducing the amount of Hf for lower cost and smaller grain size for higher ZT.

Although the foregoing refers to particular preferred embodiments, it will be understood that the invention is not so limited. It will occur to those of ordinary skill in the art that various modifications may be made to the disclosed embodiments and that such modifications are intended to be within the scope of the invention. All of the publications, patent applications and patents cited herein are incorporated herein by reference in their entirety.

What is claimed is:

1. A method of making a nanocomposite thermoelectric material comprising:
   combining and arc melting constituent elements of the thermoelectric material to form an alloy of the thermoelectric material;
   ball milling the alloy of the thermoelectric material into nanometer scale mean size particles; and
   consolidating the nanometer size particles to form the thermoelectric material consisting of a half-Heusler material of a formula $Hf_{1+\delta-x-y}Zr_xTi_yNiSn_{1+\delta-z}Sb_z$, where $0 \leq x \leq 1.0$, $0 \leq y \leq 1.0$, $0 \leq z \leq 1.0$, and $-0.1 \leq \delta < 0.1$ and grains having a mean grain size less than 300 nm.

2. The method of claim 1, wherein consolidating the nanometer size particles comprises hot pressing the particles.

3. The method of claim 1, further comprising:
   annealing the consolidated thermoelectric material.

4. The method of claim 3, wherein the thermoelectric material is annealed at a temperature between 700-800° C. in an inert gas.

5. The method of claim 4, wherein the thermoelectric material is annealed for between about 12 and 24 hours.

6. The method of claim 1, wherein the half-Heusler material consists of an n-type material and has a formula $Hf_{1-x}Zr_xNiSn_{1-z}Sb_z$, where $0.25 \leq x \leq 1.0$ and $0.95 \leq 1-z \leq 0.999$.

7. The method of claim 6, wherein the half-Heusler material has a formula $Hf_{1-x}Zr_xNiSn_{1-z}Sb_z$, where $0.5 \leq x < 1.0$ and $0.95 \leq 1-z \leq 0.999$.

8. The method of claim 7, wherein the half-Heusler material has a formula $Hf_{1-x}Zr_xNiSn_{1-z}Sb_z$, where $0.5 \leq x \leq 0.85$ and $0.95 \leq 1-z \leq 0.999$.

9. The method of claim 6, wherein the half-Heusler material has a formula $Hf_{0.5}Zr_{0.5}NiSn_{0.99}Sb_{0.01}$.

10. The method of claim 6, wherein a figure of merit, ZT, of the thermoelectric material is within 20% of the figure of merit, ZT, of a second thermoelectric material between 20-700° C., the second thermoelectric material having at least one of the same median grain size and the same mean grain size and having the formula $Hf_{0.75}Zr_{0.25}NiSn_{0.99}Sb_{0.01}$.

11. The method of claim 10, wherein the thermoelectric material has a peak ZT value of 0.8 or more for at least one temperature in the range between about 500-700° C.

12. The method of claim 1, wherein ball milling the alloy comprises ball milling the alloy of the thermoelectric material into particles having a mean particle size in a range of 5-100 nm.

13. The method of claim 12, wherein consolidating the particles comprises consolidating the particles having the mean particle size in the range of 5-100 nm to form the thermoelectric material having a mean grain size in a range of 10 nm or more and less than 300 nm.

14. The method of claim 1, wherein ball milling the alloy comprises ball milling the alloy of the thermoelectric material for 5-50 hours to produce the nanometer scale mean size particles.

15. The method of claim 1, wherein the thermoelectric material consists of a single-phase half-Heusler material.

16. The method of claim 1, wherein the thermoelectric material consists of an n-type half-Heusler material comprising Hf, Ti, Zr, Ni and at least one of Sn and Sb.

17. A method of making a nanocomposite thermoelectric material comprising:

combining and arc melting constituent elements of the thermoelectric material to form an alloy of the thermoelectric material;

ball milling the alloy of the thermoelectric material into nanometer scale mean size particles; and consolidating the nanometer size particles to form the thermoelectric material consisting of a half-Heusler material of a formula $Hf_{1+\delta-x-y}Zr_xTi_yCoSb_{1+\delta-z}Sn_z$, where $0 \leq x \leq 1.0$, $0 \leq y \leq 1.0$, $0 \leq z \leq 1.0$, and $-0.1 \leq \delta < 0.1$ and grains having a mean grain size less than 300 nm.

18. The method of claim 17, wherein the half-Heusler material is a p-type material that consists of Ti, Zr, Hf, and Co and at least one of Sn and Sb.

19. The method of claim 18, wherein the half-Heusler material has the formula $Hf_{1+\delta-x-y}Zr_xTi_yCoSb_{1+\delta-z}Sn_z$, where $0<x<1.0$, $0<y<1.0$, $0.15 \leq z \leq 0.25$, and $-0.1 \leq \delta \leq 0$.

20. The method of claim 19, wherein the half-Heusler material has the formula $Hf_{1-x-y}Zr_xTi_yCoSb_{1-z}Sn_z$, where $0<x<1.0$, $0<y<1.0$, and $0.15 \leq z \leq 0.25$.

21. The method of claim 20, wherein the half-Heusler material has a lower Hf content than a $Hf_{0.8}Ti_{0.2}CoSb_{0.8}Sn_{0.2}$ material and a figure of merit, ZT, that is higher than the figure of merit of $Hf_{0.5}Zr_{0.5}CoSb_{0.8}Sn_{0.2}$ material for temperatures greater than 400° C. and having at least one of the same median grain size and the same mean grain size.

22. The method of claim 20, wherein the half-Heusler material has a figure of merit, ZT, that is $\geq 0.8$ for at least one temperature in the range 650-750° C.

23. The method of claim 20, wherein the half-Heusler material has a figure of merit, ZT, that is $\geq 1.0$ for at least one temperature in the range 750-850° C.

24. The method of claim 20, wherein the half-Heusler material has the formula $Hf_{4/9}Zr_{4/9}Ti_{1/9}CoSb_{0.8}Sn_{0.2}$.

25. The method of claim 17, wherein ball milling the alloy comprises ball milling the alloy of the thermoelectric material into particles having a mean particle size in a range of 5-100 nm.

26. The method of claim 25, wherein consolidating the particles comprises consolidating the particles having the mean particle size in the range of 5-100 nm to form the thermoelectric material having a mean grain size in a range of 10 nm or more and less than 300 nm.

27. The method of claim 17, wherein ball milling the alloy comprises ball milling the alloy of the thermoelectric material for 5-50 hours to produce the nanometer scale mean size particles.

28. The method of claim 17, wherein the thermoelectric material consists of a single-phase half-Heusler material.

* * * * *